United States Patent
Holmes et al.

(10) Patent No.: US 8,006,544 B2
(45) Date of Patent: Aug. 30, 2011

(54) APPARATUS AND METHODS FOR TESTING PERFORMANCE OF A MATERIAL FOR USE IN A JET ENGINE

(75) Inventors: Richard Holmes, Franklin, TN (US); Robert G. Tryon, III, Brentwood, TN (US); John E. Pope, Greenwood, IN (US); Daniel A. Nasser, Terre Haute, IN (US); Michael Oja, Nashville, TN (US); Animesh Dey, Brentwood, TN (US); Jesse Hamler, Cookeville, TN (US); Jonathan Brooks, Gordonsville, TN (US); James Tryon, Terre Haute, IN (US)

(73) Assignee: Vextec Corporation, Brentwood, TN (US)

(\*) Notice: Subject to any disclaimer, the term of this patent is extended or adjusted under 35 U.S.C. 154(b) by 219 days.

(21) Appl. No.: 12/008,997

(22) Filed: Jan. 14, 2008

(65) Prior Publication Data
US 2009/0133381 A1 May 28, 2009

Related U.S. Application Data

(60) Provisional application No. 60/880,354, filed on Jan. 12, 2007.

(51) Int. Cl.
*G01M 15/00* (2006.01)
(52) U.S. Cl. ................................................. 73/112.01
(58) Field of Classification Search .............. 73/112.01, 73/112.03, 112.05
See application file for complete search history.

(56) References Cited

U.S. PATENT DOCUMENTS

| | | | | |
|---|---|---|---|---|
| 2,945,349 | A | * | 7/1960 | Ritzi .............................. 60/804 |
| 3,434,679 | A | * | 3/1969 | Kutney et al. ............... 244/53 R |
| 4,034,604 | A | * | 7/1977 | Decher et al. ................... 73/147 |
| 4,651,563 | A | | 3/1987 | Zweifel |
| 4,741,203 | A | * | 5/1988 | Willaman et al. .......... 73/112.01 |
| 4,788,855 | A | * | 12/1988 | Laskody .................... 73/112.04 |
| 4,821,217 | A | * | 4/1989 | Jackson et al. .................... 701/3 |
| 5,230,241 | A | | 7/1993 | Boet |
| 5,293,775 | A | * | 3/1994 | Clark et al. ................ 73/116.03 |
| 5,447,059 | A | * | 9/1995 | Miller et al. ............... 73/112.03 |
| 5,469,706 | A | * | 11/1995 | Hoya .............................. 60/739 |
| 5,517,852 | A | * | 5/1996 | Woodason et al. ........ 73/112.05 |
| 5,528,903 | A | * | 6/1996 | Schreckling .................... 60/736 |

(Continued)

OTHER PUBLICATIONS

Ballard, R.E. et al., "Jet Engine Class 'C' Test Cell Exhaust System Phase. Coanda/Refraction Noise Suppression Concept-Advanced Development", *Boeing Wichita Co. KS*, Report date May 1979, Abstract Only, 1 page http://oai.dtic.mil/oai/oai?&verb=getRecord &metadataPrefix=html&identifier=ADA075277.

(Continued)

*Primary Examiner* — Eric S McCall
(74) *Attorney, Agent, or Firm* — Virtual Law Partners LLP;; Richard G.A. Bone

(57) ABSTRACT

An apparatus for testing failure of a material used in a jet engine, and more particularly to an apparatus that uses one or more model jet engine components made from a material used in a full-size jet engine and desired to be tested. The apparatus permits easy removal and disassembly of a jet engine mounted thereon as well as real-time measurements of run-time parameters. The methods and apparatus provide for predicting and analysing failure by a number of fatigue-related mechanisms including creep, fatigue, crack growth, foreign object damage, fretting, erosion, and stress corrosion.

29 Claims, 31 Drawing Sheets
(3 of 31 Drawing Sheet(s) Filed in Color)

U.S. PATENT DOCUMENTS

| | | | |
|---|---|---|---|
| 5,782,079 A * | 7/1998 | Chiang et al. | 60/804 |
| 5,837,890 A | 11/1998 | Long | |
| 6,374,790 B1 * | 4/2002 | Vassallo et al. | 123/142.5 R |
| 6,447,332 B1 * | 9/2002 | Djian | 439/564 |
| 7,006,947 B2 | 2/2006 | Tryon, III et al. | |
| 7,016,825 B1 | 3/2006 | Tryon, III | |
| 7,480,601 B2 | 1/2009 | Tryon, III | |
| 2003/0056578 A1 * | 3/2003 | Mitchell et al. | 73/116 |
| 2004/0016239 A1 * | 1/2004 | Fabian et al. | 60/805 |

OTHER PUBLICATIONS

Barlow, K.W. et al., "Fatigue crack propagation simulation in an aircraft engine fan blade attachment", *International Journal of Fatigue*, vol. 27 (2005), pp. 1661-1668.

Gas Turbine Simulators, [online], [retrieved on Jun. 8, 2009], 4 pages. Retrieved from the Internet: <URL: http://aarls.eng.ohio-state.edu/jets/engines.html>.

Gas Turbine Test Cell Facilities: Scale Model Studies, [online], [retrieved on Jun. 8, 2009], 1 page Retrieved from the Internet: <URL: http://aarls.eng.ohio-state.edu/jets/testcell.html>.

Institute of Flight Propulsion, "Optimization of a Model Jet Engine" http://www.lfa.mw.tum.de/pdf/LFA_ModelJetEngine.pdf#search=%22model%22model%20jet%20engine%22.

Lever, R., "The (Jet)—X Files", Technical Articles [online], Mar. 28, 2007 [retrieved on Jun. 9, 2009], 4 pages. Retrieved from the Internet: <URL: http://web.archive.org/web/*/http://www.megamodels.co.uk/technicalpage.htm>.

Loob, W., "Building a new jet engine test facility to replicate decades-old capabilities", The American Society of Mechanical Engineers [online], Nov. 29, 2005 [retrieved on Jun. 9, 2009], 6 pages. Retrieved from the Internet: <URL: htip://web.archive.org/web/20051129094201/http://www.memagazine.org/backissues/august99/features/blast/blast.html>.

International Search Report and Written Opinion from corresponding International Application No. PCT/US2008/000508, May 29, 2008.

* cited by examiner

APPARATUS AND METHODS FOR TESTING PERFORMANCE OF A MATERIAL FOR USE IN A JET ENGINE

CLAIM OF PRIORITY

This application claims benefit of priority of U.S. provisional application Ser. No. 60/880,354, filed Jan. 12, 2007, the specification of which is incorporated herein by reference in its entirety.

ACKNOWLEDGMENT

Government support under Contract No. FA8650-06-M-5230, awarded by the United States Air Force, is acknowledged. The U.S. Government may have certain rights in the invention(s) described and/or claimed herein.

TECHNICAL FIELD

The field is generally that of an apparatus for testing performance of a material used in a jet engine, and methods of performing such tests. More particularly the field includes that of an apparatus that uses one or more miniature jet engine components.

BACKGROUND

Safety is probably the most important factor in the design and operation of aeronautical systems. Mechanical failure of an airplane component can result in a catastrophic demise of the entire vessel, frequently causing huge loss of life, and necessitates application of significant resources to analyze the causes of the failure so that recurrences in other systems can be mitigated. The economic loss propagates far beyond the immediate loss of the afflicted airplane and post-failure investigation, however. After the failure of a particular component in a particular airplane, industry regulations will usually mandate withdrawal from service of all instances of the same component that have seen at least the same number of hours of operation in other airplanes as had the actual component that failed. Overall safety considerations may also mandate that particular components are retired from service once they have reached a certain number of hours of operation, even though that number of hours may be considerably lower than the typical period when failure might be expected—often by as wide a margin as a factor of three. Nevertheless, reacting to the failure, or forced retirement, of a type of component at the industry-wide scale is time-consuming and expensive, but may also not be strictly necessary because many of the components are replaced when they still have many hundreds or thousands of hours of effective and reliable service life left. Thus, alternative approaches to management of component life are called for.

The reliability of jet engine components has a special status because of the extreme conditions of operation of the components. Fatigue-related failure of a jet engine component such as turbine blade can arise from several mechanisms. For a discussion of modeling fatigue crack propagation in an aircraft engine fan blade attachment, see for example Barlow and Chandra, *Int. J. Fatigue,* 27:1661-1668 (2005). Just as with many other high speed rotating systems, current safety regulations require gas turbine engines to satisfy both crack initiation (safe-life) and fatigue crack growth (damage tolerant) design criteria. In an attempt to satisfy these requirements, non-destructive inspection techniques such as fluorescent penetrant, eddy current, and ultrasonic inspections have been implemented by aviation organizations such as the United States Air Force (USAF), to detect small cracks at critical locations. These approaches, which rely on systematic inspections of critical life-limiting locations in components, detect cracks that can potentially grow to failure within the next inspection interval. However, such non-destructive inspections cannot be performed in-service and require a complete disassembly of the engine, which is extremely time-consuming and therefore also expensive. Hence, the current approach to life management of components in service is both time consuming and expensive.

Component reliability has also been tested during the design phase. Conventional durability testing of engine components is carried out with full-scale mock-ups in dedicated facilities and is also an extremely costly and time-consuming affair—typically costing several million dollars and requiring a year or more to complete. Hitherto it has been believed that only a full-scale test rig can accurately replicate the thermal gradients and stresses that are actually placed on a turbine component when in service. Testing a component can therefore only be carried out with a very small number of copies—usually as few as one or two—of the component. Testing to failure is needed to fully assess the durability of components, however, but is seldom if ever performed because of the damage that is wrought on the whole engine and the test-environment during just a single failure. Approval of a final design, however, requires at least one (and preferably many) non-failure durability tests on the near-final state of the turbine engine design. If durability issues are identified at a late stage in the design process, redesigns are expensive and have tremendous impact on delivery schedule to aircraft manufacturers and subsequent aircraft purchasers.

Failure of a component can arise from a combination of causes related to geometry, thermal conditions, and constituent materials. Thus, testing of the materials themselves also plays a vital role in overall reliability assessment. Small coupon tests—tests on standardized representative samples of material—have traditionally been used to determine damage mechanisms. The geometry of the coupons is usually simple, however, and typically comprises shapes such as smooth round bars, or flat bars, both with or without simple notches. Simple coupons cannot properly simulate the complex geometry of actual hardware. Furthermore, the coupons are typically very small in size (e.g., a volume less than ¼ cubic inch, such as ⅛ cubic inch) so that they can be heated and cooled rapidly over many thousands of cycles, although the tests are usually performed at a constant temperature using laboratory air or a vacuum. During testing, the coupons are usually subjected only to simple loading such as push-pull testing or rotating-bending in which the loading is cycled between constant values of the minimum and maximum stress. Coupon tests are valuable in determining potential damage mechanisms, and evaluating the relative resistance of different materials, but because the coupons do not have the structural geometry, loading conditions, and environment of actual components, they cannot be relied upon to provide detailed predictions of structural durability of those actual components.

Because there is so much difference between a coupon test and a full-scale engine durability test, an intermediate level of testing is often performed. One common intermediate test is the spin test. This test uses individual full-size components (rather than a complete engine). A component tested in a spin test has a geometry identical or similar to the actual components in operational service, so that loads resulting from shape and size are accurately represented. These tests are typically performed in a vacuum at constant temperatures.

Thus, loading from thermal gradients and other environmental influences are not represented. Even an intermediate test that involves just spinning hardware in a constant temperature vacuum pit can cost several hundred thousand dollars and up to a year to complete. These costs and schedule requirements have a drastic influence on the amount and extent of durability testing that can be performed.

Accordingly, there is a need for a testing regime for jet engine components that is inexpensive, affords the possibility of obtaining a statistically significant number of datapoints, that can be easily performed early in the design phase of an engine, and that can facilitate reliable prediction of engine life.

The discussion of the background to the invention herein is included to explain the context of the invention. This is not to be taken as an admission that any of the material referred to was published, known, or part of the common general knowledge as at the priority date of any of the claims.

Throughout the description and claims of the specification the word "comprise" and variations thereof, such as "comprising" and "comprises", is not intended to exclude other additives, components, integers or steps.

SUMMARY

An apparatus for supporting a jet engine, the apparatus comprising: a mount to which the jet engine is affixed; an exhaust chamber affixed to the mount and having an exhaust port from which to permit exhaust gases from an exhaust nozzle of the jet engine to exit the chamber, wherein the exhaust chamber is configured to surround the exhaust nozzle; and a containment shroud affixed to the mount, wherein the containment shroud is configured to enclose at least the portion of the jet engine not surrounded by the exhaust chamber, and wherein the containment shroud is configured to withstand a failure of a component of the jet engine during operation of the jet engine.

A method of adapting a miniature jet engine to test a material, the method comprising: removing an original component from the miniature jet engine; and substituting a new component in place of the original component, wherein the new component is constructed from the material.

A miniature jet engine, comprising: a component constructed from a material suitable for use in a full-size jet engine substituted for an original component of the scale model jet engine.

A test stand for a jet engine, the test stand comprising: a support; a mount affixed to the support, and configured to hold the jet engine while in operation; one or more containers removably affixed to the support or the mount, thereby permitting the jet engine to be removed or disassembled in between periods of operation, wherein the one or more containers are configured to: surround at least a portion of the jet engine; permit one or more measurements to be made on the jet engine or a component thereof during operation; and contain shrapnel resulting from a failure of a component of the jet engine.

A method of studying a failure mode of a jet engine, the method comprising: removing an original component from a miniature jet engine; substituting a new component in place of the original component, wherein the new component is constructed from a test material used in a full-size jet engine; running a test on the jet engine.

A method of studying a failure mechanism of a component of a jet engine, the method comprising: running one or more tests on a miniature jet engine adapted to include a miniature version of the component; and in between the one or more tests, making a measurement on the component. The failure mechanism can include but is not limited to: low cycle fatigue, foreign object damage, erosion, creep, crack growth, stress corrosion, thermal mechanical fatigue, fretting and manufacturing defects.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1A and 1B show perspective views of schematics of an exemplary apparatus, wherein FIG. 1A shows a rear view thereof, and FIG. 1B shows a front view thereof;

FIGS. 6A and 6B show perspective views of an exemplary apparatus, wherein FIG. 6A shows a side view thereof, and FIG. 6B shows a front view thereof;

DETAILED DESCRIPTION

Overview

Figure 1A:
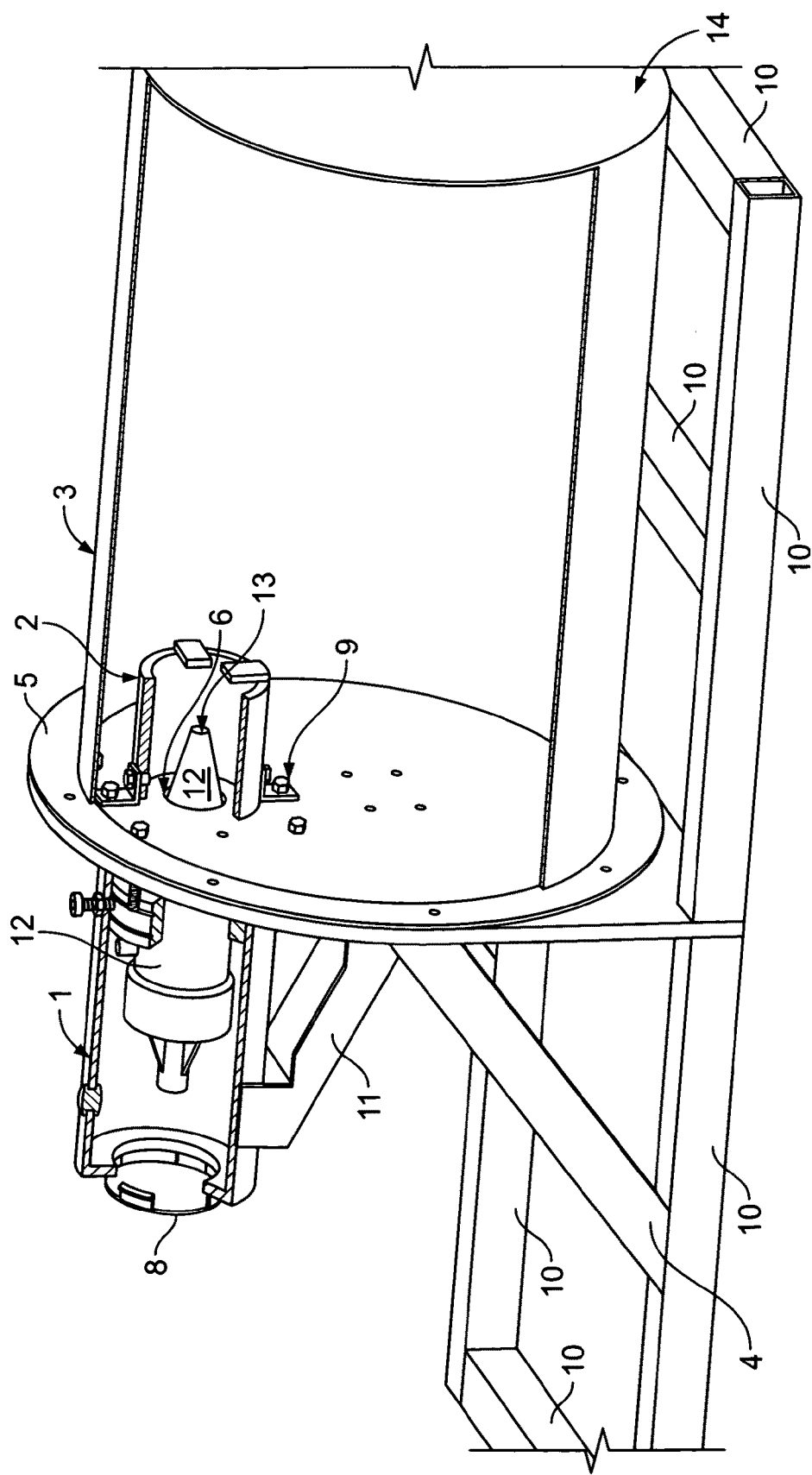

The apparatus described herein supports a jet engine and permits real-time measurements to be made while the jet engine is operating, up to and including failure, such as catastrophic failure, of one or more components of the engine, but is configured to withstand impacts from debris and fragments that emanate from any such failure. The apparatus also facilitates rapid removal of the jet engine from its supporting structure and subsequent disassembly so that measurements in between sessions of engine operation can be made routinely.

The apparatus herein utilizes a miniature jet engine, such as a commercially-available off-the-shelf gas turbine engine as used in a model aircraft, to provide a cost effective durability and prognosis test vehicle. In certain embodiments, the miniature jet engine has been suitably configured to use a test component in place of one its corresponding original components. The test component may be made from a material used in, or proposed to be used in, a corresponding component in a full-size engine as might be fitted on a civilian or military aircraft. The test component may additionally be engineered to replicate, e.g., to scale, a geometric feature of the corresponding component as found in a full-size engine.

The apparatus herein permits an engine designer, inspector, or other individual with an interest in engine performance, to easily address loading from thermal gradients and the engine's environment because a model engine is straightforward to disassemble. For example, a miniature engine can be disassembled in less than one man-hour (and has a comparable reassembly time), whereas a full-size engine can take as long as several man-weeks to disassemble. The model engine additionally permits a line of sight (thereby permitting easy monitoring) directly to a component such as a stressed turbine rotor. By contrast, full-size engines require complex and expensive video cameras for monitoring, and such equipment can prove unreliable in environments such as high temperature turbine exhaust gases.

Because components of a miniature turbine attain similar temperatures and exhaust environments to those exhibited by a full-size turbine engine, a miniature turbine provides an effective test vehicle for testing of components and particular materials used to manufacture such components. In particular, the stress fields experienced by a component of a miniature turbine are geometrically similar in both gradient and magnitude to those found in full-size engines, even though the volumes of material involved in the test components are far smaller. Of particular importance is the fact that loads and stresses induced by thermal gradients in the test components are similar to—or the same as—those of a full-size component in operation. The geometry of a component of a miniature engine may be similar to that of the corresponding component of a full-size engine in all significant respects other than size. However, the main difference between a component in a miniature engine and one in a full-size engine arises because—assuming a constant number of defects per unit volume—a small-scale component has fewer defects in it than does a full-size version of the same component. Thus, in general, the smaller a volume of material, the more durable and less prone to failure it is. The capability to test engine materials at one size and to scale the results to another size therefore takes into account the "durability size effect", meaning that only the volume of the material needs to be scaled, and not the stresses that the material experiences, and that the smaller number of total defects in the test material can be taken into account. Methods exist, (see for example U.S. Pat. No. 7,016,825 to Tryon, and, e.g., Fong, J. T. (1979) "Statistical Aspects of Fatigue at Microscopic, Specimen, and Component Levels," *Fatigue Mechanisms, ASTM STP 675*, pp. 729-758), both of which are incorporated herein by reference), to address the statistical aspects of fatigue caused by the durability size effect and thereby allow a test of a model engine to properly simulate a full-size engine durability test. Accordingly, the methods and apparatus described herein permit testing of volumes of materials (e.g., 1 cubic inch) at which effects are present that would also be present in larger volumes of the same material in a corresponding full-size component. In certain instances, the durability size effect may be captured by modeling several copies of a volume, (e.g., 1 cubic inch), of a material of interest instead of a single copy. However, even where multiple copies are tested, the cost and effort is significantly less than the cost and effort involved with testing a full-size component.

Heretofore, the use of small-scale components as surrogates for their full-size counterparts had not been contemplated at least because the analytical tools for predicting failure, and for properly extrapolating from a miniature component to a full-size component had not been developed. It was thought necessary to perform tests on actual components or full-scale equivalents, and that no substitute could be relied upon.

Apparatus

An apparatus for supporting a gas turbine engine during operation is described herein. An exemplary such apparatus is shown in perspective view with cutaway portions in FIGS. 1A and 1B, wherein reference numerals shown refer to items further described herein.

The apparatus described herein, also referred to herein as a 'test stand', is configured to be stable when a jet engine that it supports is in operation. The apparatus is also configured to dissipate heat of up to 300,000 BTU/hour, such as up to 250,000 BTU/hour, or such as up to 200,000 BTU/hour, or such as up to 175,000 BTU/hour, or such as up to 150,000 BTU/hour, and still further such as up to 100,000 BTU/hour. The apparatus is still further configured to contain a sudden failure of a component of the jet engine, such as, but not limited to, a rotor burst. In particular, a containment shroud as further described herein is configured to withstand and to contain such a sudden failure. By contain is meant that the fragments, pieces, shards, shrapnel, etc., that emanate from the engine during such failure are contained within the apparatus and do not travel outside it where significant damage to persons and/or property could be caused.

Figure 1B:
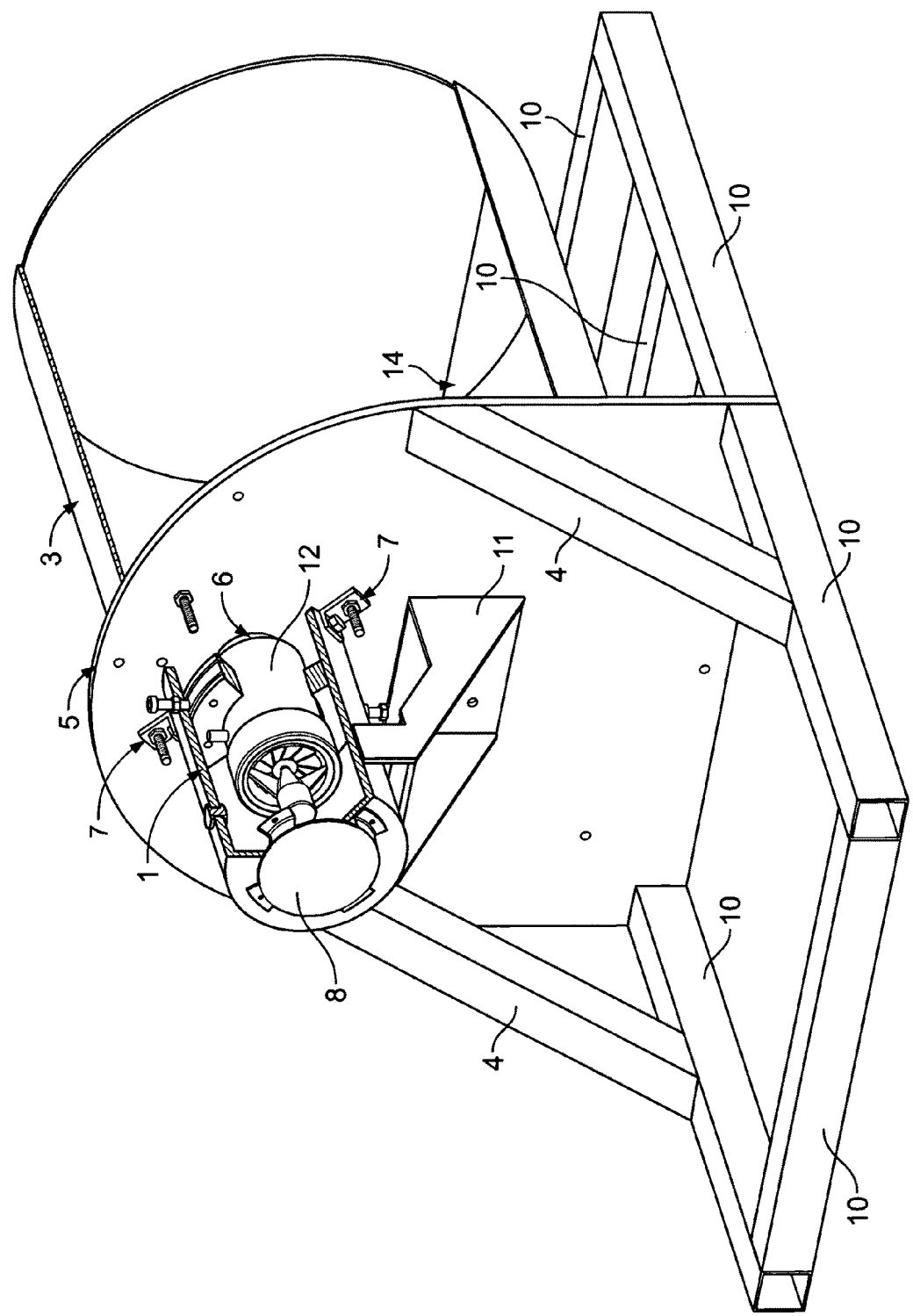

The exemplary apparatus for supporting a jet engine, as shown in FIGS. 1A and 1B comprises: a mount 5 to which the jet engine 12 is affixed; an exhaust chamber 3 affixed to mount 5 and configured to surround an exhaust nozzle 13 of the jet engine 12, and having an exhaust port 14 from which exhaust gases from the exhaust nozzle exit the exhaust chamber; a containment shroud 1 also affixed to mount 5, and configured to enclose at least the portion of the jet engine 12 not surrounded by the exhaust chamber, wherein the containment shroud is configured to withstand a failure of a component of the jet engine during operation of the jet engine; and an optional additional inner containment shroud 2 inside the exhaust chamber 3 and surrounding the exhaust nozzle 13 of jet engine 12, and affixed to mount 5.

The apparatus herein comprises a containment shroud having one or more portions (which may be separately referred to independently as containment shrouds). In the embodiment of the apparatus shown in FIGS. 1A and 1B, the apparatus is configured to have a containment shroud 1, and an additional containment shroud 2. Containment shroud 1 surrounds at least the air intake of the engine and the engine housing forward of the exhaust nozzle. Additional containment shroud 2 surrounds the exhaust nozzle, and is within exhaust chamber 3. The additional containment shroud 2 is configured to contain materials that exit the jet engine towards the exhaust chamber, upon a failure of a component of the jet engine.

The two piece embodiment (reference numerals 1 and 2) of the containment shroud depicted in FIGS. 1A and 1B is advantageous because it permits easy assembly and disassembly of the test stand, and easy mounting of jet engine 12. For example, containment shroud 1, 2, is easily removed from the rest of the apparatus to permit removal of jet engine 12. Furthermore, the two piece embodiment of the containment shroud shown in FIGS. 1A and 1B is advantageously configured so that, upon failure of a rotor of jet engine 12, only piece 1 is likely to sustain a level of damage that may—in exceptional circumstances—preclude further use thereof. Thus, in the case of a rotor failure of engine 12 that irreparably damages containment shroud 1, it is relatively easy and inexpensive to replace containment shroud 1 only, and to continue operation of the apparatus for further testing without having to make and replace additional containment shroud 2. It is also consistent that a failure of a component of engine 12 that leads to damage of piece 2 and not piece 1 would similarly and advantageously warrant only replacement of piece 2.

Nevertheless, it would be understood by one of ordinary skill in the art that this two-piece configuration of the containment shroud shown in FIGS. 1A and 1B is not the only possible configuration that is consistent with a manner of operation of the apparatus described herein. For example, whereas the two-piece containment shroud of FIGS. 1A and 1B comprises two pieces separately affixed to mount 5, a single piece containment shroud can be envisaged that straddles or pierces mount 5 and completely surrounds jet engine 12. It is also possible to position jet engine 12 so that the different portions or pieces of the one or more containment shrouds cover different parts of engine 12 from those depicted in FIGS. 1A and 1B. It is still further possible that a containment shroud can be contemplated that has more than two pieces that separately enclose different portions of the engine.

Containment shroud 1, and additional containment shroud 2, are made of a material that is able to withstand a catastrophic failure of a component of jet engine 12 that drives one or more fragments of jet engine 12 at high velocity into one or more interior surfaces of portions of the containment shroud. By withstand such a failure is meant that pieces of shrapnel from the failure of jet engine 12 do not rupture the containment shroud in a manner that causes one or more pieces of shrapnel to exit the containment shroud. In still other embodiments, the containment shroud does not significantly deform when fragments or shrapnel from failure of jet engine 12 impact the containment shroud. In certain embodiments, containment shroud piece 1 and/or 2 can be reused after failure of a jet engine contained within it, and can thereby be used in testing other jet engines. For example, a containment shroud, or portion thereof, is significantly deformed if it cannot be reused thereafter.

In certain embodiments, containment shroud 1 and/or 2 is therefore formed from steel, and, in certain instances, hardened steel. When made from steel, in some embodiments the containment shroud is made from steel that is ⅜" thick. In one embodiment, one or more pieces of the containment shroud, such as pieces 1, 2, are each formed from a butt end flange of a metal pipe such as a steel pipe. For certain types of miniature jet engines used herein, the metal pipe is standard 8" diameter steel pipe for containment shroud piece 1, and 6" diameter stress pipe for containment shroud 2, as shown in the embodiment of FIGS. 1A and 1B. It is thus advantageous that the containment shroud or pieces thereof is cylindrical, having a circular, or approximately circular cross-section, but it is not so required. Thus, containment shrouds that are square in cross section are also acceptable, subject to the other criteria described herein. Inner containment shroud 2 in the embodiment of FIGS. 1A and 1B has a grill on an end disposed away from mount 5. In the cutout of FIG. 1A, the rear (aft) portion of containment shroud 2 has two perpendicularly oriented bars (shown in part) that serve to contain fragments of a component failure while permitting exhaust gases to escape. Other embodiments of the aft portion of containment shroud 2 are consistent with effective operation, including, but not limited to a mesh, grid, grill, or arrangement of rods.

For jet engines 12 that are cylindrically symmetric, and possess a longitudinal axis on which, e.g., a rotor shaft is centered and about which a rotor rotates, in certain embodiments the containment shroud 1, 2 is disposed coaxially with the longitudinal axis of the engine, or in as close a position as is feasible to be coaxial. Such a disposition ensures that no one region of the containment shroud suffers a higher impact from fragments of a failure of jet engine 12 than another. It is also beneficial to mount containment shroud 1, 2 longitudinally symmetrically about the axis of the jet engine so that containment shroud 1, 2 does not undergo uneven heating during operation of the engine.

The exhaust chamber and the piece 1 of the containment shroud that encloses the air-intake end of jet engine 12 can be separated by a barrier that prevents recirculation of the exhaust gases from the exhaust chamber to the air intake. In the apparatus of FIGS. 1A and 1B, the mount 5 additionally serves a function of such a barrier, thereby both preventing recirculation of the exhaust gases from the exhaust chamber to the air intake and providing a fixed structure to which the exhaust chamber and containment shroud pieces are attached. It is to be understood though, that such a configuration is not the only one by which a barrier to recirculation of exhaust gases may be achieved.

Containment shroud 1, and where present, additional containment shroud 2 may both be attached to mount 5. When affixed to mount 5, the containment shroud can be affixed in a number of different ways. For example, one or more pieces of the containment shroud may have a flange that is bolted to mount 5. Alternatively, the shroud may be welded to mount 5. In still other embodiments, the containment shroud is attached to mount 5 by one or more, and preferably three—five, angled brackets 7. Additional containment shroud 2 is attached by angled brackets 9. Such angled brackets are also made of steel in certain embodiments of the apparatus. In some embodiments, pieces 1 and 2 of the containment shroud are affixed to mount 5 by different methods from one another so that one, for example, is welded whereas the other is attached by brackets.

In a further embodiment of the apparatus described herein, one or more pieces of the containment shroud 1, 2, are additionally and optionally attached to a buttress to provide additional support. In FIG. 1A, piece 1 is attached to buttress 11, which itself is also attached to mount 5. Buttress 11 provides additional strength for the containment shroud to withstand failure of a jet engine component. Buttress 11 can be attached to both a piece of the containment shroud 1 and mount 5, as shown in FIG. 1A, or can be attached between the containment shroud and some other part of the test stand, e.g., base 4 or 10. Buttress such as 11 is made of steel in some embodiments, and in particular embodiments, is made of ¼" steel plate.

In extraordinary circumstances, a large piece of shrapnel may move forward of the engine, upon failure of the engine. The containment shroud 1 that encloses an air intake of engine 12 can be configured with a grating 8 that protects the outside of the apparatus from pieces of shrapnel, but permits air to flow into the air intake without significant onset of turbulence in the airflow. The grating is configured so as not to significantly constrict airflow into shroud 1. Accordingly, to ensure adequate airflow into the engine, the grating has inlet holes, the sum of whose areas is an inlet area that is typically not less than about 200% of the inlet nozzle area of the air intake of the jet engine. Such a total size also has an effect of reducing unwanted turbulence in the inlet airflow. Grating 8 is also engineered to contain fragments arising during failure of a component of engine 12. Inlet grating 8 can be an 8" diameter steel grate, but may have other dimensions consistent with operation of the apparatus. Inlet grating 8 is configured to permit sufficient airflow to jet engine 12 that jet engine 12 can operate normally. Inlet grating 8 may also be configured so that shrapnel from jet engine 12 that is ejected into the containment shroud upon a catastrophic failure of a component of jet engine 12 does not exit the containment shroud.

Mount 5 can be made of steel, and in certain embodiments, is made of ¼" steel plate. Mount 5 is shown in FIGS. 1A and 1B as being a single, vertically-disposed, plate and can be configured to ensure that the containment shroud is rigid during operation of the jet engine. Other configurations of mount are further consistent with the apparatus disclosed herein. For example, mount 5 may be a framework to which the containment shroud is attached in such a manner that the containment shroud and the jet engine remain rigid during operation of jet engine 12. Mount 5 may also be a single plate that is not exactly vertically disposed but instead may be positioned at an angle to the horizontal lying between 0° and 90°.

Jet engine 12 is also attached to mount 5. In some embodiments, the jet engine has a housing (not specifically shown in FIGS. 1A and 1B), and the housing is affixed to the mount. The engine can be affixed to the mount in such a manner that it may be easily mounted, removed, or disassembled.

The apparatus disclosed herein still further comprises a sealing 6 between jet engine 12 and the mount, such as between a housing of jet engine 12 and mount 5 as shown in FIGS. 1A, 1B. The sealing 6 is beneficially a high temperature gasket between a housing of jet engine 12 and mount 5. Such a gasket can be made of high temperature fiber such as used in an automotive exhaust manifold gasket. The sealing can be configured to prevent recirculation of exhaust gases from exhaust chamber 3 to the air intake. This is advantageous because it is desired to control the temperature and composition of gases that enter the air intake of jet engine 12.

Exhaust chamber 3 can also be affixed to mount 5. Exhaust chamber 3 may be affixed to mount 5 via a flange through which bolts or rivets are driven. Chamber 3 may be attached to mount 5 with one or more, such as several, angled brackets (not shown in FIG. 1A) similar to those used to attach containment shrouds 1 or 2 to mount 5. Additionally and optionally, chamber 3 may be supported by a buttress (not shown in FIG. 1A or 1B) similar to that shown supporting containment shroud 1 in FIGS. 1A and 1B.

In certain embodiments, exhaust chamber 3 can withstand a temperature of 800° F. In still other embodiments, the exhaust chamber can withstand a temperature of 1,000° F. Such temperatures arise because the gases that exit the jet engine exhaust nozzle during operation of the engine are at high temperatures. In some embodiments, the exhaust chamber further comprises a heat shield (not shown in FIGS. 1A and 1B). The heat shield is attached to the aft end of the exhaust chamber 3. The heat shield is configured to protect the aft end of the exhaust chamber from the exhaust blast generated during operation of the jet engine 12. In certain embodiments the heat shield is a ceramic pad.

Exhaust chamber 3 can be made of steel and typically has a volume significantly larger than the volume of the jet engine 12. In some embodiments, exhaust chamber 3 is formed from a metal drum, such as a standard 55 gallon drum having a 24" diameter. Exhaust chamber 3 may be cylindrical having a circular or approximately circular cross-section but need to be so limited in shape and may, alternately, be rectilinear.

Exhaust chamber 3 also is configured to have an exhaust port 14 at an end of the chamber disposed away from the mount. In FIGS. 1A and 1B, the exhaust port 14 is shown in the bottom segment of the aft end of the chamber but it would be understood that its location need not be so constrained. It is advantageous that the exhaust port is located in a position so that any shrapnel that arises from a failure of engine 12 does not escape exhaust chamber 3 along a line of sight with exhaust nozzle 13. The exhaust port 14 can have an area of 80 square inches in an end of a 24" diameter drum, but in general is configured to permit an escape of exhaust gases at a rate without interfering in operation of the engine. Thus the exhaust port may be from 10% to 30% of the area of the end of the exhaust chamber, such as 12.5%, 15% 17.5%, 20%, 22.5%, or 25% of that area. Typically the area of the exhaust port is 8-10 times the exhaust area of the engine. Thus, the apparatus described herein, an example of which is shown in FIGS. 1A and 1B, can dissipate heat of up to 250,000 BTU/hour, which is a typical maximum amount of energy generated by a miniature jet engine 12 at maximum operating conditions. In some embodiments, the exhaust port is configured with sound suppression material (not shown in FIG. 1A) such as high temperature fiber-glass.

The apparatus may further comprise a supporting structure to which at least mount 5 is affixed. The supporting structure may take many forms or configurations, and be made of many alternative materials. The supporting structure can be sufficiently heavy that the apparatus does not move, such as translate, rotate, or vibrate, during operation of the jet engine 12. Alternatively, the supporting structure may itself be affixed to an immovable object such as the ground or a solid platform, so as to avoid wholesale motions of the apparatus during operation of the jet engine. In other embodiments, a supporting structure may be mounted reversibly or irreversibly on a movable platform, such as a trailer, to permit ease of transportation. In such embodiments, the supporting structure may comprise dedicated attachments to permit attachment to another object or platform.

In the embodiment of FIGS. 1A and 1B, the supporting structure comprises steel tubing 4 and 10 such as standard steel square tubing. In FIGS. 1A and 1B, tubing 10 provides a base for the apparatus, to which mount 5 is affixed, and tubes 4 provide additional stability for mount 5 and counter-balance to the thrust generated from jet engine 12. The choice of an appropriate steel would be within the capability of one of ordinary skill in the art, subject to an appreciation of such factors as the temperatures to be withstood, and the size and weight of the jet engine in question, and its thrust, and the force of impact from engine pieces upon engine failure.

Overall, the apparatus described herein is configured to ensure that, in an event of a failure of a component of the jet engine, all lines of sight with respect to the jet engine are contained so that no fragment of a component exits either the containment shroud or the exhaust chamber.

The apparatus is also configured to permit various service functions to access jet engine 12. Thus, the apparatus can further comprise a fuel intake configured to deliver fuel to the jet engine 12, and an ignition source (see FIGS. 6A and 6B) configured to ignite the fuel when mixed with air in the jet engine, in a manner consistent with normal operation of the engine. The various service functions may be provided by one or more supply, control, and monitoring lines, all of which may be accommodated on the test stand. The various lines may be routed through grommets of appropriate sizes and may pass through, e.g., a grill.

The apparatus is optionally configured with one or more sensors for reporting operational data on jet engine 12. Exemplary sensors used with the apparatus include those that measure engine exhaust gas temperature and engine RPM. These sensors are typically mounted inside an engine and are not shown in the FIGs. The temperature and engine speed can be monitored and recorded at, e.g., a 4 Hz interval, with magnetic pickups.

Computer software can be developed to automatically control jet engine 12 for a set test regimen. The software is configured to communicate with an engine control unit that is typically supplied with a given engine. An engine control unit is an electronic unit that can control engine speed. Computer software may contain instructions to cause the engine control unit to start the engine and to run the engine at a sequence of set speeds for a sequence of set times, and thereafter to stop the engine. The computer software may further contain a user interface, such as a graphical user interface, that permits a user such as a test engineer to input mission parameters for a particular test run of the engine. Mission parameters may include speed and duration information. The computer software may alternatively read mission parameters from a file. The development and implementation of the computer software is within the capability of one of ordinary skill in the art. The engine control unit is also configured to receive data from one or more engine sensors that tell it whether the engine is operating at a desired speed, to within certain tolerances. A typical tolerance would be 1,000 r.p.m. for an engine speed of 6,000 r.p.m.

The computer software may therefore run on a suitably configured computer having a processor adapted to execute instructions in the software. The computer may be connected directly to the engine control unit and therefore accept runtime and other data from it, as well as provide control to it. The computer may store the data received from the engine control unit in, for example, one or more memories such as random-access memory.

Without being limited to any particular design or scale criteria, one of ordinary skill in the art would understand that the apparatus, or one or more parts thereof, may be scaled up or down in size relative to the typical dimensions presented herein, according to the size and power of jet engine 12.

Although the embodiment described in the foregoing, and shown in FIGS. 1A and 1B, is suitable for testing a single jet engine, it would be understood that, consistent with the description herein, an alternative apparatus can be designed and constructed that is adapted to test multiple jet engines. In such an apparatus, the multiple jet engines may be mounted simultaneously, or not at the same time, and may be tested simultaneously or not at the same time. It is to be understood that multiple jet engines may include 2, 3, 4, 5, 6, 8, 10, 12, 16, 20 or more jet engines, and that each individual jet engine may be separately testable and controllable. Where multiple jet engines are supported by the apparatus, they need not be identical to one another and need not test copies of components having the same materials or designs. An apparatus for supporting multiple jet engines may be configured to have individual containment shrouds and exhaust chambers for each engine, or to have containment shrouds and exhaust chambers that enclose multiple engines or parts thereof.

It would also be understood that the test stand herein may be further adapted to carry out one or more particular tests, by adding further structures or features that, for example, permit or facilitate certain measurements, or which promote a particular failure mode, as further described herein.

Jet Engines

Jet engine 12 is typically a miniature jet engine, by which is meant one that is small in its class. Without being bound by any particular size limitation, jet engine 12 is typically not a full-size engine that is used in an operational service aircraft used by either the military or in civil aviation, except that, as further discussed herein, jet engine 12 may be an actual engine—suitably modified as applicable—that is used in a pilotless reconnaissance aircraft such as a drone or a 'UAV' (unmanned aerial vehicle).

The jet engine 12 may be an axial flow turbine or a radial flow turbine engine. It is advantageous for analysis of jet aircraft behavior that jet engine 12 is an axial flow turbine, that has the same manner of operation as those found on a full-size jet aircraft. Jet engine 12 may be selected from the group consisting of: gas turbine, including those classified as axial flow and radial flow; turbojet; turbofan; pulsejet; and a turboshaft engine such as a turbo-prop. The jet engine is advantageously a gas turbine engine, i.e., of a type used in an aircraft in civil or military service.

In certain embodiments, jet engine 12 is a model jet engine as used in a model airplane constructed and flown by hobby enthusiasts. Thus, the term 'model' is meant to include a functioning jet engine that provides sufficient thrust to power a model airplane, and is not a static variant. In certain other embodiments, the jet engine is a scale model engine that has the same proportions as an exemplary but specific full-size engine as used in a civil or military aircraft. It is to be understood that a model engine in general is one that operates according to the same principles as a full-size engine, and has a similar or the same array of components, but may not be exactly to scale in all respects. It is thus to be understood that a miniature jet engine that is identified as a model of a specific, identifiable, full-size jet engine may or may not resemble the full-size jet engine in every respect. A scale model engine is one that is designed to replicate in all respects a full-size engine, including dimensions, proportions, and appearance, but on a substantially smaller scale.

Figure 3:
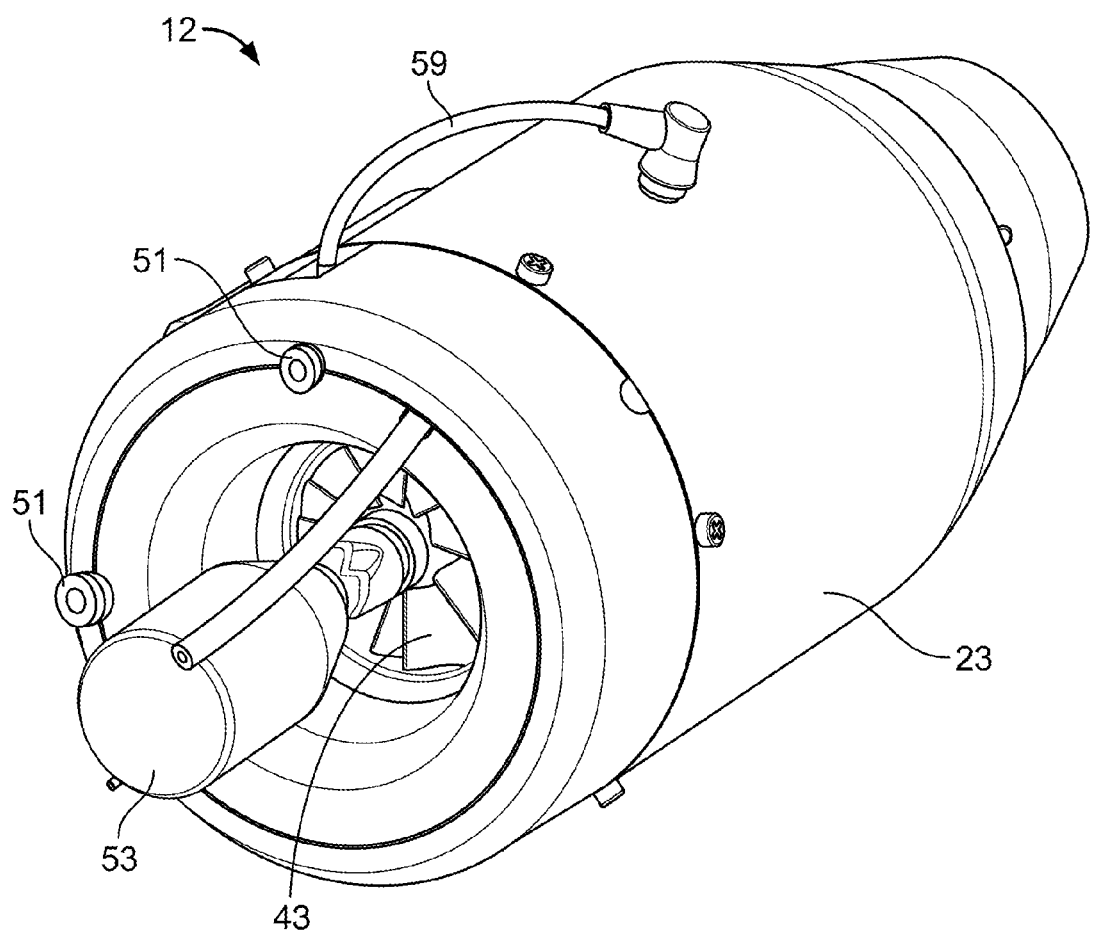
FIG. 3 shows a representative commercially available miniature gas turbine engine.

There are at least thirteen manufacturers of model gas turbines, thereby providing a variety of models that have a wide range of thrust ratings and configurations. A number of engines, available off-the-shelf, have the potential to meet desirable criteria for usage, cost and expendability in connection with the apparatus and methods of use herein. One such example is the Jet Cat P-70, as shown in FIG. 3. The turbine of the Jet Cat P-70 incorporates a centrifugal compressor and an axial flow turbine disk. It possesses fundamental features of a full-size turbine engine (6:1 thrust to weight ratio with a 1,800° F. exhaust gas temperature (EGT)), but it weighs just under 2 lbs and costs just a few thousand dollars.

A miniature jet engine for use herein need not be purchased off-the-shelf, but may be custom built according to a desired specification and for purposes of testing a specific instance of a full-size engine, as applicable.

Alternatively, the jet engine 12 may be one that is deployed in a drone or other UAV that is pilotless; in which case, it is not a model thereof that is tested, but an actual instance. Such engines from pilotless reconnaissance aircraft are considered to be miniature jet engines for the purposes herein. It is also conceivable that a model of such an engine used in a drone may be tested in a manner described herein where an actual instance is unavailable.

The jet engine 12 or a pertinent component thereof may thus be about $\frac{1}{6}^{th}$ the size of a full-size engine that it represents. The jet engine 12 or a pertinent component thereof may also be of other sizes relative to a full-size engine, such as, but not limited to: $\frac{1}{4}$ size; $\frac{1}{8}^{th}$ size; $\frac{1}{10}^{th}$ size; $\frac{1}{12}^{th}$ size; $\frac{1}{16}^{th}$ size; $\frac{1}{20}^{th}$ size; $\frac{1}{24}^{th}$ size; $\frac{1}{30}^{th}$ size; $\frac{1}{32}^{nd}$ size; $\frac{1}{36}^{th}$ size; and $\frac{1}{48}^{th}$ size. They may also be other than an exact rational fraction of a size of a full-size engine.

The jet engine 12 can have a thrust to weight ratio in the range 3:1 to 10:1, such as 6:1, or about 6:1 such as between 5:1 and 7:1, which is common for a full-size engine as used on a commercial or military aircraft.

It is further to be understood that jet engine 12 includes a miniature jet engine that has been modified for the purposes of testing a material. Thus, a miniature jet engine includes a model jet engine that has had an original component replaced by a corresponding component made from a test material of interest and/or possessing one or more geometric features that is present in a particular full-size engine. Thus, for example, a rotor blade in a specific commercially operational engine may have five distinctive geometric features. A rotor blade can be constructed having each of the five features and inserted in place of an existing rotor blade in a rotor of a model jet engine. Operation of the model jet engine with each of the blades in turn will now simulate the geometric stresses placed upon those blades, permitting predictions of lifetime of the full-size equivalent to be made.

The type of aircraft from which the jet engine 12 is modeled, is selected from the group consisting of: jet-helicopter, fixed-wing aircraft, a vertical take-off and landing (VTOL) aircraft, and a short take-off and landing (STOL) aircraft. The engine may also be modeled for power generation in items such as automobiles, trucks and buses, water pumps, ships, and electrical generators, all of which can employ jet engines. The last of these, electrical generators, typically deploy a turbo-shaft engine that extracts energy into the shaft but produces no thrust; the power generated is altered by changing the size of the containment flange. Such electrical generators typically have a muffler, but no containment shroud.

The jet engine 12 may be a model or a scale model of a jet engine, or may be a model engine adapted to use a component modeled on a corresponding component from a jet engine used in a civil airliner such as a short range, medium range, or long haul, narrow body or wide-body airliner. Such airliners are not limited to, and can be selected from the group consisting of: Boeing 717; Boeing 737; Boeing 747; Boeing 757; Boeing 767; Boeing 777; Boeing 787; Airbus A300 series; Airbus A310 series; Airbus A320 series; Airbus A330 series; Airbus A380; and McDonnell Douglas MD-11, and variants thereof.

Jet engine 12 may still further be a miniature version, or may be a model engine of one adapted to use a component modeled on a corresponding component from a jet engine found in a corporate or business jet such as, but not limited to, a Learjet, Dassault Falcon, Lockheed JetStar, or a Rockwell SabreLiner, and variants thereof.

Other commercially operational aircraft whose engines are effectively modeled according to methods described herein are found at: www.airliners.net/info.

The jet engine 12 may also be a model or a scale model of a jet engine, or may be a model engine adapted to use a component modeled on a corresponding component from a jet engine used in types of military aircraft selected from the group consisting of: bombers, fighters, cargo aircraft, tankers, trainers, stealth aircraft, reconnaissance aircraft, drones, and missiles. Examples of specific military aircraft whose engines are effectively modeled are found at: www.fas.org/man/dod-101/sys/ac/index.html, and at www.fas.org/man/dod-101/sys/ac/row/index.html.

Exemplary commercial jet engines whose operation is simulated with the apparatus described herein include, but are not limited to: JT8D, JT9D, PW2000 PW 600, PW 800, PW4000 PW6000, CF 6, CF34, GE90, Trent 500, Trent 700, RB211, AE 3007. Exemplary commercial turbo shaft engines whose operation is simulated with the apparatus described herein include, but are not limited to: PT6, PW 200, CT7, AE 2007, and AE250.

Exemplary military engines whose operation is simulated with the apparatus described herein include, but are not limited to Pratt & Whitney: F100, F101, F110, F117, F118, F119, F135 F136, F414, T-64, and T-700.

Exemplary engines used in power systems whose operation is simulated with the apparatus described herein include, but are not limited to: FT8, PW900, and LM6000.

The jet engine 12 has one or more components selected from the group consisting of: air intake; rotor; rotor shaft; stator; fan blade; turbine; combustor; housing; a nozzle such as a turbine nozzle or an exhaust nozzle, and a compressor. As would be understood by one of ordinary skill in the art, the components found in jet engine 12 may vary in size, shape, or number (including presence or absence), according to the type or model of jet engine. For example, a jet engine such as a ramjet does not have a rotor or a rotor shaft and would therefore require a source of forced air for simulation of its operation.

Figure 2:
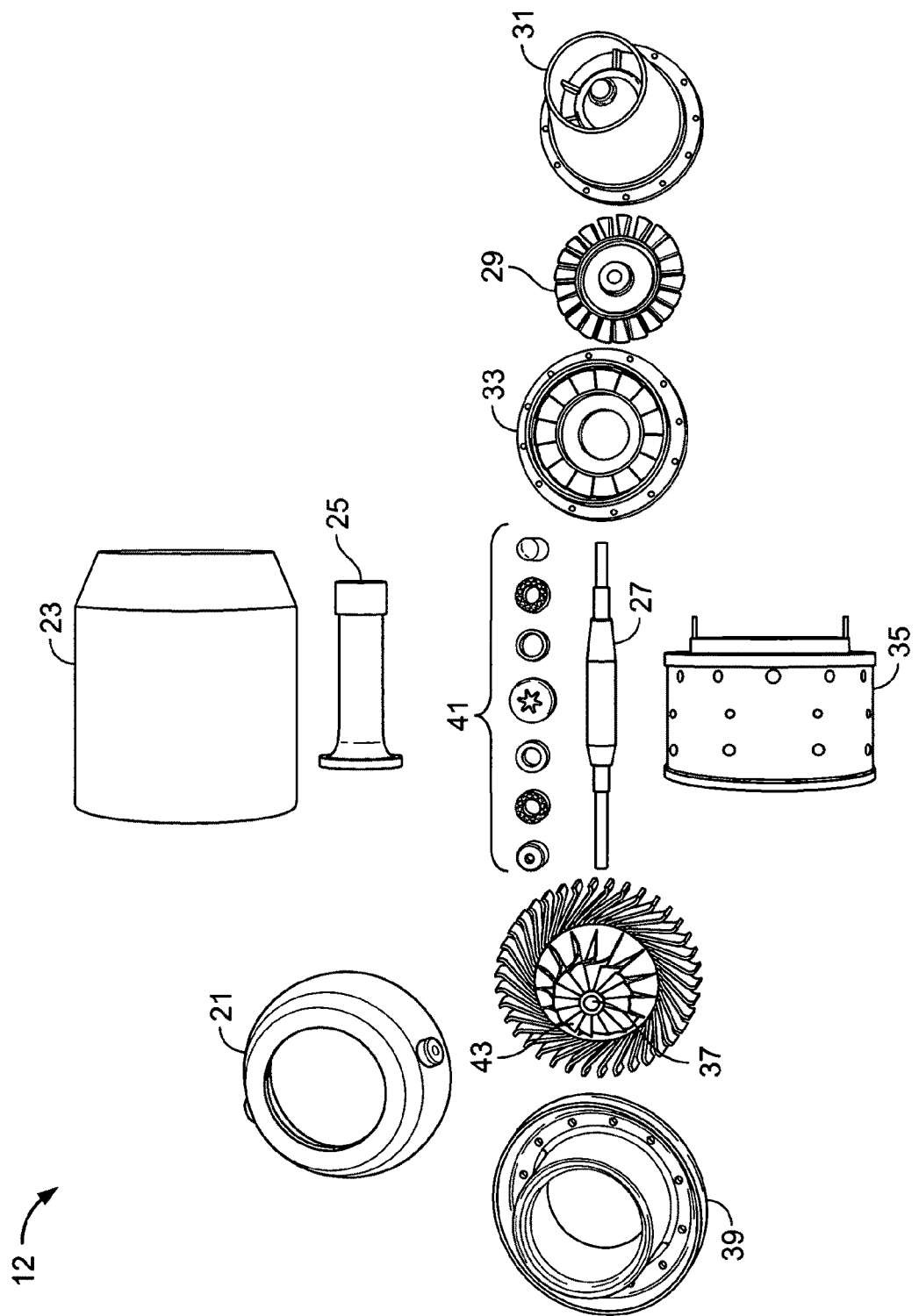
FIG. 2 shows a representative disassembled commercially available miniature gas turbine engine.

Exemplary components of a jet engine 12 for use with the apparatus described herein are shown in FIG. 2. As would be understood by one of ordinary skill in the art, jet engine 12 has one or more rotors, such as a turbine rotor 29, and a compressor rotor 43, attached to a rotor shaft 27. The compressor has several components, including a rotor, nozzle, and housing. Compressor rotor 43 is situated inside a compressor housing 39, which is connected to a compressor nozzle 37. Inlet housing 21 is disposed outside of the compressor components.

Rotor shaft 27 is disposed within shaft housing 25, and rotates on several bearings and seals 41. Shaft housing 25 is itself disposed within a combustion chamber 35. The turbine assembly is at the opposite end of shaft 27 from the compressor. Turbine rotor 29 is affixed to shaft 27, and is concentrically mounted with respect to turbine nozzle 33. Aft of nozzle 33 is exhaust nozzle 31. Engine housing 23 surrounds the combustion chamber, compressor, and turbine. As would be understood by one of ordinary skill in the art, still other jet engine configurations with other additional or alternative components may be used with the apparatus described herein.

Each of the components shown in FIG. 2 and others not shown but found in other jet engines, where present in a commercially available model engine, may be substituted by a component of equivalent function made from a test material of interest and/or having a particular geometric or other design feature that is found in a corresponding instance of a full-size engine. It is also possible that a commercially available model engine can be adapted—according to methods and principles herein—to accommodate a component from a full-size jet engine that has no direct counterpart in the model.

FIG. 3 shows the exterior of a representative miniature jet engine 12. The exemplary engine of FIG. 3 has a housing 23 to which is attached a glow plug 59, which is used to ignite a gaseous fuel-air mixture inside the combustion chamber (not shown in FIG. 3). Fuel intake attachments 51 permit fuel to be introduced into the engine via one or more fuel lines (not shown in FIG. 3). Starter motor 53 is optional and causes the compressor rotor 43 to rotate initially.

Figure 4:
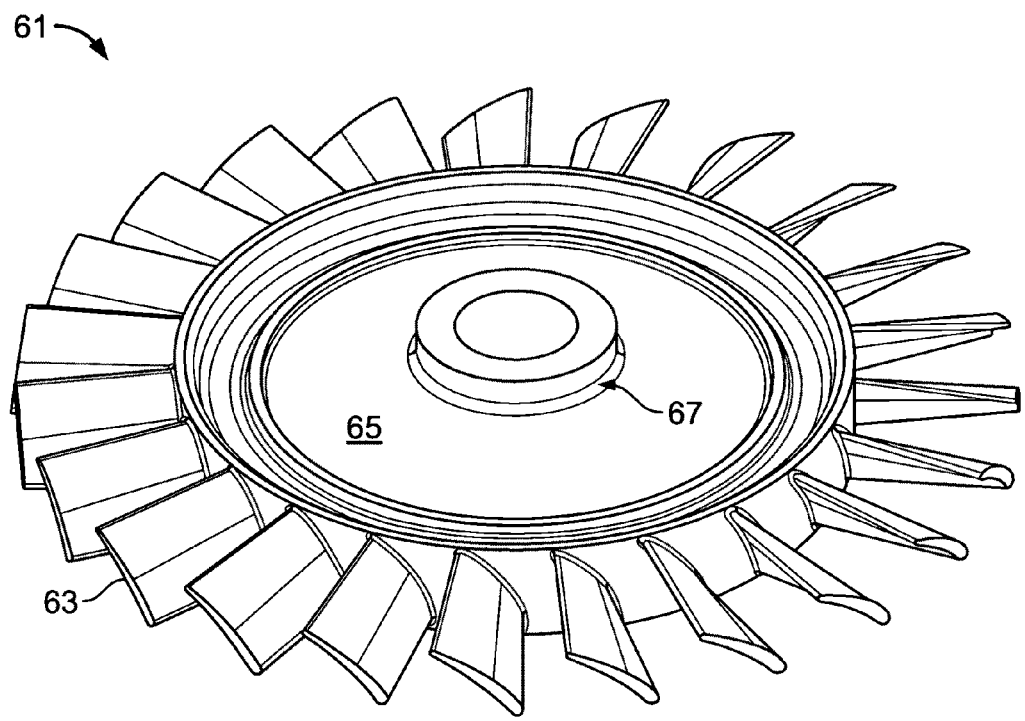
FIG. 4 shows an exemplary rotor.

FIG. 4 shows various features of a representative rotor 61 as would be present in a jet engine. Rotor 61 comprises a disk 65 having a concentrically disposed bore 67. A plurality of blades 63 are attached to the radial edge of disk 65. Three types of deformation of a given blade 63 have been characterized, and are shown schematically in FIG. 4. Lean represents an angle at which a blade plane is disposed with respect to the axis of rotation of the rotor (shown as a vertical axis in FIG. 4). Tilt represents an angle between the plane of a blade and the edge of the rotor. Twist represents a shearing of the plane of the blade between its edge and its base, where it is joined to the rotor disk.

Many of the important geometric features of a full-size gas turbine are present in, or can be created in, a miniature gas turbine. Features of the rotating components that can be modeled include, but are not limited to: airfoil twist, tilt, and lean; airfoil to rim attachments; rim geometry; standoffs and spacers; bore geometry; and bearing geometries. Features of static components that can be replicated include: vane geometry; and vane packets. In some full-size jet engines, a number of stages are present, wherein a stage comprises a rotor and attached blades, which rotate, and an adjacent stator (or vane) assembly, which remain stationary. It is often sufficient, in a model or miniature engine, to test only a single stage.

It is advantageous if the only constraint on rotor geometry is that the airfoils are designed to extract power from the gas stream. Significant variability can be used in the airfoil design for a miniature jet engine as used herein because considerations of efficient fuel economy and weight are not as important as they would be for a design of an airfoil in an engine that is used to power a full-size operational aircraft. Furthermore, the amount of fuel used in operation of a miniature gas turbine during test protocols as described herein is minute in proportion to the fuel consumption of a full-size engine over the same period of time. In certain embodiments, the rotor used herein is designed for performance testing such as stress-testing. Further types of tests are described elsewhere herein.

Figure 5:
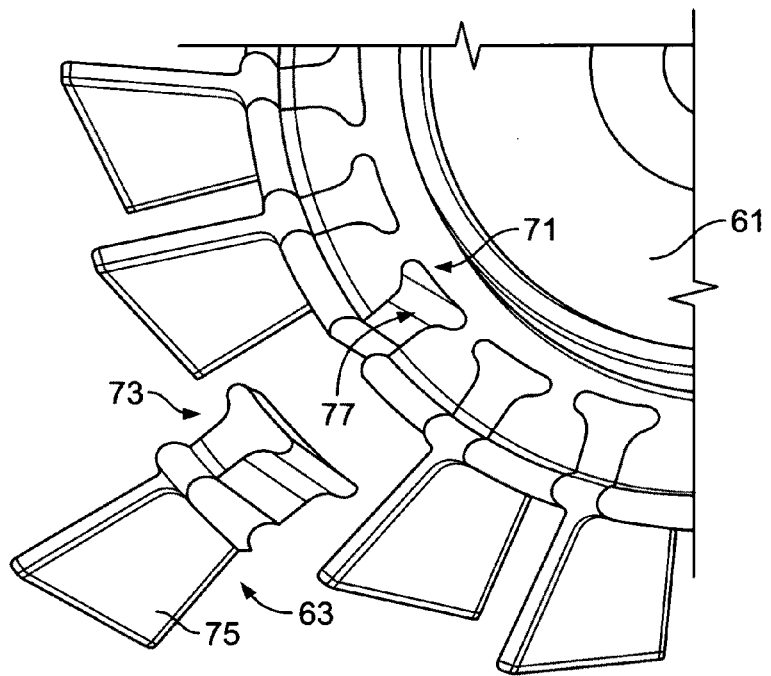
FIG. 5 shows a rim and a blade of an exemplary rotor.

FIG. 5 shows a representative attachment of a blade to a rotor rim, illustrating how a blade of test material may be substituted for a pre-existing blade. A blade 63 comprises an airfoil 75 and an airfoil attachment 73. Typically the airfoil and airfoil attachment are parts of a single contiguous piece of material. The rim geometry 71 of rotor 61 is such that various sockets 77 are engineered to receive an airfoil attachment 73. When joined to the rotor, each blade exposes only its airfoil 75.

During operation, the jet engine 12 has an exhaust gas temperature of up to about 2,400° F., and may be about 1,800° F., and still further may be about 1,500° F.

Test Conditions

Important factors affecting operation of a miniature jet engine include: geometry, materials, speed of rotation, temperature, environment, duration of operation. The goals of a given simulation determine the types of sensors and monitoring activities to carry out, and types of fault to monitor and diagnose, as well as the types of conditions under which to run the engine.

In a simplest embodiment of the apparatus described herein, only a single regulator is deployed: the voltage on the fuel pump that determines the quantity of jet fuel that enters the engine.

In certain embodiments, the jet engine 12 has been adapted to provide data on operation, including but not limited to failure, of a component that is made from a material that is used in a full-size component in a full-size engine used in a civil or military aircraft. Examples of such components include, but are not limited to, rotors, rotor shafts, and rotor blades. The jet engine 12 may be adapted by, for example, obtaining a commercially available ('off-the-shelf') model jet engine, disassembling it, removing the component of interest, and replacing the component of interest with one of the same or approximately the same dimensions but made from a material of interest for use in a full-size engine. In alternative embodiments, a model jet engine can be made from scratch, including all of its components, and such that one of its components of interest is engineered from a material of interest.

As discussed herein, jet engine 12 can be configured to include a component of interest that is made of a material used in a full-size jet engine as found on a civil or military aircraft. In certain embodiments, such a material is a nickel superalloy. In still other embodiments, the nickel superalloy is IN713.

Other nickel superalloys and high temperature materials such as steels, cobalt alloys, titanium alloys, and ceramics, can be used to make the high temperature components of the jet engine. Such components may be manufactured via conventional casting, forging, or powder metallurgy methods. The model engine allows for testing the response of the materials to real conditions of geometry, loading and environment, provided that the component has a statistically significant number of microstructural elements, and the microstructure, failure mechanism(s), loading, and environment of the component match through testing that of the real component.

When the component of jet engine 12 that is made from a material of interest is a rotor, the rotor can be configured to rotate at between 20,000 and 130,000 revolutions per minute. The important centrifugal loading conditions are met because the airfoil tip speeds are sonic, similar to a full-size gas turbine. Revolutions per minute (RPM) range from 20,000 at idle to 130,000 at maximum steady state. These speeds allow centrifugal loading conditions on the rotor of the model engine to be equal in magnitude to the loadings on rotors in full-size engines. The speed of the model engines can be adjusted to cause stresses below the fatigue limit (to ensure effectively an infinite life) as well as stresses above the ultimate strength (thereby precipitating immediate failure of a component).

The temperature gradient that exists along the length of a blade during operation of the jet engine arises as a result of the blade tip reaching a higher temperature than the base of the blade, which is cooled. During operation, a blade tip may reach a temperature of, e.g., 2200° F., whereas a blade base may reach a temperature of, e.g., only about 800° F. The temperature gradient exerts a significant load—due to thermal stress—on the blade, which is a significant cause of blade or rotor disk failure.

In instances where the component of interest is a rotor, the jet engine 12 can comprise a rotor shaft to which the rotor is attached, and is such that the rotor shaft is attached to a bearing. The rotor shaft rotates on its axis, inside a bore. During operation of the jet engine, it is advantageous if the rotor shaft attains a temperature no greater than 400° F. so that the bearings remain within their durable operating environment and so that the temperature gradient that is generated across the rotor blade provides a comparable stress to that encountered in normal operation of a full-size engine. The bearings are typically cooled with engine fuel.

In instances where the component of interest is a rotor, the rotor comprises an airfoil, and the airfoil attains a temperature between about 800° F. and 1350° F. during operation of the jet engine to ensure the correct temperature gradient in the rotor without harming the airfoils.

It is desirable that a thermal gradient on the rotor disk, see FIG. 4, between the airfoil and the rotor shaft, during operation of the jet engine, is the same as in a large turbine and thereby causes a loading that is equivalent to a loading, which in certain embodiments is a tri-axial loading (one having components in three mutually orthogonal directions), due to a thermal gradient in a full-size jet engine. Thus, typically in the jet engines described herein a temperature at the bore may be 400° F., the temperature at the blade base (about 1" away) is typically 800° F., and the temperature at the blade tip is 1350° F. Although the temperature gradient across the blade is higher than the gradient across the disk, this is acceptable because the blades are less sensitive to stress than are the disks. The important temperature gradient conditions are met because the airfoil temperatures are similar to the gas stream temperatures of 800° F. at idle, and may reach 1200° F. at maximum steady state speed with acceleration overshoots to 1800° F. These are equivalent temperatures to those found in full-size engines. The key variable to simulate in the jet engine described herein is the stress state.

Thus, failure of a rotor disk can be tested with the apparatus described herein. A rotor disk failure (also known as a "disk burst") will lead to an engine explosion and is extremely expensive to test for in a full-size engine. In a miniature engine as described herein, however, it may be simulated straightforwardly and cost-effectively.

Just as with rotation speed, the temperature of a model engine can be adjusted over a wide range, such as to provide conditions that afford effectively infinite component life, and to temperatures above the material capabilities (that cause immediate failure of the component).

Important environmental conditions of engine operation are met because the engine burns the same types of fuels at similar combustor temperatures as a full size engine. The corrosion effects of various different fuels can therefore also be determined by using the apparatus and testing methods as described herein. For example, tests of high sulfur fuels, salt spray ingestion, and performance of various fuel additives can be carried out, as well as corrosion tests, and tests of exhaust gas byproducts, using a miniature engine as described herein.

Tests of jet engine 12 advantageously involve many cycles of loading, up to five cycles per minute. A typical test may need 10,000 cycles which would require 33.3 hours of test time.

Exemplary Types of Test

Jet engine 12 can be operated on the apparatus described herein until one or more components thereof fails due to natural wear and tear. Alternatively, one or more components can be seeded with a fault that is configured to simulate damage selected from the group consisting of: impact, such as from a foreign object; corrosion; erosion; nicks; defects; and cracks. It is consistent with the apparatus an methodology herein that still other types of damage (though not explicitly mentioned) could also be simulated.

The tests that can be performed with the apparatus described herein include, but are not limited to: tests of seeded faults of rotor materials; tests of diagnostic sensors; tests of design parameters of new jet engine components; and tests that monitor effects of crack growth and fatigue on component life.

Most tests exemplified herein are carried out using one of two paradigms: a cyclic test, or a constant speed test. In a cyclic test, the engine is cycled between a maximum and a minimum speed, whereas in a constant speed test, the engine is ramped up to a certain target speed and run at that one speed. Another important cyclic test is the variable mission test in which the minimum and maximum speed of the engine is varied randomly or according to a predefined mission to simulate the operation of a specific full size engine. During a complex mission test the engine can dwell at the maximum, minimum or any intermediate speed. For example, crack growth (as further described herein) can be tested for using both cyclic and constant approaches. On the other hand, creep (as also further described herein), is typically tested at constant speed. Under either paradigm, it is typical to run the miniature engine for a fixed time period, such as an hour, then stop the engine, remove the test component, examine it for damage (e.g., using an optical microscope) and make any appropriate measurements before inserting it back in the engine and running for another cycle.

It is consistent with the test methods described herein that a structural analysis, e.g., a finite element analysis (FEM), on the component can be carried out before the component is introduced into the jet engine. Such an analysis permits an engineer to understand what is an appropriate time period to run the engine for, and at what speeds, and how frequently to test. For example, one component may need to be run for 1 hour intervals only, whereas another can be run for a month, with a single interruption and examination each day. Such analytical methods are familiar to and within the capability of one of ordinary skill in the art.

It would also be understood, and is further described herein, that different types of test may employ different types of test article. For example, a test article suitable for low cycle fatigue (LCF) testing is different from a test article used to monitor crack growth. A crack growth test article has a crack-like feature manufactured or seeded into the article to assure that the crack will begin to grow at the start of the test. By contrast, a LCF test article has no such crack engineered into it; instead the crack in this article must initiate naturally, a process that can take a considerable time. LCF encompasses both initiation and crack growth mechanisms. Ideally, test conditions are employed that permit study of a single failure mode, in isolation from other competing or contributory failure modes.

Seeded faults can be used to simulate damage in an engine component, such as a rotor or rotor blade. A large number of engines would have to be tested in normal usage to identify one engine with a damage state. However the damage can be seeded (purposely induced). Seeded fault tests are a way to determine the tolerance of a component design and/or material to damage. These tests are very valuable because they are used to determine if a component can be used after an event that causes damage. To perform a test of this type, damage is seeded in the component, and then the component is tested to determine if it fails, using a test stand that is capable of containing the energy of the failure, as described herein. The damage can be in the form of impact damage from foreign objects, corrosion from gas stream chemicals, erosion from gas stream solid particles, nicks from assembly, defects from manufacturing, or cracks from usage. Most of these damage states do not commonly occur naturally in every engine but when they do occur can be catastrophic so it is important to understand how resilient a material is likely to be.

Failures of high speed, high temperature, rotating parts are spectacular (similar to a controlled explosion). These tests are seldom performed in a spin pit or an engine test for a full-size engine because the damage to the test article in addition to the testing apparatus is usually immense such that one or both are irreparable. A controlled engine rotor burst on a full-size engine often requires a complete sacrifice of the test engine (at a cost of >$1,000,000). Because the cost of a model jet engine 12 is low (typically <$3,000), a seeded fault test of a rotating component becomes financially feasible.

Tests of diagnostic sensors are also envisaged. Modern gas turbines and other high temperature rotating systems require in-situ diagnostics to determine system health. Having accurate estimates of system health allow cost effective operations, for example by determining when maintenance actions are required. The sensors used for diagnostics of gas turbine should be able to withstand the extreme temperatures of the engine components and the harsh chemical environment of the exhaust gases. Because a miniature jet engine as described herein operates at the same temperature as, and offers the same exhaust gas chemical environment as, a full-size engine, the miniature engine is ideal for testing diagnostic sensors. Also, a simple construction of an apparatus for operating the miniature engine, such as providing a direct line of site to the turbine rotor, allows sensors to be easily installed and monitored. In full-size turbine engines, installation of a sensor often requires that holes be drilled in the turbine housing, thereby undesirably compromising the structural integrity of the housing. Such considerations are unimportant for a miniature engine.

Creep damage can be induced in a component and monitored using the apparatus described herein. The miniature engine can be run to collect data on the creep deformation mechanism by operating the engine at extreme conditions of temperature and speed. Due to the ease of disassembly, the miniature engine can be disassembled for inspection during periodic interruptions in the testing, allowing measurements to be taken of the component of interest, as well as to periodically monitor the health of other engine components.

Tests of other failure modes can also be carried out with the apparatus and methods as described herein. Typically, different test regimes are used to excite each of the important failure modes, e.g., low cycle fatigue (LCF) can be tested by cycling the engine speed whereas creep is tested with long dwells at high speed and temperature. The simplicity of a typical miniature engine design allows for targeted failure mode testing. However, failure mode interaction (occurrence of more than one failure mode in the same article during the same test) cannot always be avoided. Taking advantage of this, complex failure modes such as dwell fatigue (creep/LCF interaction) may also be tested.

A commonly used fatigue life prediction methodology consistent with the methods herein is as follows. Fatigue studies have shown that the life of a structural component can be related to the crack growth rate. Crack growth occurs in several phases, including crack initiation, short crack growth, and long crack growth. During long crack growth phase (stage II), fatigue cracks may grow from a barely perceivable size (a few microns) to some critical length (few inches). Fatigue life prediction can be based on the Paris relationship between the stress intensity factor range ΔK (developed using fracture mechanics) and fatigue crack growth.

Thus many fatigue life prediction software available in the art estimates the ΔK value to find out the fatigue crack growth rate. The general methodology is as follows: using finite element analysis, the geometric model of the structural component is created and analyzed for stress. The high stress regions in the model are then identified. Details regarding geometry model and high stress values are then stored in a file that is readable by the conventional fatigue life prediction software (for example, AFGROW, FASTRAN (available from CFD Research Corporation), but most commonly proprietary software in spreadsheet programs such as MS-Excel). The software may have a pre-defined library of simple crack shapes that can act as crack-initiators automatically. The user can select one of these shapes and then position it at the desired location, on the surface or within the body of the geometric model. The initial crack can be positioned along the maximum tensile stress direction of the structure. The initial crack or flaw is then grown in a series of crack propagation steps sized by the user. The crack front direction and propagation is based upon local stress intensity factor (ΔK) calculations, given as:

$$\Delta K = \beta \Delta \sigma \sqrt{\pi a}$$

Where, $\beta$=Boundary correction factor; $\Delta\sigma$=Maximum stress−Minimum stress; a=crack length measured as a straight line from start point to endpoint. The fatigue life is then predicted based upon Paris law and the ΔK values, $$\frac{da}{dN} = C \Delta K^m$$

Where, ΔK=Stress intensity factor; C, m=Paris law constant and exponent, depends on the material; and N=Number of load cycles.

The Paris analysis is carried out to determine an appropriate test conditions, such as speed, temperature, to run the engine in order to measure fatigue crack growth in a particular material.

In a similar manner, erosion, creep, etc., as further described herein can be described by mathematical models known to those of ordinary skill in the art. See, e.g., *Shigley's Mechanical Engineering Design*, (McGraw Hill Science, 2006), the relevant portions of which are incorporated herein by reference.

Thermal tests may also be carried out using the apparatus described herein. Turbine engines sometime have poorly controlled events in which the hot turbine sections experience higher than normal temperatures. There is always uncertainty as to the residual strength of "over-temperature" components, i.e., components that experience—albeit temporary—temperatures in excess of their operating guidelines, because even one-off occurrences of excess temperatures can lead to permanent weakening of the materials. Tests to simulate over-temperatures and determine the residual strength of such components are expensive in full-size turbine engines because they have multiple stages in a turbine hot section. Isolating the over-temperature region to one stage is difficult, and in general all stages will experience the over-temp to some degree. A miniature turbine engine can be controlled to operate at the over-temp conditions equal to those experienced by the full-size engine. Also, a miniature engine can be configured such that there is only one stage (such as a single rotor and stator) in the hot turbine section and this stage (and thus damage to this stage) is visible during operation, whereas a full-size turbine engine (which has multiple stages) would require disassembly to view any damage. A full size engine does not necessarily have a different layout or design from a miniature engine as used herein, but multiple stages are generally needed in a full-size engine to extract all of the power from the gas stream. A miniature engine can typically provide the necessary load with only a single stage and thus at least in this respect will not have an identical layout to the full-size engine from which such a component derives.

Thermo-mechanical fatigue (TMF) tests may also be carried out using the apparatus described herein. TMF is a leading failure mode for the hot section components of modern gas turbine engines. Traditional component testing is unable to recreate the complex thermal gradients needed to induce thermo-mechanical fatigue during critical component tests. Additionally, the costs of traditional component testing, which offer results that are of marginal value at best, are prohibitively high. A miniature engine is capable of performing many of the functions of a full sized engine and may simulate the extreme environmental conditions at a fraction of the cost and effort. TMF testing may be induced by incorporating a combination of long dwell times as well as short, rapid throttle transients.

The apparatus and methods described herein may also be used to evaluate crack growth in a multi-axial stress field, such as a biaxial or a triaxial stress field. Biaxial and triaxial crack growth data has been historically very difficult to obtain and has not been accurately predicted with conventional crack growth methods. Virtually all aerospace design life predictions systems are based solely on unidirectional specimen tests where the behavior of biaxial stress fields is not evaluated, thereby causing conventional fatigue crack growth models to predict life to be significantly higher than the actual life of the engine component. In addition, the transient thermal and thermo-mechanical influences are not duplicated in these tests, whereas, these influences are naturally and cost effectively reproduced in testing of a model engine as further described herein. The model engine allows for efficient collection of intermittent data. With multiple growing cracks on one test component, each test can provide the probabilistic behavior of the failure mode (which includes the failure mechanism and the type of component it acts on) of interest. For example, creep of a blade, or LCF of a wheel can be modeled probabilistically by the methods and apparatus herein.

Repair testing can also be carried out with the apparatus and methods described herein. Modern gas turbine designs are currently incorporating more unitized structures such as integrally bladed rotors (IBR's) with the airfoils. Failure of a component such as a wheel can also therefore be modeled by the methods and apparatus herein. The term wheel can mean rotor or rotor and blade assembly. An IBR can therefore be a wheel and blades in one part. These structures are expensive to produce but require much less assembly (and disassembly) time. In non-unitized structures (made up of many parts) if damage occurred to one part, that part alone would be replaced. However, in unitized structures it becomes too expensive to replace the entire structures, and repair must be contemplated. Validating the effectiveness of the repair method becomes difficult. If repair of the damaged component were structurally "good as new" (sometimes referred to as "complete") (then the component would be returned to its original state, and testing of its structural integrity would not be needed. Testing is therefore needed to determine if such a repair is "good as new". If the repair does not make the component good as new, then the test is performed on a structurally compromised component. This is equivalent in principle to a seeded fault test, as further described herein, and many considerations that apply to seeded fault tests also apply to repair tests.

Exhaust byproducts tests can also be carried out using the apparatus described herein. Environmentally harmful byproducts of the gas turbine combustion process are always of concern. Because a model engine can burn the same fuel and fuel additives as a full-size engine and because the model engine can operate at the same temperatures as a full-size engine, test of the exhaust products can be performed.

Effects of erosion can also be tested by methods and apparatus described herein. During prolonged operation of most turbine engines at high speed and temperature, the blades erode. The erosion is due to impact from solid particles that are natural byproducts of the combustion process (such as soot particles) along with very small foreign particles that are ingested into the engine during operation. Erosion is particularly bad in dusty environments such as deserts. Erosion changes the shape of the blade which causes a decline in the aerodynamic efficiency of the engine.

EXAMPLES

Example 1.1

JetCat P70

This engine (available from JetCat USA LLC, Van Nuys, Calif.) offers the following attributes: 123,000 RPM; 3.7" diameter turbine rotor; integrally axial flow; bladed, INCO-713 material rotor; 1300° F. exhaust temperature; 1700° F. combustion chamber temperature; bore cooled (cooling air is forced onto the rotor to keep the bearings cool); and is used in a UAV (Unmanned Aerial Vehicle) engine.

Example 1.2

JetCat P60

This engine offers the following attributes: 165,000 RPM; 3.25" diameter turbine rotor; integrally axial flow, bladed, INCO-713 material rotor, 1300° F. exhaust temperature; 1700° F. combustion chamber temperature; bore cooled.

Example 1.3

JetCat P200

This engine offers the following attributes: 112,000 RPM; 5.12" diameter turbine rotor; integrally axial flow, bladed, INCO-713 material rotor, 1300° F. exhaust temperature; 1700° F. combustion chamber temperature; bore cooled.

Example 2

Comparison of Testing Methods

Table 1 compares various test methods that have been used in the art and the apparatus that have been used to carry them out. As further described herein, a coupon test uses a small quantity of test material though usually not in the same geometry as a test component. A spin test utilizes, e.g., a rotor in a spin-pit. An engine test is a test performed on a full-size engine. The last column indicates that all tests in the table are performable straightforwardly with a miniature engine and the apparatus as described herein. The Rratio (in the 'Coupon' column), as is understood in the art, is also known as the "load ratio" and is the ratio of minimum stress to maximum stress under cyclical loading conditions where the stress ranges from −x to x, and averages to zero over time.

TABLE 1

| Feature | Coupon | Spin | Engine | Miniature-Engine/apparatus |
|---|---|---|---|---|
| Operating Conditions | | | | |
| Thermal Gradients | Very Difficult | No | Yes | Yes |
| Complex Geometry | Possible but Difficult | Yes | Yes | Yes |
| Complex Mission | Yes | Yes | Yes | Yes |
| Realistic Environmental Conditions | Very Difficult | No | Yes | Yes |
| Failure Mechanisms | | | | |
| Creep | Yes, Isothermal | Yes, Isothermal | Yes | Yes |
| Low Cycle Fatigue | Yes, Isothermal | Yes, Isothermal | Yes | Yes |
| High Cycle Fatigue | Yes, limited Rratio = −1 | Yes, Difficult | Yes | Yes |
| Thermomechanical Fatigue | Very Difficult | No | Yes | Yes |
| Fracture Mechanics | Yes, Isothermal | Yes, Isothermal | Yes | Yes |
| Rotor Burst Prognosis | Yes, Isothermal | Yes, Isothermal | Yes | Yes |
| Instrumentation Access | Easy | Difficult - Vacuum | Difficult | Easy |
| Realistic Environmental Conditions | No | No | Yes | Yes |
| Teardown Turn Time | Minutes | Hours | Days-Weeks | Minutes |
| Facility/Test Stand Cost | $20,000-$150,000 | $500,000-$1,500,000 | >>$1,000,000 | $10,000-$50,000 |
| Test Costs | | | | |
| Simple (less than 25 hrs and non-destructive) | $1,000-$2,000 | $10,000-$75,000 | >$1,000,000 | $2,000-$5,000 |
| Complex (50,000 cycles and test to Failure) | $2,000-$5,000 | $75,000-$300,000 | >>$1,000,000 | $5,000-$20,000 |

Example 3

Exemplary Apparatus

Figure 6A:
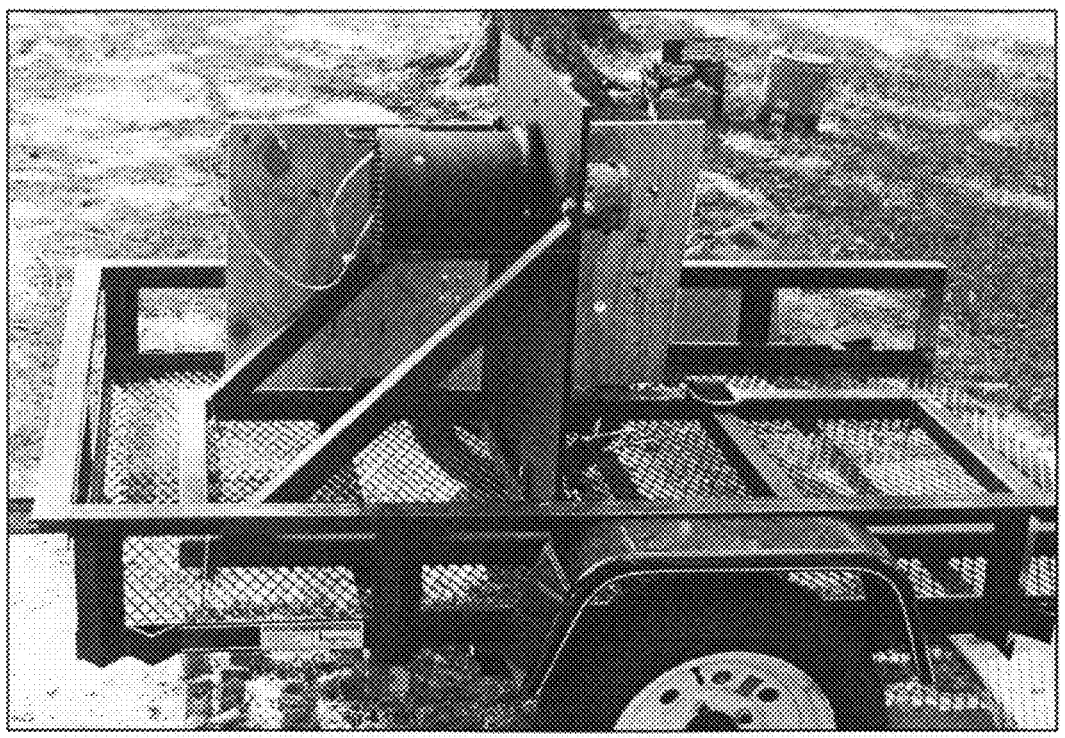
Figure 6B:
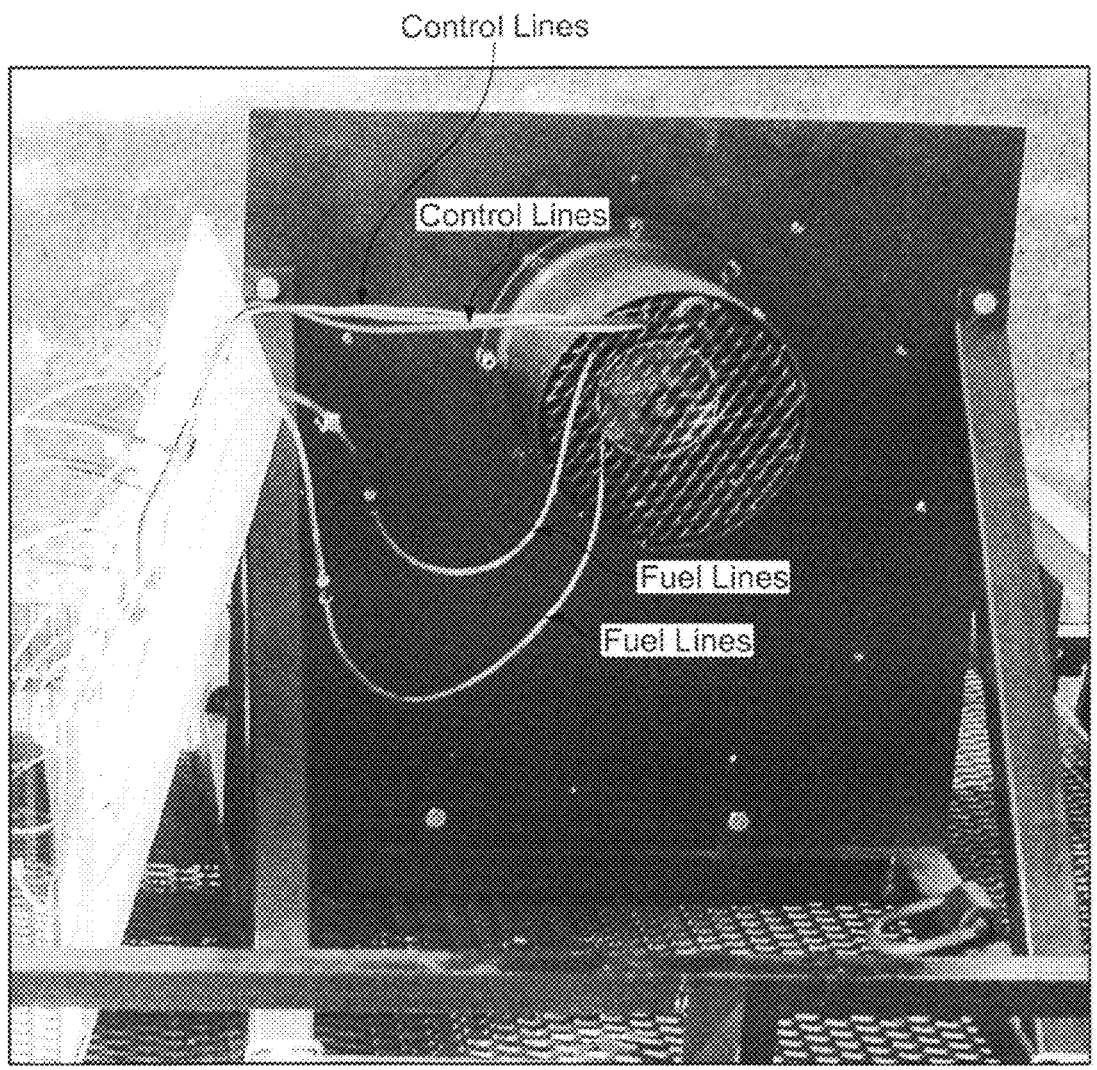

FIGS. 6A and 6B show side and rear views of an exemplary apparatus for testing a jet engine such as a miniature jet engine. The exemplary apparatus is mounted on a two-wheel trailer for ease of transport from one test location to another. Visible in FIG. 6B are fuel lines and control lines that go through a grill to respectively, the engine and an engine control unit (not shown).

The containment shroud is made from a butt end flange of a 8" diameter metal steel pipe steel that is made of ⅜" thick steel. The mount is made of ¼" steel plate. The exhaust chamber is formed from a standard 55 gallon metal drum having a 24" diameter.

The apparatus of this example can be used for the tests described in all subsequent examples, subject to any specific adaptations and modifications further described therein.

Example 4

Creep Testing

Creep is the phenomenon of the increase in the length of a component caused by loading at high temperature. The miniature engine and apparatus described herein is used to test the creep characteristics of rotor blade materials. Creep in rotor blades is caused by the loads and temperatures on the blades. The loads are caused by the centrifugal spin of the rotor and the thermal gradients in the blade. The temperature is caused by the exhaust gases that spin the rotor. To test for creep, the engine is operated at constant high speed and constant high temperature for a long duration of time. The time can be obtained within one test but is usually accumulated over many test sessions. At different times during the test or test sessions, the engine is stopped, the rotor is removed and the length of the blades is measured. Each measurement is recorded and the creep is described by the stress, temperature, duration of test (e.g., measured in hours), and length.

Scaled-Turbine Engine Creep Testing

A scaled turbine engine was used to collect creep deformation data. Creep damage was induced by operating the engine at extreme conditions of temperature and speed. Creep-strain data was collected at the test conditions suggested by a finite element stress analysis by interrupted testing of the scaled-turbine engine. The testing was interrupted to measure the induced creep in the rotor blades, as well as to periodically monitor the health of other engine components. The testing involved running the scaled-turbine engine fifty hours in steps of five-hour intervals. The engine was disassembled every five hours for inspection.

The P60 model JetCat engine is used for the creep testing. The engine has a maximum operating speed of 165,000 RPM. This speed causes high the stress in the blades and thus creep deformation.

Figure 7:
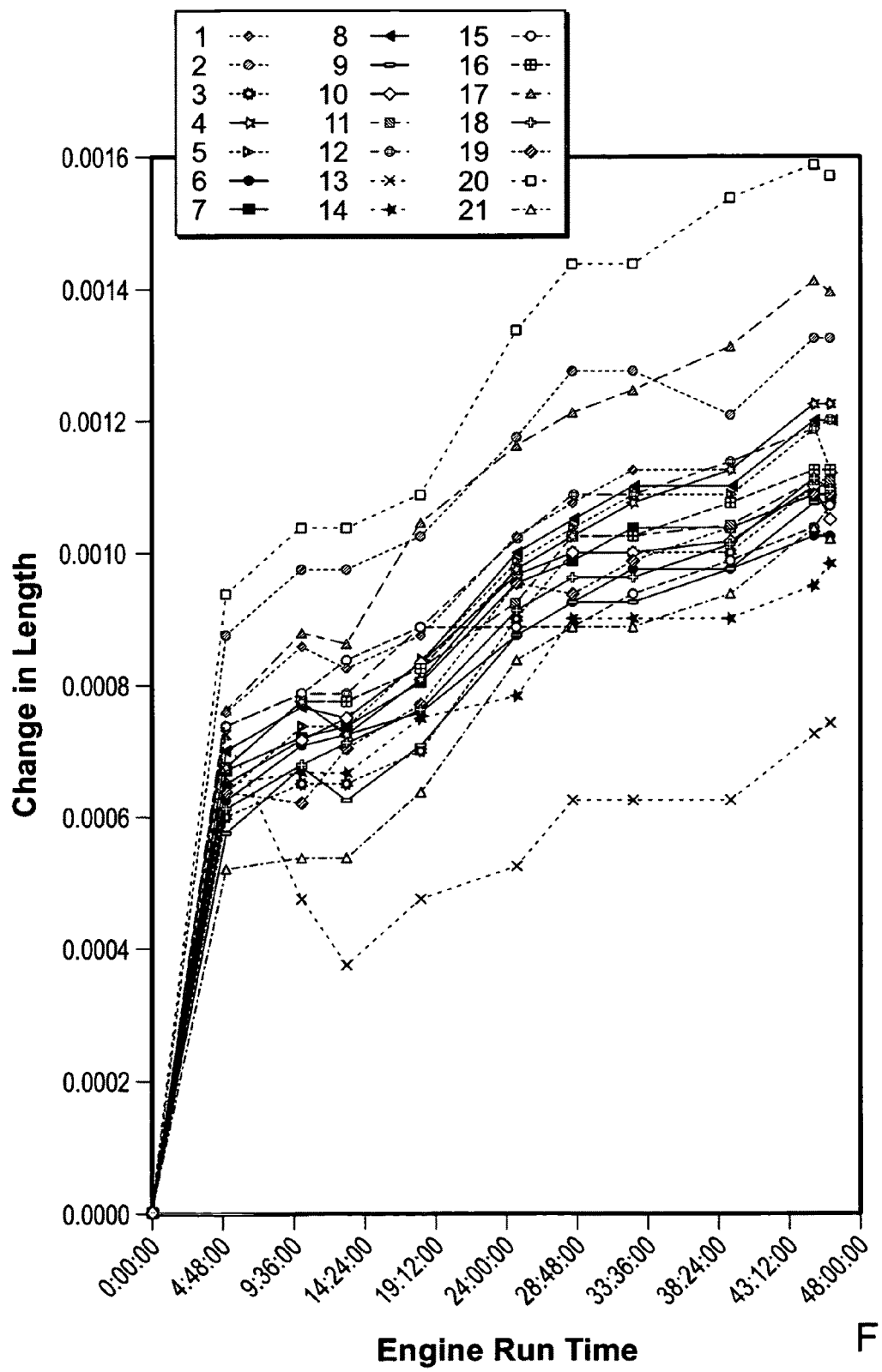
FIG. 7 shows an example of creep testing data for one engine, P60 rotor S/N 358, showing changes in length over time.
Figure 12:
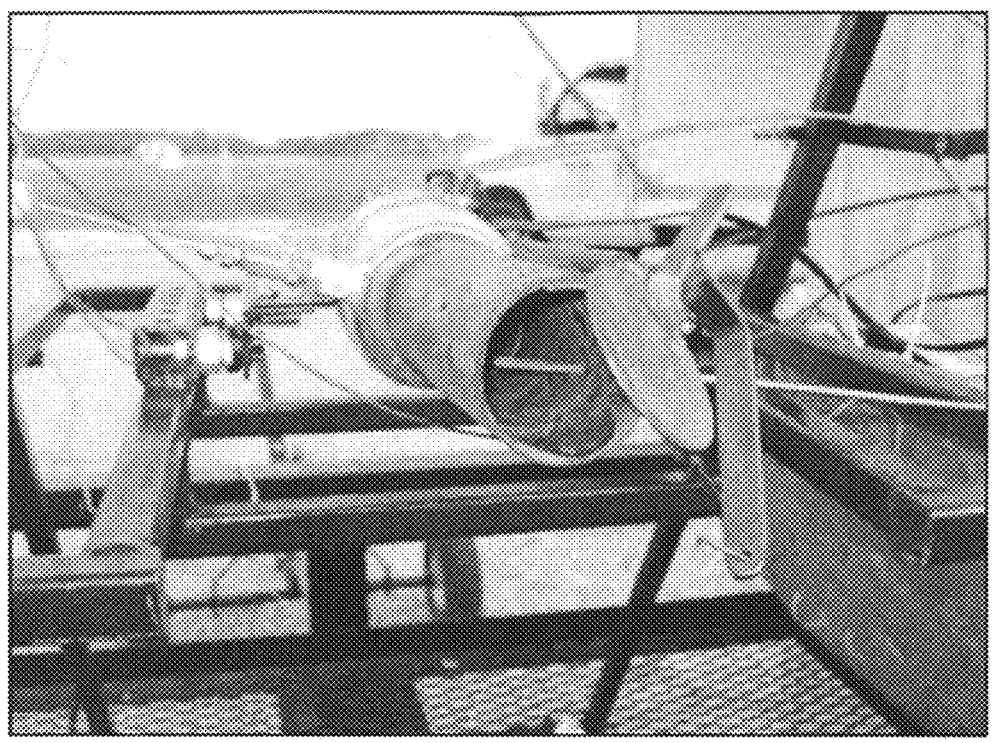
FIG. 12: Back-pressure device fully open.
Figure 13:
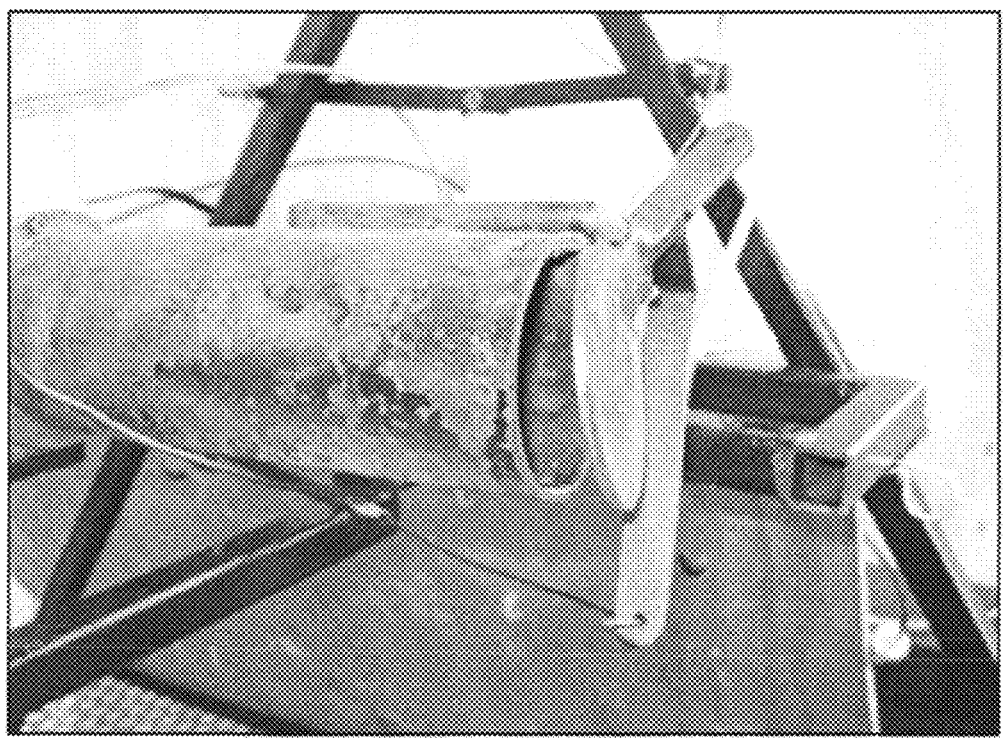
FIG. 13: Back-pressure device closed.

FIG. 7 shows data from one of three miniature engines tested at extreme conditions of temperature (780° C.) and engine speed (160,000 rpm) to determine the creep deformation in a nickel IN-713 rotor. To control the temperature of the exhaust gases, a nozzle is used as shown in FIGS. 12 and 13. The exhaust temperature without the nozzle is 700° C. By closing the nozzle the temperature can be increased. In the case of the test performed the temperature was 780° C.

Figure 9C:
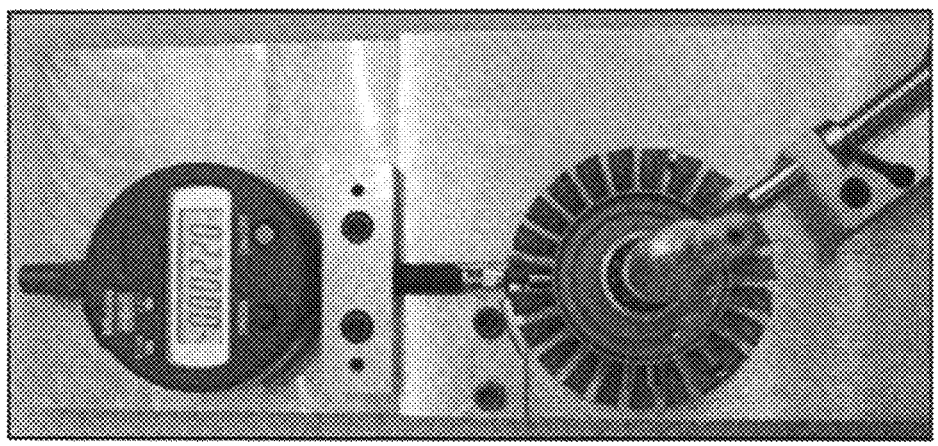
FIG. 9C: Measuring fixture with rotor shaft assembly.
Figure 9B:
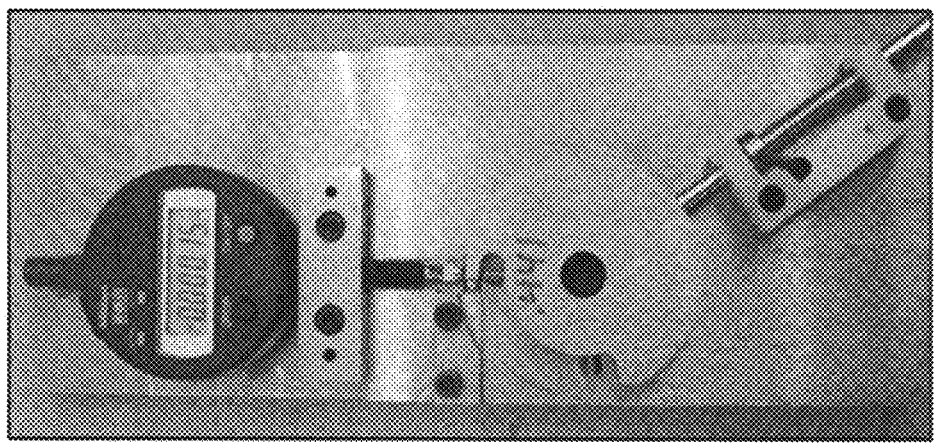
FIG. 9B: blade measuring fixture with setter master.
Figure 9A:
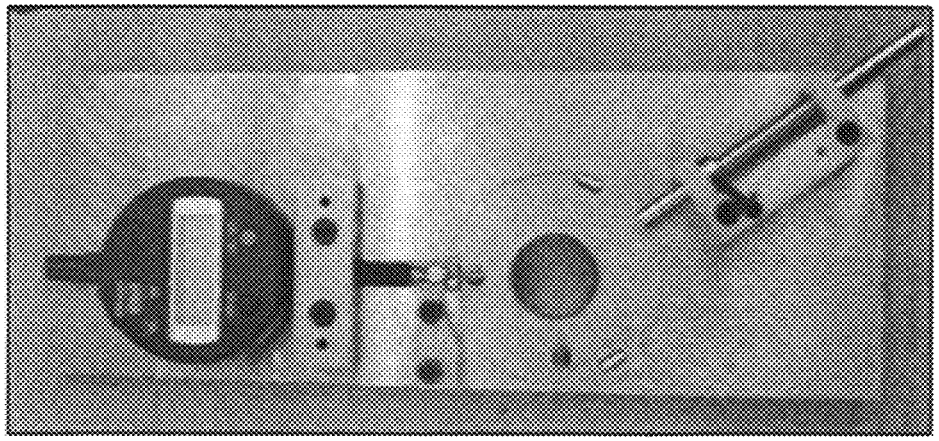
FIG. 9A: blade measuring fixture.

A custom gauge was developed to measure blade length. The device is shown in FIG. 9A. The rotor assembly sits in the circular cutout area. Using a clock-face convention, the features at 9:00 and 12:00, along with the plunger at 5:00

(marked as holding features in the figure), hold the rotor in place axially, but allow rotation of the rotor. With the plunger and spring, a constant pressure is maintained on the rotor. The features at 4:00 and 7:00 (marked as leveling features in the figure) merely support the rotor and hold it level. The feature just below and to the left of the dial indicator tip is a stop to prevent counter-clockwise rotation. This is more apparent in FIG. 9B, which shows the fixture with the setter master. With this piece in place, the dial indicator was zeroed. It was then removed, and replaced with the rotor/shaft assembly, as seen in FIG. 9C.

With this fixture, repeatable measurements within 0.0001 inches for all blades over five sets of measurements were obtained, thereby establishing confidence in the set-up to measure creep strains accurately. A sample of measurements repeatedly taken on all 23 blades of the P70 rotor is shown in Table 2 where the maximum error is 0.00025. This measurement technique continued to be refined until a repeatability of 0.0001 inches was achieved.

Figure 8:
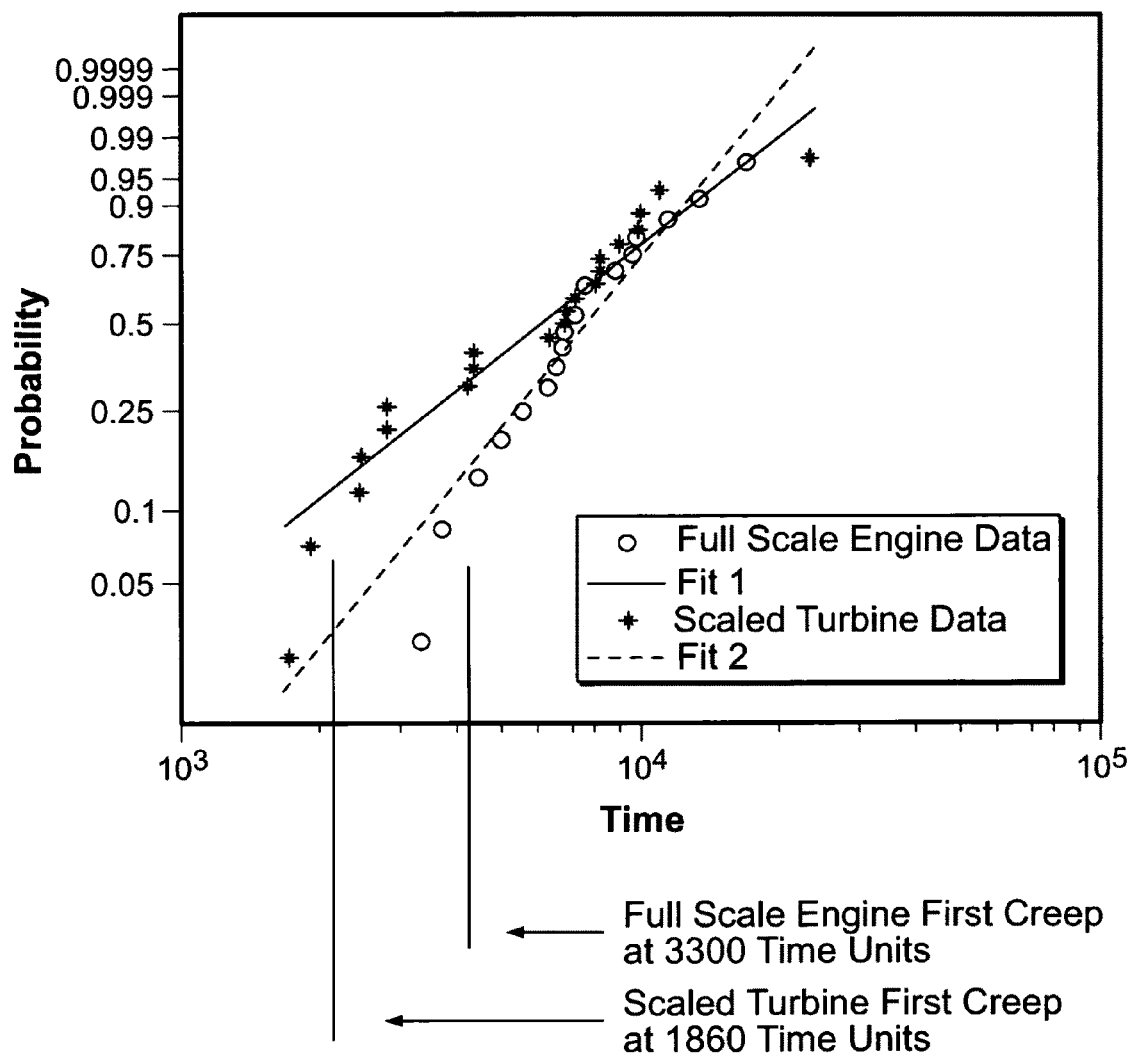
FIG. 8 shows the comparison of miniature gas turbine engine testing data to data from a full-size engine.

Each of the engines was operated with 21 blades to obtain 21 measurements of creep and to thereby allow for a probabilistic distribution of the creep deformation. The testing produced the Weibull statistical data shown in FIG. 8 (data shown in circles). For comparison, data from a full size engine is shown in crosses in FIG. 8. The Weibull slopes for the actual data and the data produced by the miniature testing are a close match. The methods herein predicted the first failure at 1860 time units, whereas the full size engine identified first failure at 3300 time units. Scaled turbine durability results demonstrate a high correlation (within a factor of two) to full scaled engine performance for high prediction accuracy at greatly reduced cost.

Figure 10:
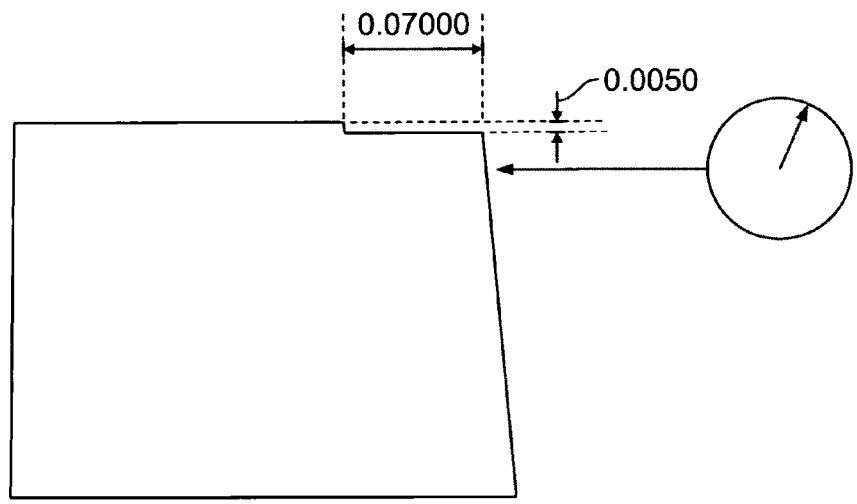
FIG. 10: Trailing edge machining.

During engine operation, there is always a possibility of blade tip rub that would interfere with reliable creep measurement. Therefore, machining was done on the turbine rotor to allow measurement of blade length to check for creep deformations in the airfoils. The top trailing edge of the blade was machined down 0.005" in the radial direction. This mitigates tip-rub issues and allows for easy measurement of the creep deformation. The surface under the rim was machined to a constant radius of 0.025" to allow for blade measurements, as shown schematically in FIG. 10.

Figure 11:
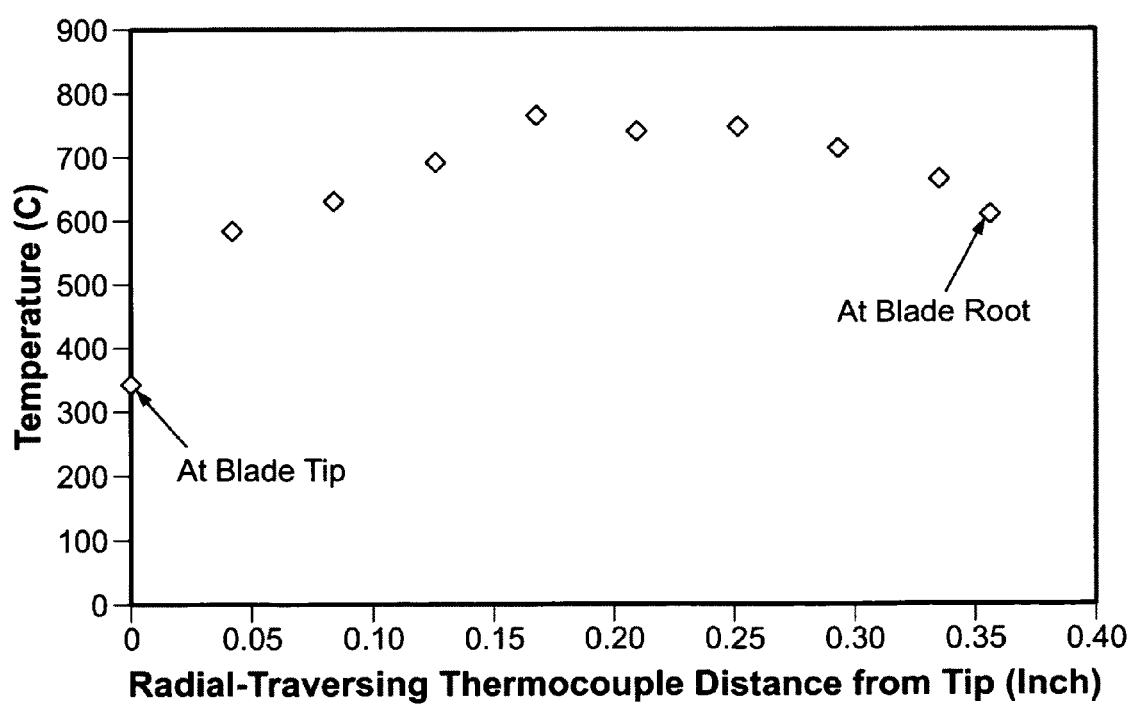
FIG. 11: Thermal gradient along the blade of a P60 engine rotor.

A probe thermal couple was used to measure the temperature profile for the P60 blade while operating at 165,000 RPM. The temperature profile for the P60 is shown FIG. 11.

TABLE 2

Blade Measurements

| Blade # | 1st Reading | 2nd Reading | 3rd Reading | Max Reading | Min Reading | Delta |
|---|---|---|---|---|---|---|
| Blade 1 | 0.0022 | 0.00225 | 0.00225 | 0.00225 | 0.0022 | 0.00005 |
| Blade 11 | 0.00165 | 0.00175 | 0.0015 | 0.00175 | 0.0015 | 0.00025 |
| Blade 14 | 0.00175 | 0.0017 | 0.0016 | 0.00175 | 0.0016 | 0.00015 |
| Blade 20 | 0.0008 | 0.0008 | 0.0008 | 0.0008 | 0.0008 | 0.00000 |
| Blade 22 | 0.0011 | 0.00115 | 0.0011 | 0.00115 | 0.0011 | 0.00005 |

A further increase in the temperature of the P60 was achieved by regulating air-flow. Early tests indicated that a variable restriction was required. A significant restriction is required to back-pressure the engine enough to get a sufficient temperature rise. However, since problems were encountered in starting the engine with very high restriction, the modified apparatus having a restrictor, as shown in FIG. 12, was designed and fabricated. The figure shows the restrictor in the fully-open position. The engine was started in the fully-open position, then accelerated to maximum speed. Once a steady-state max RPM was achieved, the valve was closed (as shown in FIG. 13) until the desired exhaust-gas temperature was reached.

Two thermocouples were installed, the transversing thermocouple and one located after the turbine, as seen in FIG. 13. The thermocouple after the turbine measures the exhaust-gas temperature, and its tip can be seen in the middle of the back-pressure device. The transversing thermocouple can be seen farther forward on the left-hand side of the engine. The standard exhaust-gas temperature thermocouple which is provided with the JetCat P60 engine is also in place. The nozzle was adjusted for an blade max temperature of 860° C.

Creep deformation was successfully induced using the scaled turbine engine. Two different turbine rotors (SN358 and SN722) were used to induce creep failures. The two rotors had different geometries. Stress analysis of the two rotors showed that SN722 had lower stress compared to SN358. The rotors and their run time are shown in Table 3.

TABLE 3

Summary of test times on the 3 scaled engines

| Rotor | Total Run Time HH:MM:SS |
|---|---|
| SN358 | 46:01:00 |
| SN722 | 45:33:56 |

Measurements were taken every five hours of engine operation. FIG. 7 provides an example of the change in blade length over time showing the results of test measurements for rotor SN358.

Figure 14:
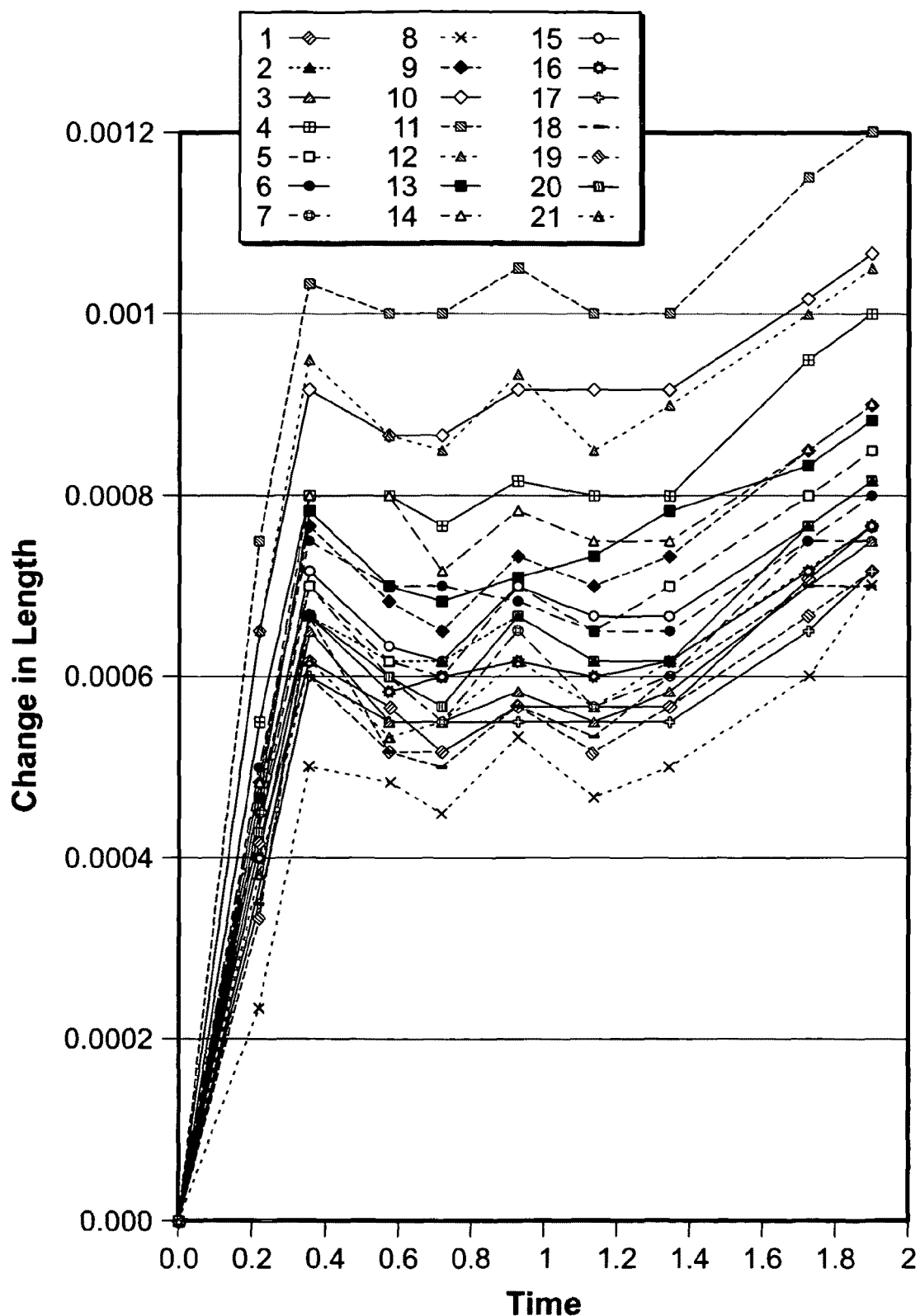
FIG. 14: shows an example of creep testing data for one engine, P60 rotor S/N 722, showing changes in length over time.

FIG. 14 provides an example of the change in blade length over time showing the results of test measurements for rotor 722, which had a different design, having lower stresses, and less creep.

Test Results and Comparisons with Full Scale Engine Data

Figure 15:
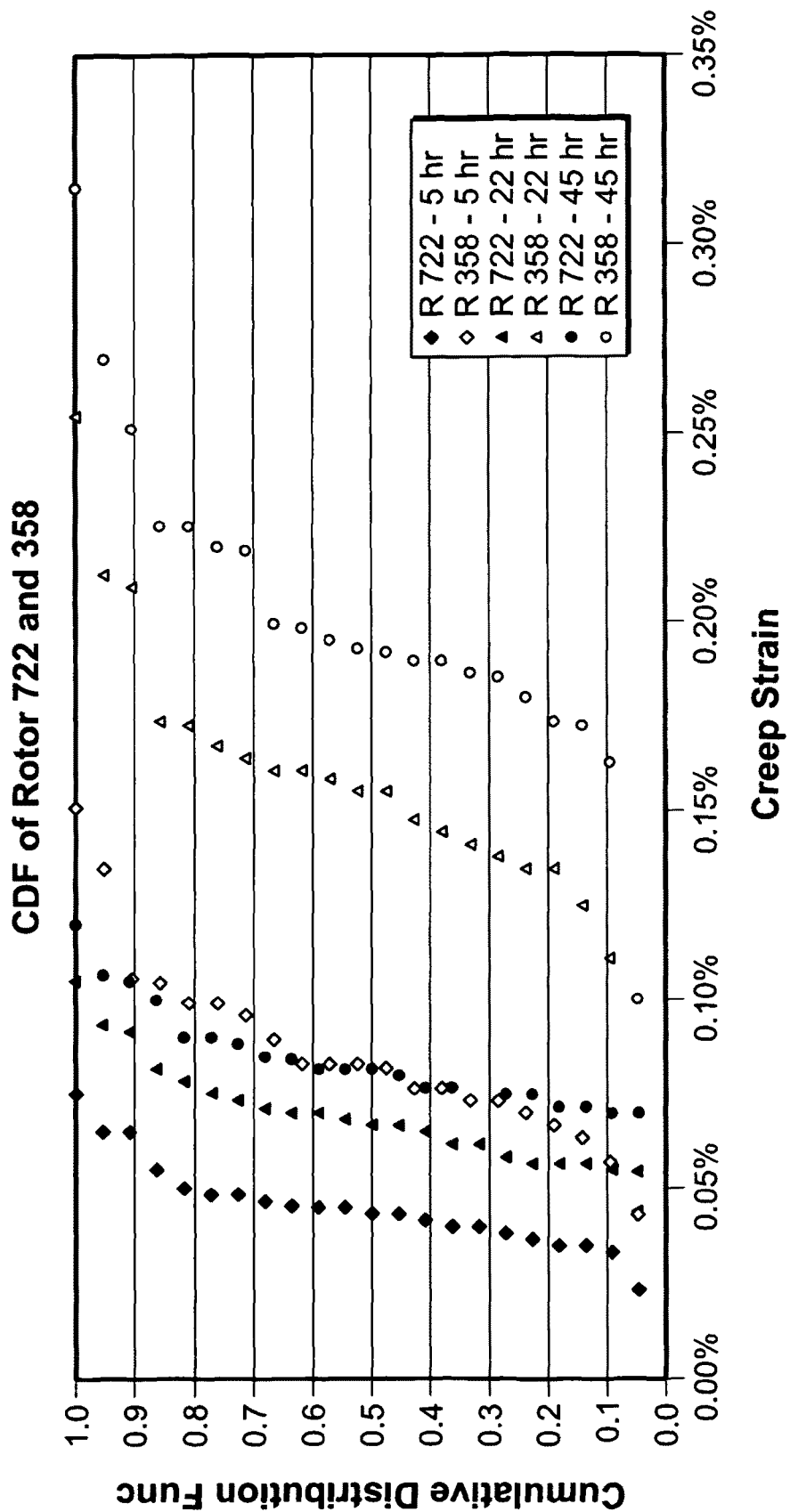
FIG. 15: Cumulative Distribution Functions of Engines 722 and 358 show the progression of creep as performance time in the test mission environment increases.

The statistical cumulative distribution function (CDF) of the measured creep strain for three different times is shown in FIG. 15. In the figure, it can be seen that the engines experienced different levels of creep strain, but the slopes of the curves for equivalent times are similar.

Figure 16:
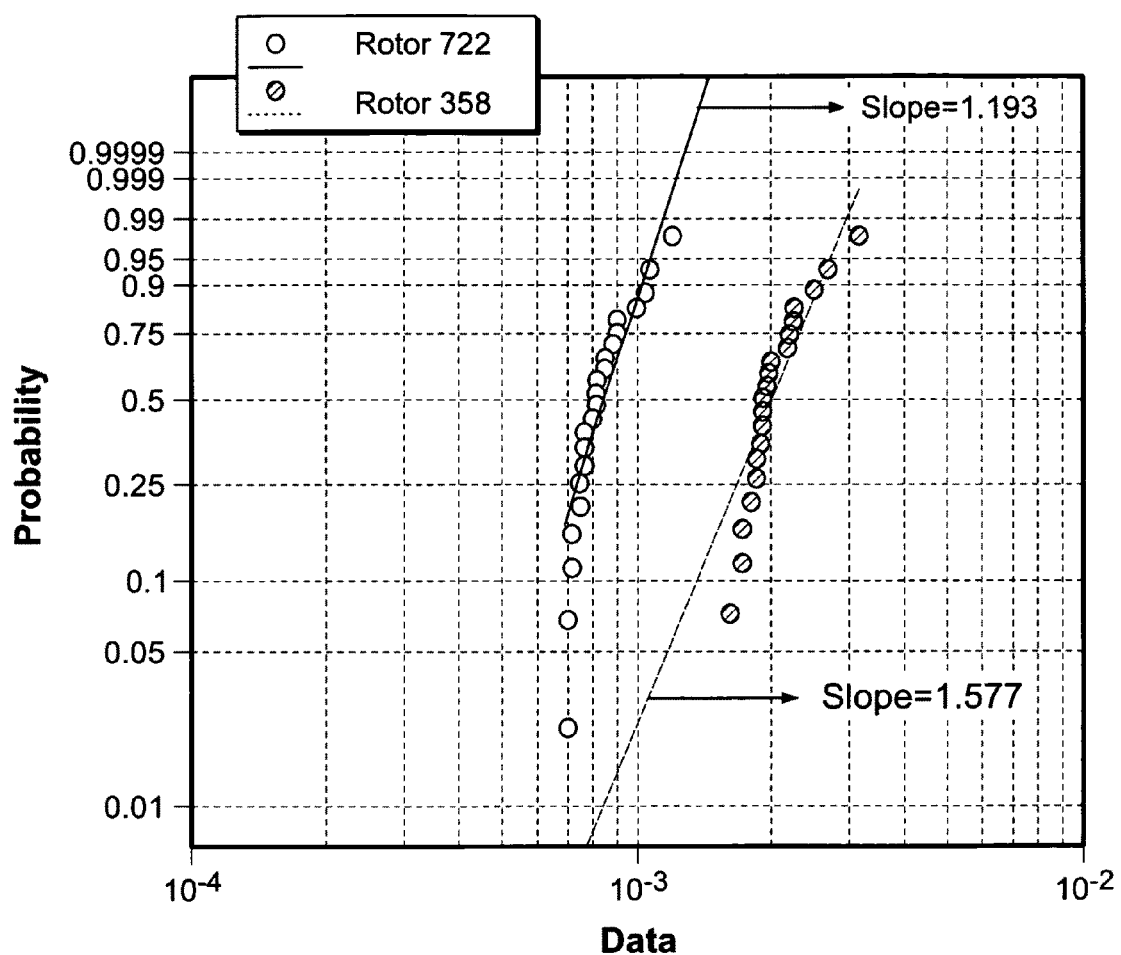
FIG. 16: The Weibull plot comparisons for creep strain in 21 blades on rotors 358 and 722 at 45 hours.

The creep data after 45 hours of run time from two of the scaled engines rotors, numbers 722 and 358, are plotted in Weibull space in FIG. 16. The two rotors experienced different levels of creep over the 45 hour time interval, but the slope of the two Weibull plots is similar, which signifies that the physical mechanism governing the creep of the rotors is the same. The difference in characteristic value can be explained by differences in residual stress state or other manufacturing variability at the beginning of the testing.

Example 5

Crack Growth Testing

Testing identified several key factors not accounted for in current crack growth modeling. These include random crack branching and kinking, the variation in material resistance to crack growth, and the changing stress field due to the crack progression. A conventional fatigue crack growth analysis using linear elastic fracture mechanics predicted disk failure at 6,000 cycles, without taking into account multi-axial stresses such as biaxial stresses. Engine testing found this prediction to be an over-estimate by a factor of five because the actual engine failed after ~1180 cycles. These study findings clearly indicate the need for higher fidelity crack growth analytical methods.

Engine Testing to Rotor Failure

Engine testing to failure is critical for development of high fidelity prognosis models. However, it is rare that commercial equipment manufacturers perform such testing because it is impractical in regard to both time and materials, as each test article costs millions of dollars. The methods and apparatus herein, using a miniature turbine engine, provided realistic thermal and centrifugal environments as a new test bed for prognosis model development. The integrally bladed turbine rotor was tested to failure. The rotor was seeded with preflaws at eight locations in order to initiate cracks. The rotor failed at 1,180 cycles rather than 6,000 cycles as predicted by current modeling methods. Close examination of the failure crack confirmed the true random nature of the cracking with crack kinking and multiple branching caused by interaction of the crack tip with the surrounding microstructure. The conventional fatigue crack growth modeling assumes simple cracking with no interaction with the microstructure. Small scale turbine testing can be used to provide realistic engine conditions at a fraction of the cost of a full-scale engine test. The significance of this is that engine testing to failure is now practical.

Figure 19:
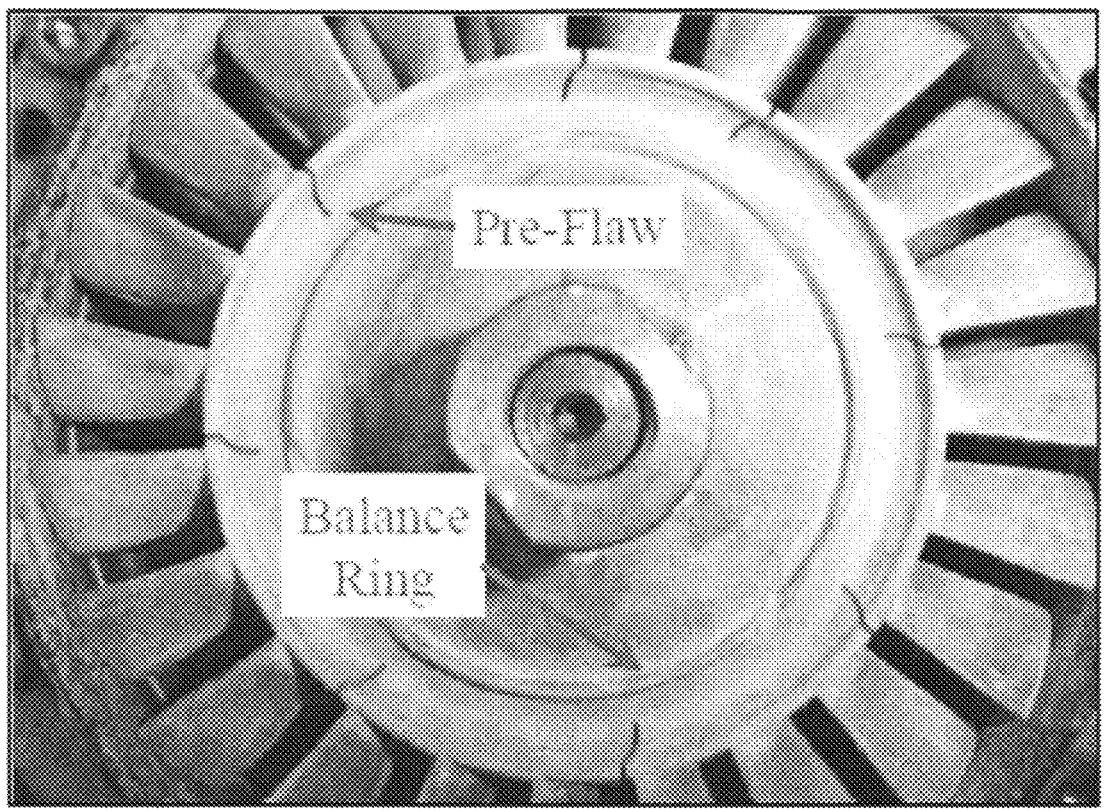
FIG. 19: turbine engine with 8 preflaws.

FIG. 19 shows the preflaws on the aft side of the rotor. Since there are 23 blades on the rotor, seven cuts are spaced three blades apart, but one pair is only two blades apart (at the top in the photo). After preflawing the rotor, the engine was re-assembled and mission testing began.

During testing, the engine was controlled by a laptop computer, which automatically cycled the engine between idle and maximum RPM's. By increasing the idle RPM tolerance, the cycle time was reduced to 10 seconds. This allowed completing 360 cycles per hour. Testing was stopped at 382, 683, 985 and 1135 cycles to photograph and measure the cracks emanating from the preflaws. Turnaround time was approximately two hours between stopping and restarting the test. During this time the turbine was removed from the stand, disassembled, measured, photographed, reassembled and remounted on the stand.

Figure 18:
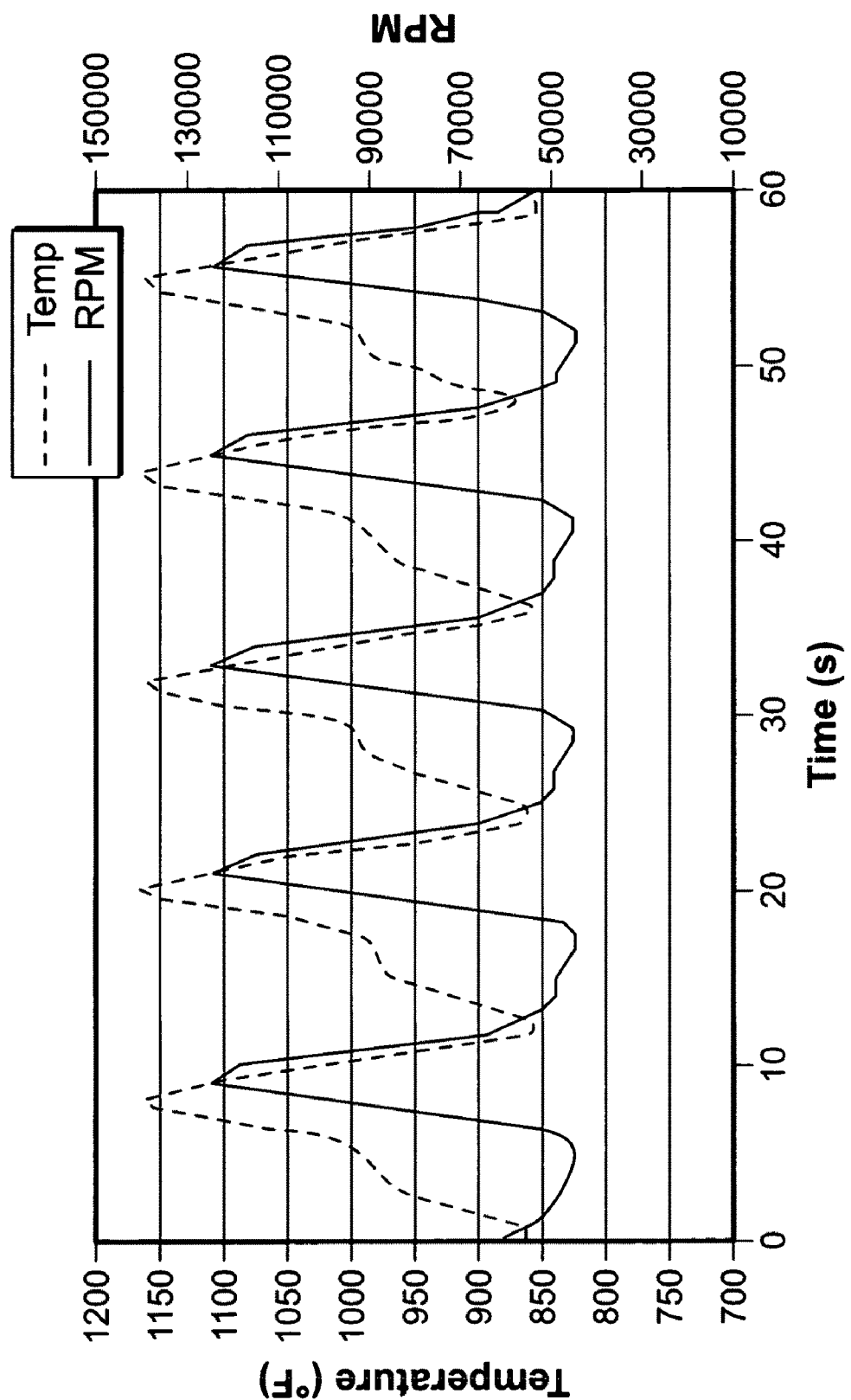
FIG. 18: measured engine speed and turbine exhaust temperature.
Figure 20:
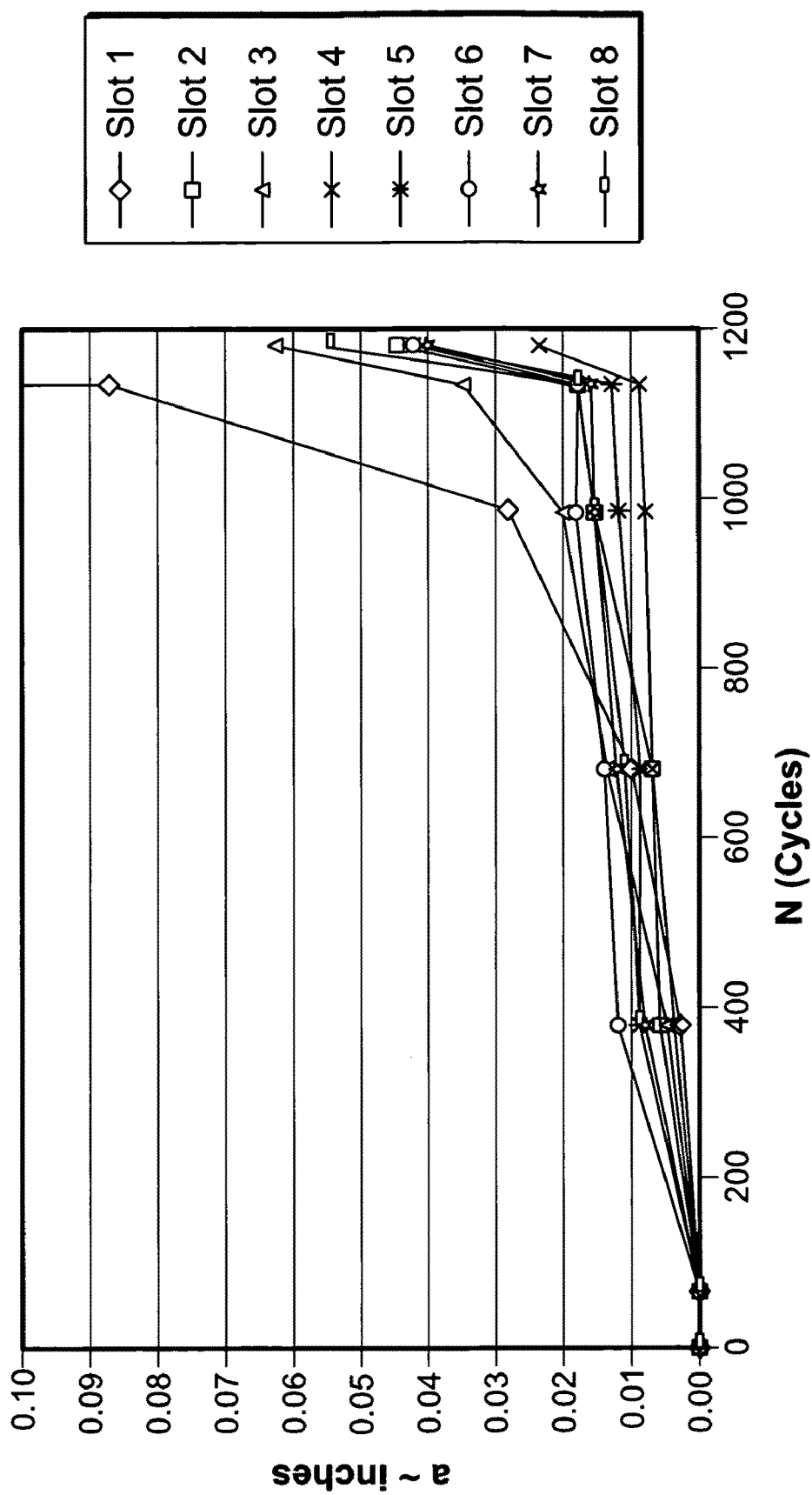
FIG. 20: the variation in crack growth from eight different preflaws.

Cracks initiated and grew at all 8 notches on the aft side of the rotor. The variation in crack growth at all eight preflaws is shown in FIG. 20. This variation is typical of crack growth but very difficult to gather data using traditional testing methods. Tabulated results are listed in Table 6. Later during the test, cracks were observed on the front side of the rotor. The rotor failed after 1180 cycles. FIG. 18 shows typical speeds and exhaust temperatures during cyclic testing.

TABLE 6

| | | Individual Run Cycle Count (Cumulative Cycles) | | | | | | |
|---|---|---|---|---|---|---|---|---|
| | | Run 1<br>8(8) | Run 2<br>63 (71) | Run 3<br>311 (382) | Run 4<br>301 (683) | Run 5<br>302 (985) | Run 6<br>150 (1135) | Run 7<br>45 (1180) |
| crack | Notch 1 | 0 | 0 | 3.00E−03 | 1.00E−02 | 4.20E−02 | 8.70E−02 | 2.90E−01 |
| length, | Notch 2 | 0 | 0 | 6.00E−03 | 7.00E−03 | 1.50E−02 | 1.80E−02 | 4.43E−02 |
| a (in) | Notch 3 | 0 | 0 | 5.00E−03 | 1.40E−02 | 2.00E−02 | 3.50E−02 | 6.30E−02 |
| | Notch 4 | 0 | 0 | 4.00E−03 | 7.00E−03 | 8.00E−03 | 9.00E−03 | 2.34E−02 |
| | Notch 5 | 0 | 0 | 9.00E−03 | 9.00E−03 | 1.20E−02 | 1.30E−02 | 4.21E−02 |
| | Notch 6 | 0 | 0 | 1.20E−02 | 1.40E−02 | 1.80E−02 | 1.80E−02 | 4.27E−02 |
| | Notch 7 | 0 | 0 | 8.00E−03 | 1.20E−02 | 1.50E−02 | 1.60E−02 | 3.98E−02 |
| | Notch 8 | 0 | 0 | 9.00E−03 | 1.10E−02 | 1.50E−02 | 1.80E−02 | 5.40E−02 |

Crack Growth Testing

Figure 17:
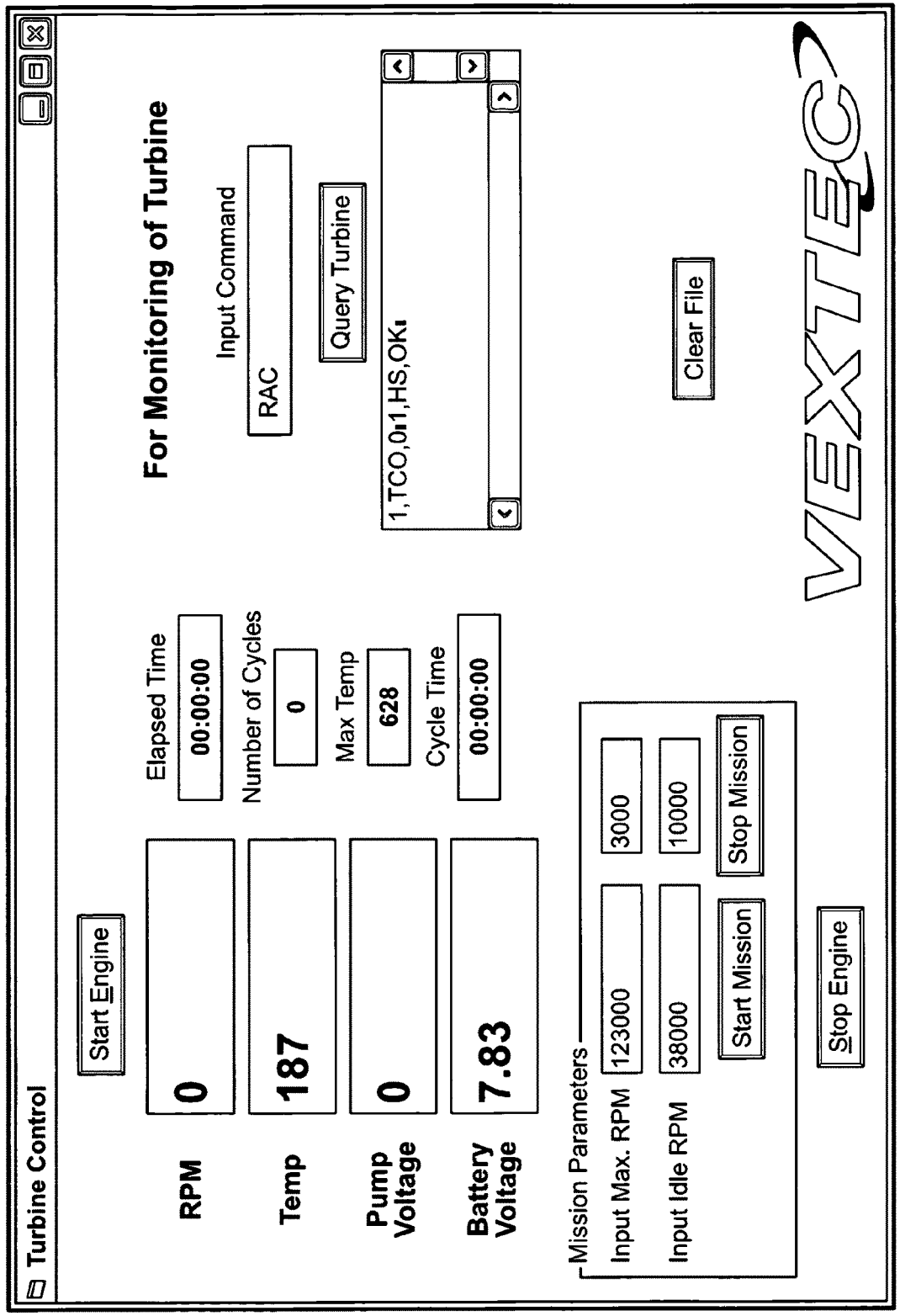
FIG. 17: Screenshot of user interface to exemplary Engine Control Software.

The cyclic testing was controlled by a laptop computer utilizing proprietary software. The laptop simulates a joystick that is normally used to control the engine throttle. An exemplary graphical user interface used in conjunction with the software can be seen in FIG. 17. The software allowed the user to monitor key items including RPM, exhaust temperature, fuel flow and battery voltage at all times. It automatically recorded these items for later analysis. Very little action was required by the operator. The "Start Engine" instruction/button used the built-in engine starting routine to heat the glow plug, motor the engine, inject the fuel, light the burner and run the engine to 50,000 RPM and then return to a stabilized idle. The "Start Mission" command/button initiated the software to automatically cycle the engine between two user-defined speeds.

The minimum speed was set to 38,000 RPM (engine idle) and the maximum speed was set to 123,000 RPM (engine maximum steady state). The engine used was the JetCat P70. There are also rods as further described herein on the back end of the aft pipe to contain engine pieces during a failure. Before starting the crack growth test, eight 0.014" wide slots were EDM'ed (electronic discharge machined, or 'cut') 0.100" deep into the turbine rotor. (Cuts were made with a 0.010 in. wire EDM but the actual width of resulting slot is 0.014 in.) This is often referred to as preflawing, or seeding a preflaw.

Figure 21A:
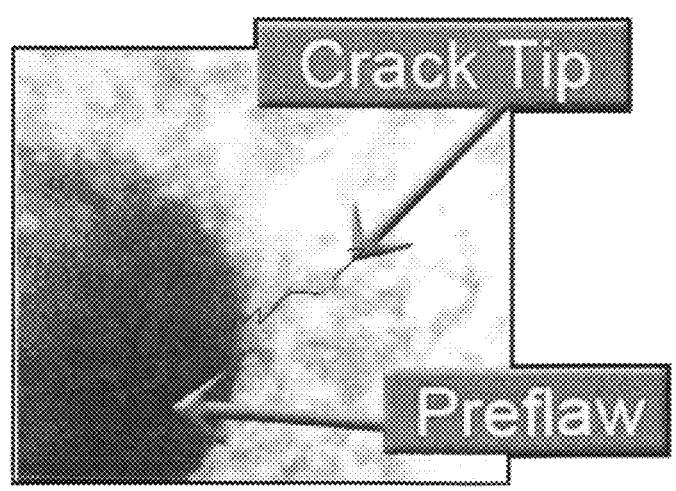
FIGS. 21A-D shows crack growth testing over time: 21A (Crack at 382 cycles), 21B (Crack at 683 cycles), 21C (Crack at 985 cycles), and 21D (Crack at 1135 cycles)
Figure 21B:
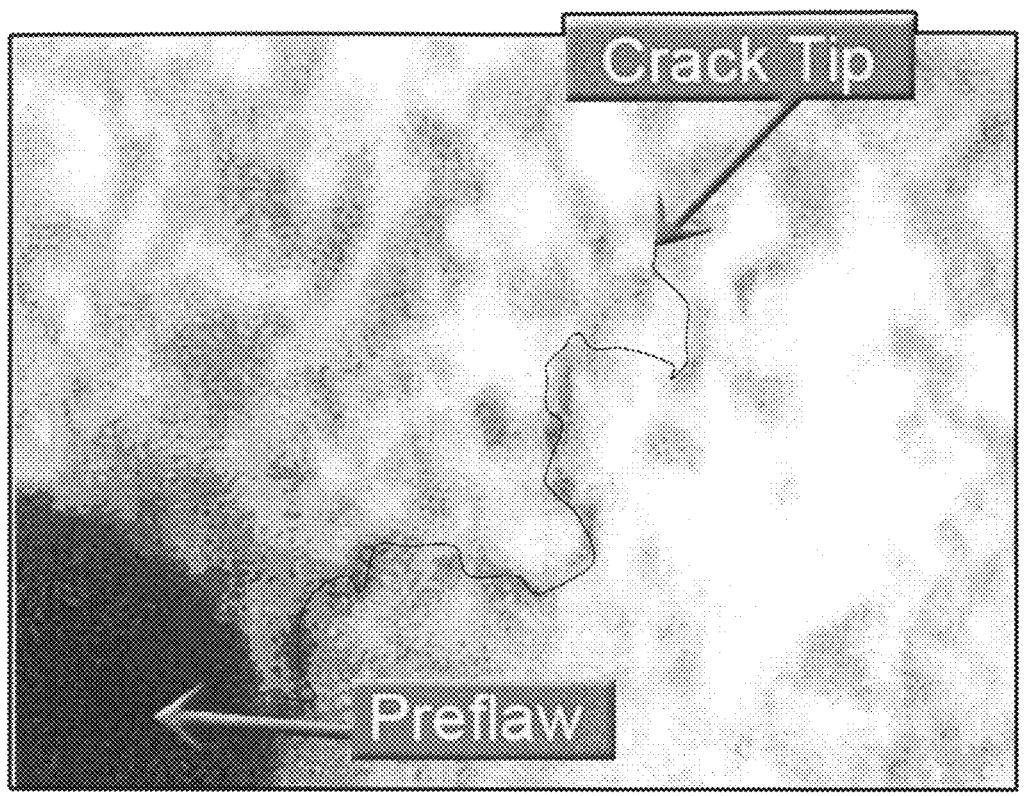
Figure 21C:
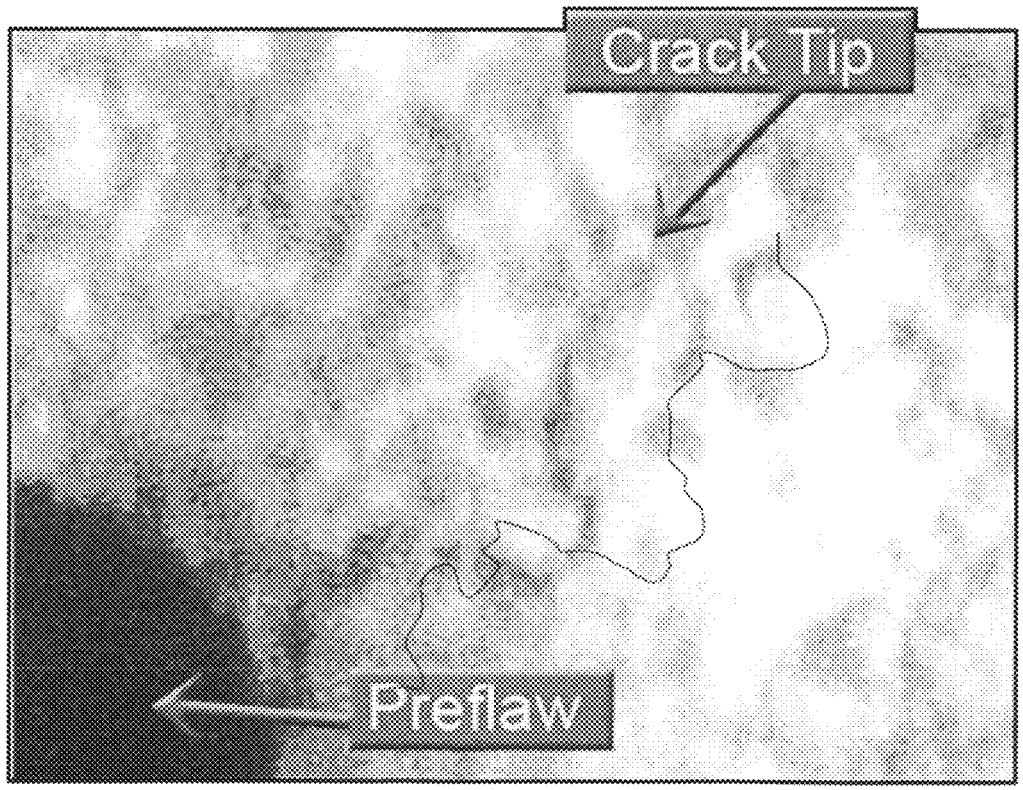
Figure 21D:
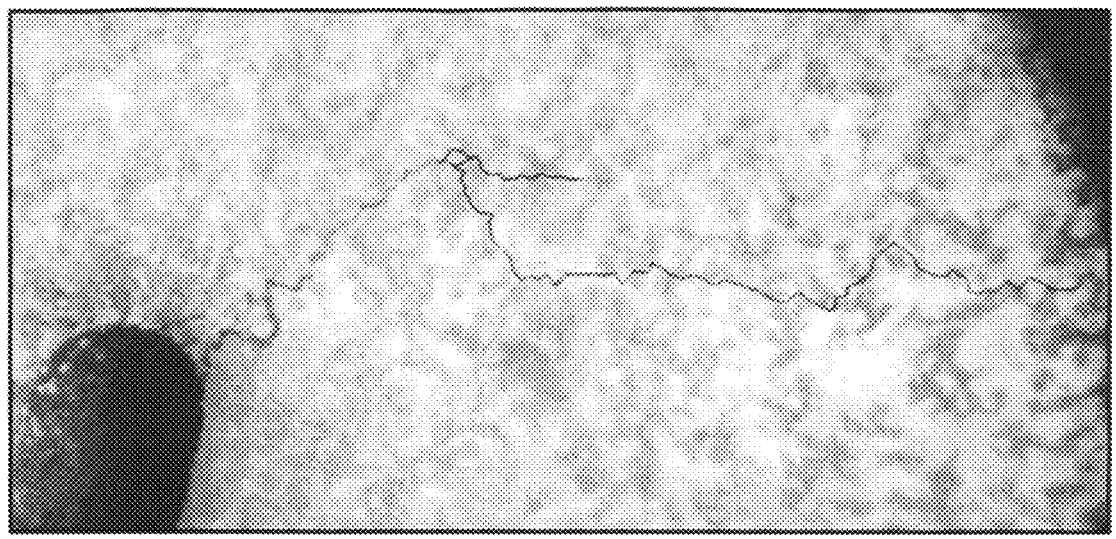
Figure 22:
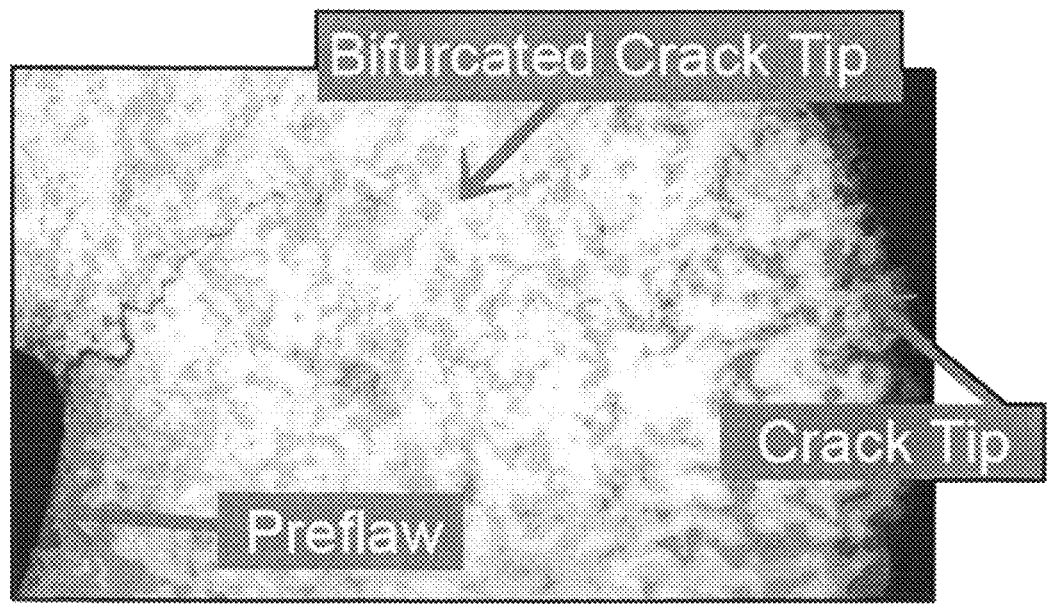
FIG. 22: Crack at 1135 cycles.
Figure 23:
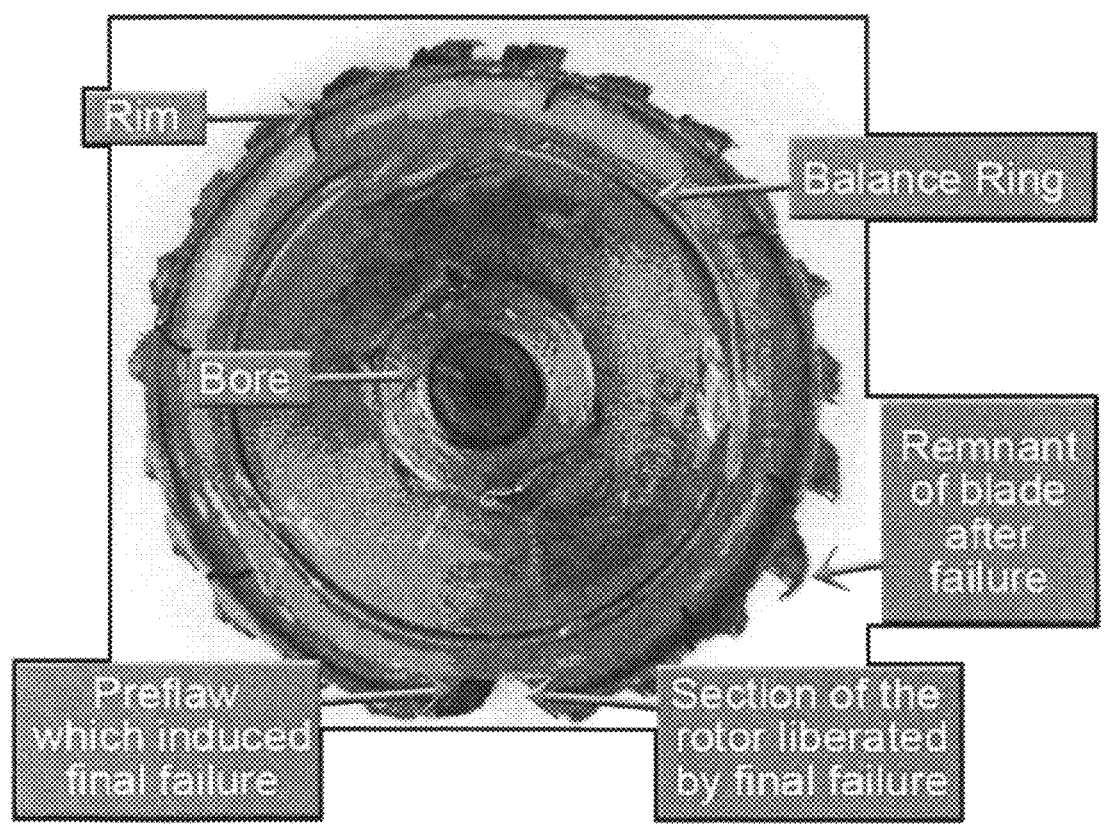
FIG. 23: Turbine rotor after failure.

Progression of the crack which eventually caused failure is shown in FIG. 21A (382 cycles), FIG. 21B (683 cycles), FIG. 21C (985 cycles) and FIG. 21D (1135 cycles). FIG. 22 shows a natural view of the crack at 1135 cycles, which has been darkened in FIG. 21D to improve visibility. Note that the crack shows significant kinking throughout its growth, and at 1135 cycles it shows a significant bifurcation (branching). The rotor failed after 1180 cycles when it liberated one blade and a small section of rim (FIG. 23).

Example 6

Stress Corrosion Testing for Blades Under Test

During prolonged operation of the turbine engines at high speed and temperature, corrosion develops on the exterior surface of the turbine materials. This corrosion not only occurs on the surface but penetrates into the interior of the material via paths of high stress that arise when the material is under loading, and stress occurs on the material. At the molecular level (where the corrosion mechanisms take place), the stresses build up on grain boundaries and other microstructural obstacles. Also, the alloying elements at the grain boundaries are different than the parent material. Therefore grain boundaries tend to corrode, especially at high stress and temperature. When the grain boundaries corrode they weaken to form crack like defects that can grow with fracture or fatigue to cause failure of the component. It is therefore necessary to determine the actual mean thickness and variation in thickness of the corrosion that develops over time and at the weakened grain boundaries.

A Jet Cat P70 engine was operated at a constant exhaust temperature of approximately 750° C. and constant speed of 124,000 RPM for 10 hours. The serial number of the rotor was 624. The rotor material was IN-713. The composition of IN-713 is given in Table 4.

TABLE 4

Nominal Composition of INCONEL 713

| Ni | Cr | Al | Mo | Nb | Fe | Ti | Zr | C | B |
|---|---|---|---|---|---|---|---|---|---|
| 70.8 | 13.43 | 5.97 | 4.29 | 2.17 | 1.5 | 0.87 | 0.72 | 0.138 | 0.013 |

A blade specimen was cut from the rotor and polished, as follows. The removed blade was mounted in a phenolic resin mount and rough wet ground with 240, 400, 600, and 800 grit paper. The specimen was then fine polished with 9.5 and 1.0 micron alumina slurries on a medium knap polishing cloth. The specimens were not etched so as to preserve the oxide coating. The specimens were then subjected to a final rinse in acetone.

The Specimen was then examined under a LEO model 1570 Scanning Electron Microscope. The microscope was operated in Secondary Electron (SE) mode at an operating voltage of 15 keV for normal imaging and 30 keV when Energy Dispersive x-ray Spectroscopy (EDS) was conducted. EDS was conducted at several spots on the oxide coating and in the bulk of the blade itself to identity the chemical composition.

Results of the Corrosion Impact Assessment

Figure 24A:
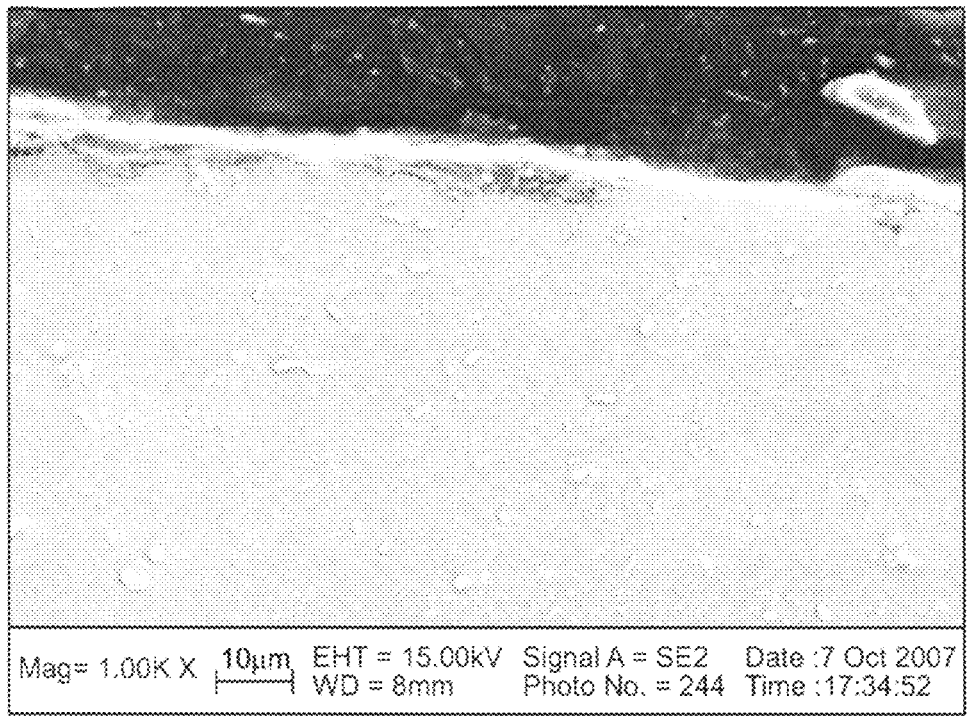
FIG. 24A: Oxide-coating of upper surface.
Figure 24B:
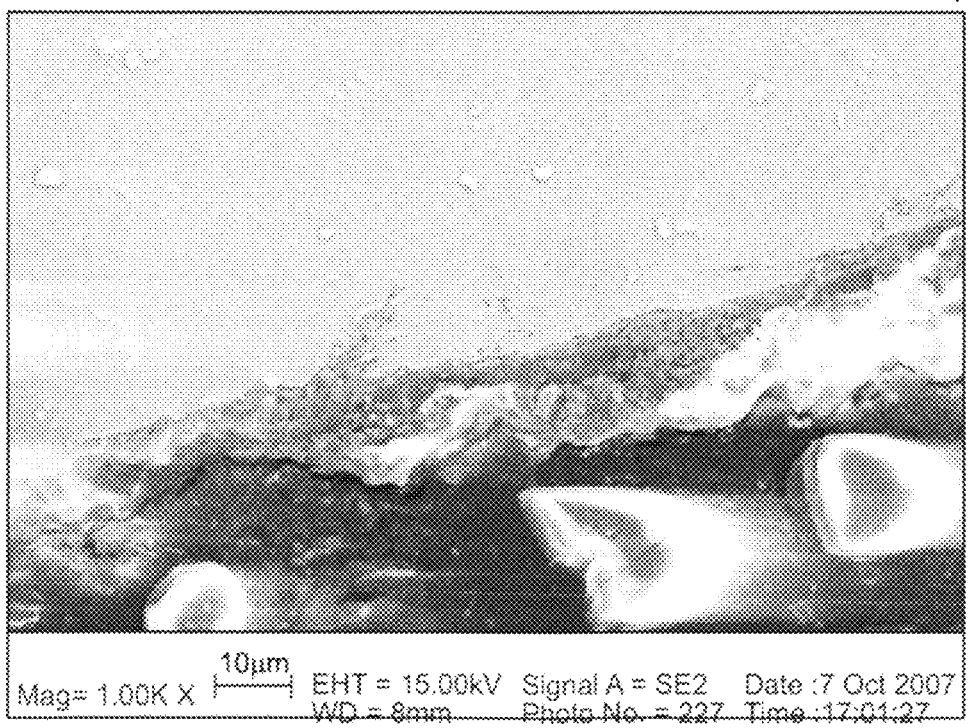
FIG. 24B: Oxide coating of lower surface.

The surface corrosion consisted of an oxide scale on the upper (suction) side of the turbine blades. The scale was neither continuous nor uniform in thickness, as seen in FIG. 24A. This is possibly due to the fact that the upper surface of the turbine blade was aligned in the direction of polishing during the final polishing step, and was thus preferentially removed from the blade. (Note also the presence of pre-cracks emanating from the interface of the oxide scale and the substrate. These pre-cracks are the stress-corrosion cracks shown in FIG. 25.) The oxide scale on the lower (pressure) side of the blade, as seen in FIG. 24B, was nearly continuous and varied from 8 to 15 microns in thickness, with an average of about 10 microns. The composition of the oxide scale is a complex mixture that was largely $Al_2O_3$.

Figure 25:
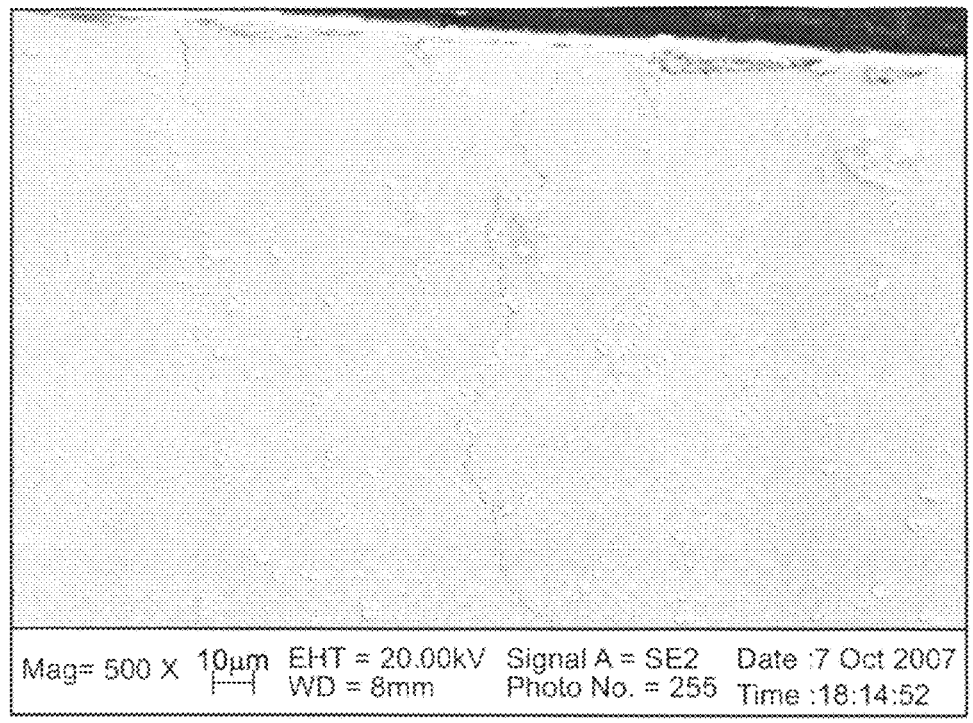
FIG. 25: Sulfidation induced pre-cracks in the upper surface of the blade.

On the upper surface of the blade, there are numerous regions where there are lines of small pores that are beginning to develop, possibly along grain boundaries. A number of these are seen in FIG. 24A and FIG. 25. EDS confirmed the presence of significant amounts of sulfur in those regions of the substrate. This is an indication that this blade is in the early stages of sulfide stress corrosion cracking (SCC). It is interesting that all of the high-S and cracked regions occurred on the top surface of the blade.

The following conclusions can be drawn form the analysis. The oxide scale thickness that grows on the INCONEL 713 turbine blade grows to an approximate thickness of 10 microns. The Oxide scale that forms is a fairly complex layer whose primary component is Alumina, which is consistent with the literature. The upper surface of the blades was undergoing the early phases of Sulfide stress corrosion cracking.

Example 7

Low Cycle Fatigue (LCF) Testing

LCF testing differs from crack growth testing in that crack growth tests use an artificially manufactured crack-like slot with a very high stress concentration (Kt>10) to start the crack. In a crack growth test there is little if any crack initiation period because an artificial crack is already started. By contrast LCF models a naturally initiated crack. A realistic manufactured geometric feature such as a fillet or bolt hole is often a location of LCF. These locations have a smaller stress concentration (Kt<5) than in a pre-existing crack.

Figure 26:
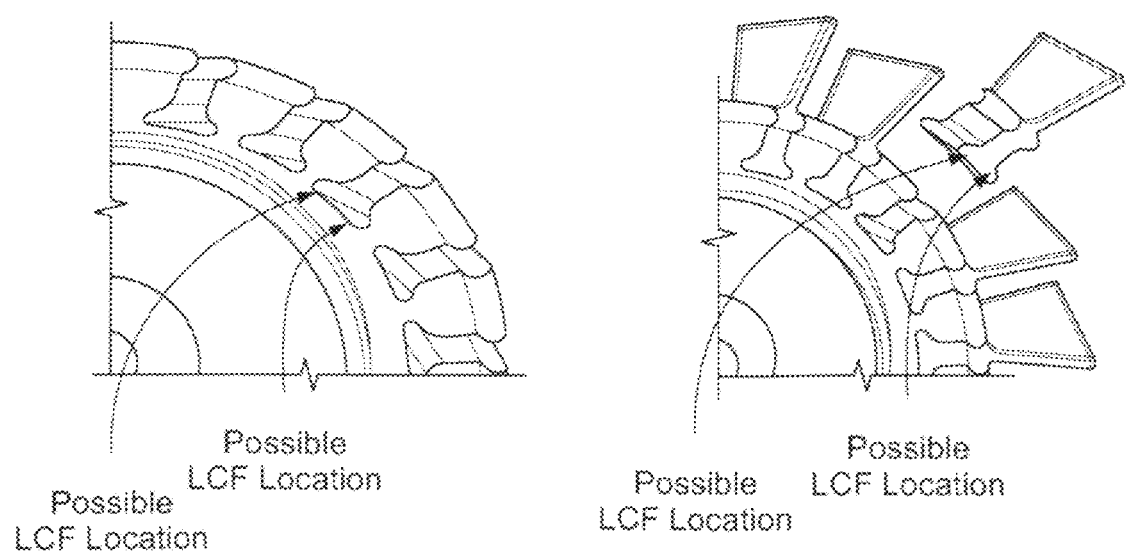
FIG. 26: Schematic of blades inserted into turbine disk.
Figure 27A:
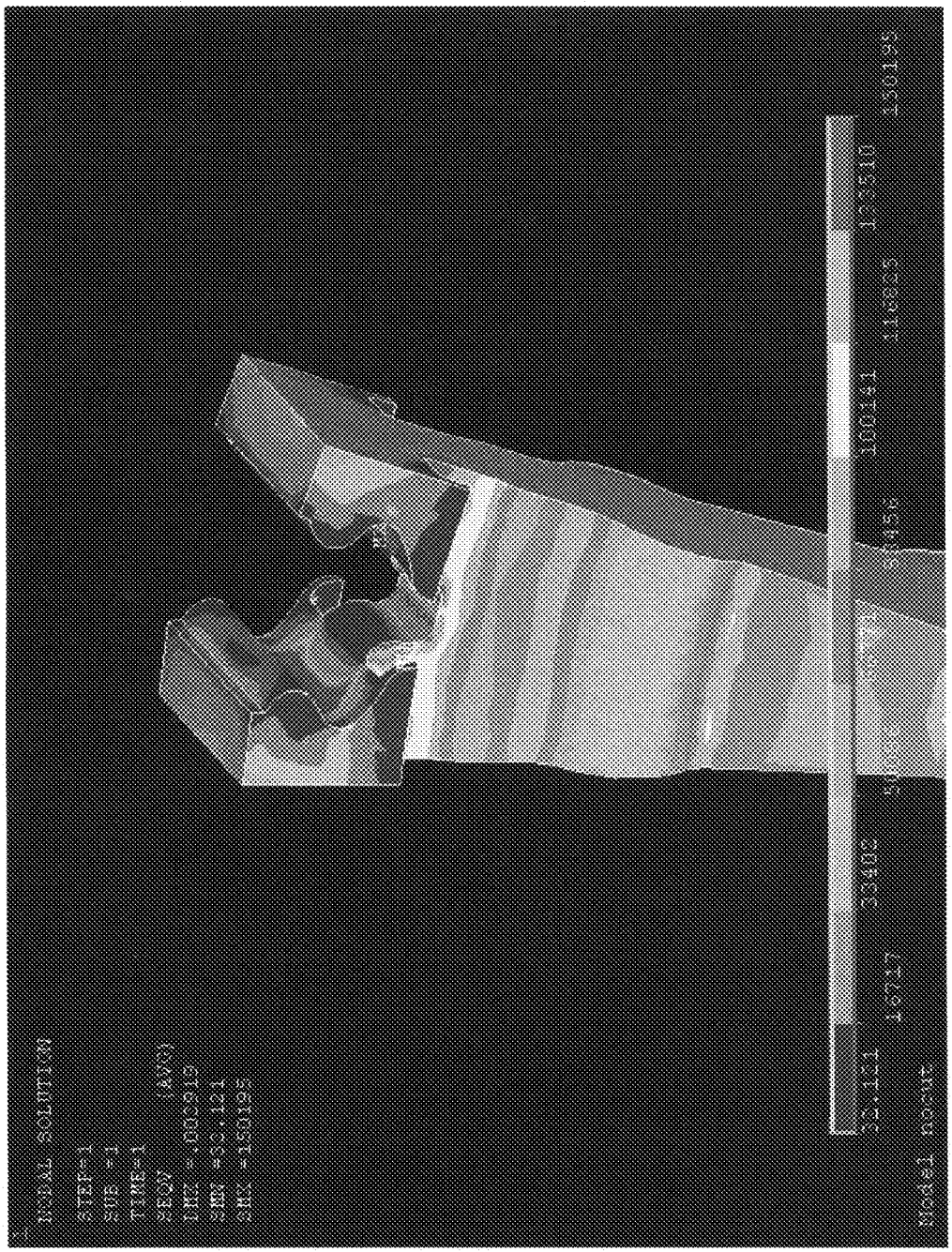
FIG. 27A: Finite element model of disk.
Figure 27B:
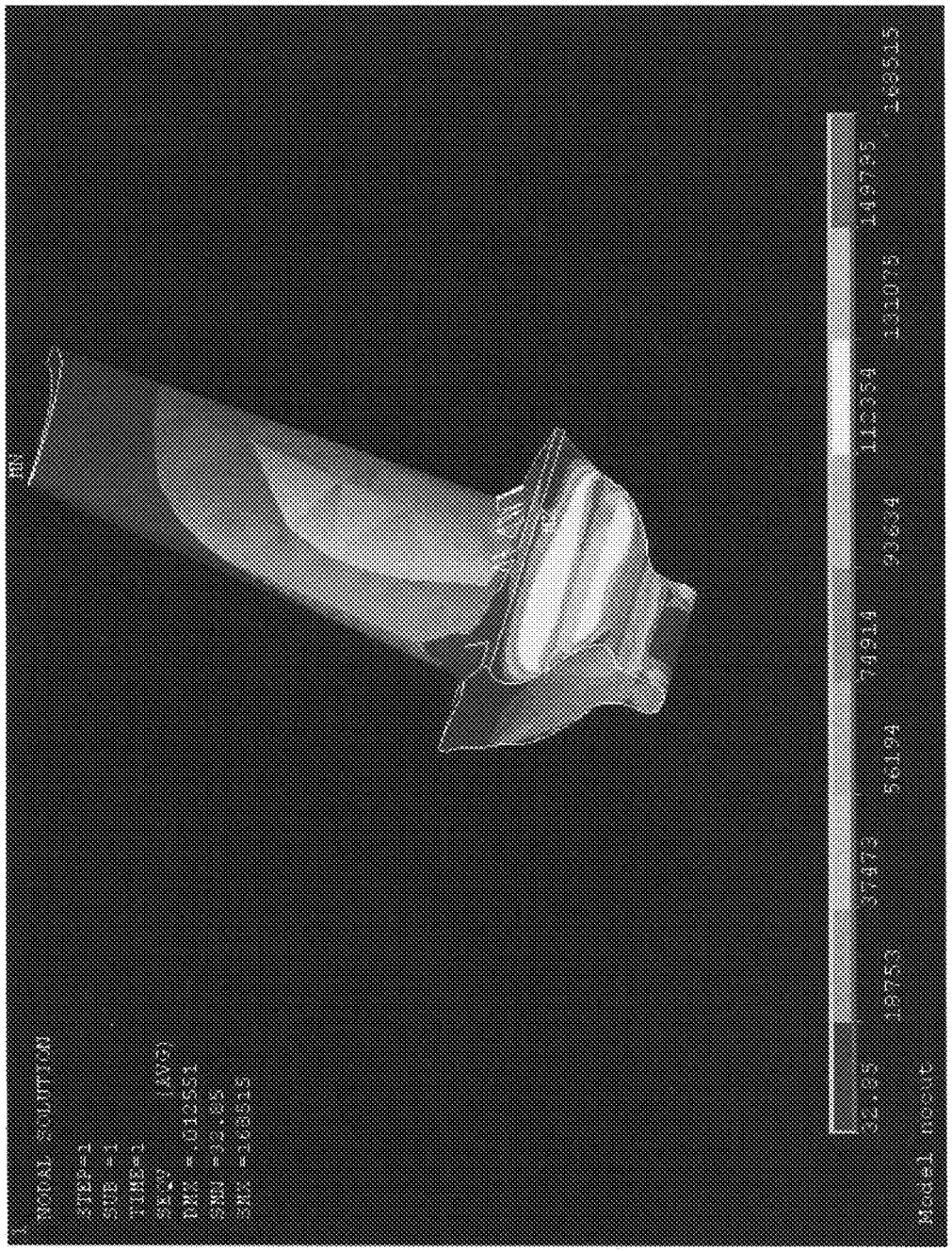
FIG. 27B: Finite element model of blade.
Figure 28:
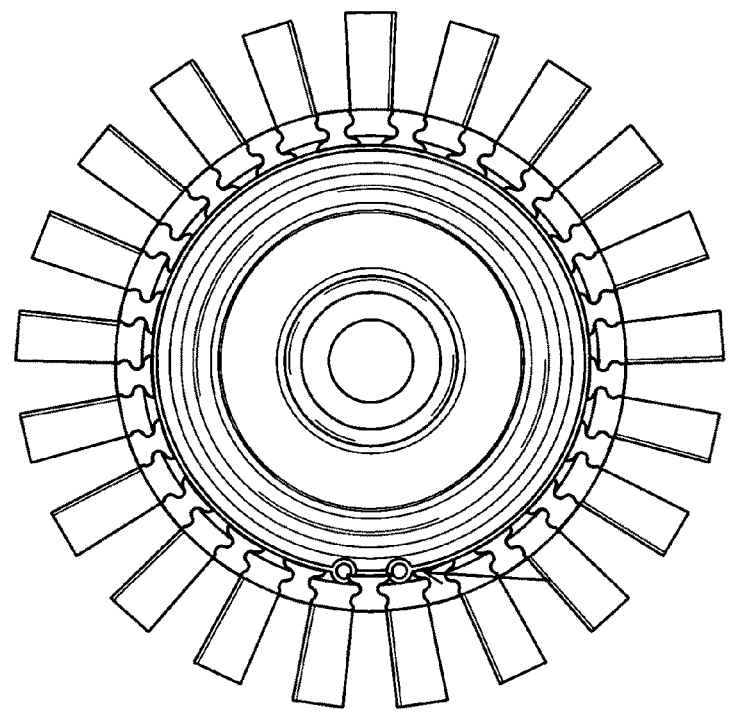
FIG. 28: New 21 Blade Attachment Design.

An LCF test article can be any article with realistic manufacturing geometric features. A schematic of one such example is shown in FIG. 26. This is a turbine disk with detachable blades which are inserted into the disk. This is a common design in large engines, and a miniature turbine rotor suitable for testing as described herein can be designed similarly. (A detailed design of an exemplary miniature turbine rotor is shown in FIGS. 26-28). LCF is possible at the fillet of the disk attachments and the blades as shown in FIG. 26. A finite element stress analysis is performed as shown in FIG. 27A and FIG. 27B, and used in a fatigue analysis to predict the approximate engine speed to produce a desired number of cycles to fatigue failure for the rotor.

The present example addresses LCF testing in a blade attachment. Cyclic testing can be controlled by a personal computer such as a laptop computer configured to run proprietary software. An example of the graphical user interface can be seen in FIG. 17 and further described herein in connection with Example 5 (crack growth testing). In the cyclic test, the minimum speed can be set to 38,000 RPM (engine idle) and the maximum speed can be set to 112,000 RPM (engine maximum steady state). There is also a user-defined RPM tolerance for the maximum and minimum conditions. FIG. 18, described in connection with Example 5, shows typical speeds and exhaust temperatures suitable for use during cyclic testing.

Design of Test Article

Figure 29:
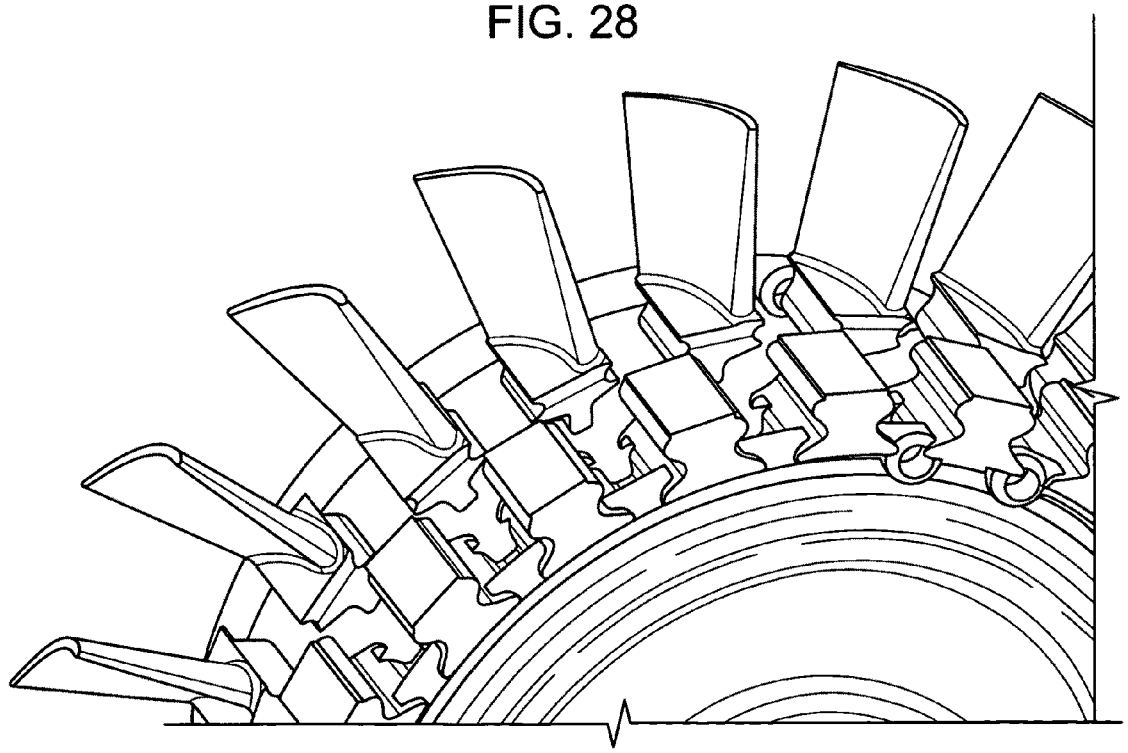
FIG. 29: Exploded view of 21 blade attachment design.

An initial JetCat P200 blade attachment design utilizes 29 blades, just as in the stock integrally bladed rotor used in that engine. However, initial finite element analysis (FEA) results indicated that this design would produce unacceptable stress levels in the blade attachment lugs on the disk. This was due to the fact that the blade attachment lugs had to be designed to a smaller size than desired in order to fit all 29 blades on the disk. Hence, it was decided to reduce the number of blades in order to yield acceptable stresses. The final blade count was reduced to 21. FIG. 28 shows the new 21 bladed design disk, and FIG. 29 is an exploded view of the new design.

Figure 30:
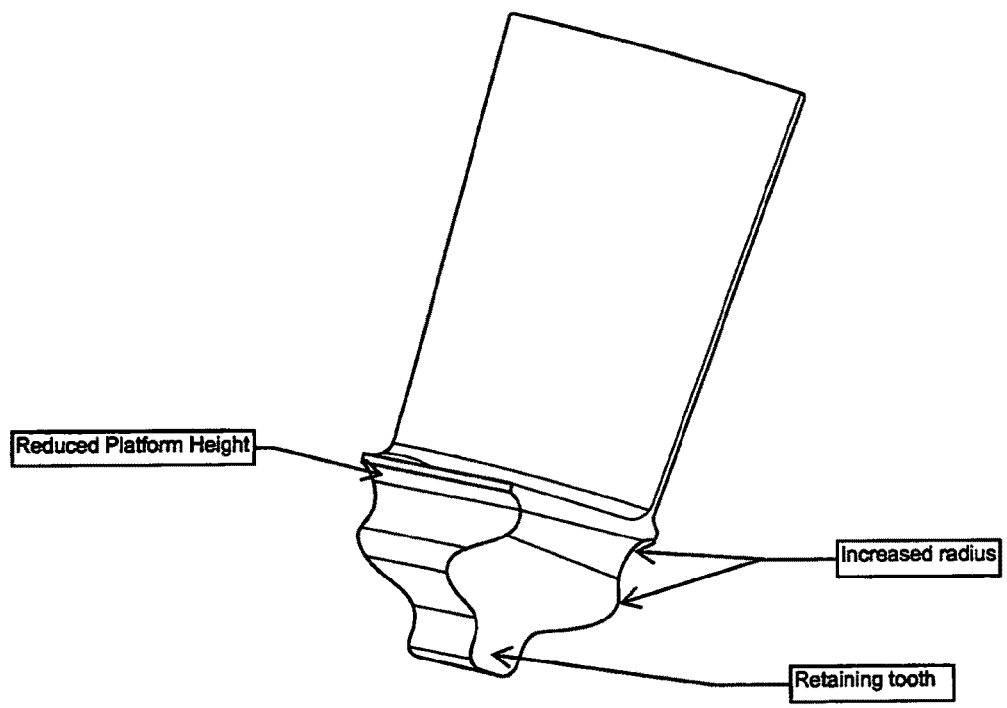
FIG. 30: New blade design.

In addition to the reduction in blade count, there were several other changes made to the design. The blade dovetail and platform design have undergone significant changes, as shown in FIG. 30. The thickness of the blade platform was reduced significantly in order to reduce the weight of the blade. Also, the radius of the blade tooth was increased in order to reduce tooth bending stress, and the overall length of the dovetail was increased. Finally, a slot was added to the blade lug ID, but it does not carry any load. It was added in order to contain the blades with the fore and aft snap rings.

These blades as designed will be cut from the stock P200 rotor, so this second "retaining" tooth will have the same thickness as the thinnest cross section of the P200 disk. This allows the snap rings to be used without notching the blades (increased stress concentration) or cutting the disk too thin.

This also allows the snap ring groove to be moved radially inward, thus reducing the loading on the grove and the groove overhang.

Example 8

Scaled-Turbine Engine Foreign Object Damage (FOD) Testing

In this example, a P60 model JetCat turbine engine is used to collect foreign object damage (FOD) data. In large engines, FOD is caused by the ingestion of runway debris or flying objects. The damage is a distinct nick or tear in the material usually at the leading edge of an airfoil. This damage weakens the component and subsequent cycle fatigue or steady fracture can occur. Nicks and scratches from assemble and maintenance may also cause damage which is equivalent to FOD. Domestic object damage (DOD) can also occur. This is caused by parts that come loose within the engine such as nuts or bolts. Screwdrivers or other maintenance tools are sometimes left in the engine and they can cause damage when the engine is operated. A DOD damage state is equivalent to FOD both in practice and for testing purposes.

Figure 31A:
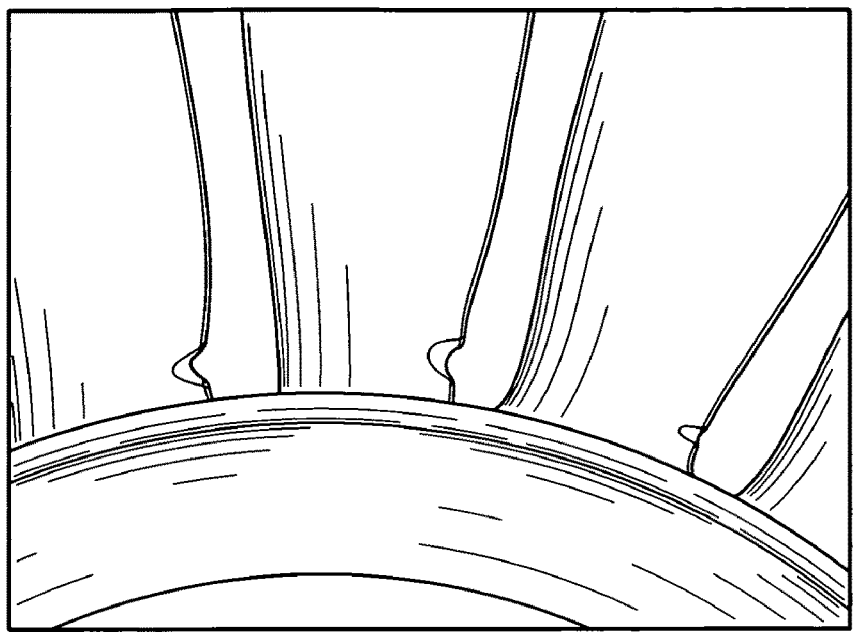
FIGS. 31A and 31B: foreign object damage on a rotor.
Figure 31B:
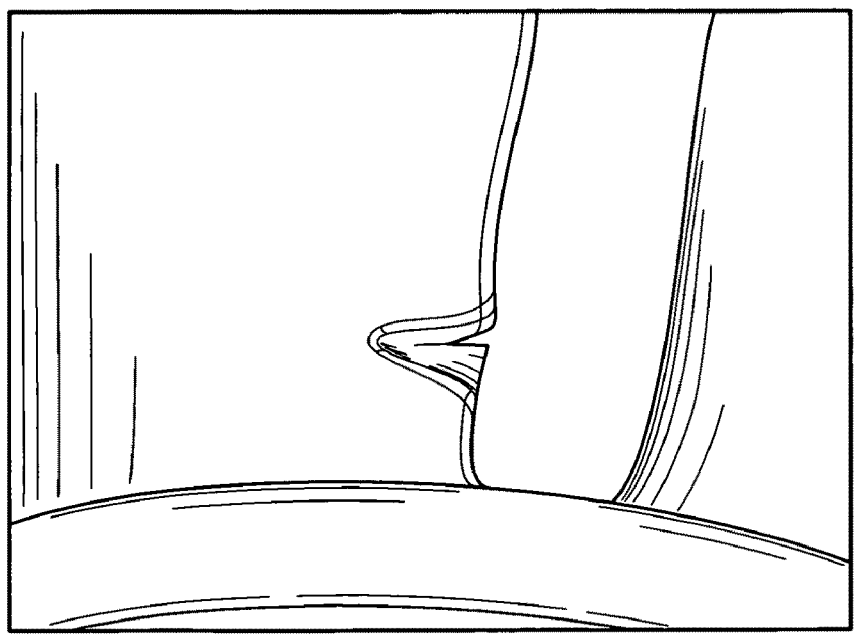

FOD is simulated by inducing damage on the rotor and operating the engine at extreme conditions of temperature and speed. Inducing damage can be carried out by, for example, dropping a particle or particles of debris into the engine while it is running. FOD can also be created on the miniature engine by inducing damage on the rotor using a hammer and chisel, a punch or a projectile. FIG. 31A shows the damage to a rotor blade after induced FOD damage from a punch and FIG. 31B shows a close up of the damage. The damage size (width, breath and length) is measured and recorded along with photomicrographs of the FOD. The engine is then operated at cyclic conditions to induce fatigue damage at the FOD site, or the engine is operated extreme conditions of constant temperature and constant speed to induce fracture at the FOD site.

Typically, the engine can be controlled by a configured computer as further descried in connection with Example 5. The engine has a maximum operating speed of 165,000 RPM. This speed causes high the stress in the blades and thus FOD progression. FOD data is collected at the test conditions suggested by a finite element stress analysis, by interrupted testing of the scaled-turbine engine. The testing is interrupted to measure the impact of the FOD damage and damage progression in the rotor blades, as well as to periodically monitor the health of other engine components. The testing involves running each scaled-turbine engine fifty hours in steps of five-hour intervals. The engine is disassembled every five hours for inspection.

Example 9

TMF Testing

A model turbine engine can be used to collect thermo-mechanical fatigue (TMF) deformation data. TMF may be induced by operating the engine with a combination of long dwell times as well as short, rapid throttle transients. TMF characterization data will be collected to ensure test conditions are optimal and to obtain a thermal profile along the span of the blade as a function of the engine speed. In addition the mission used herein for TMF testing incorporates a combination of long dwell times as well as short, rapid throttle transients. This mission will provide a good combination of engine operating conditions to verify the thermal effectiveness.

The methodology of this example utilizes the JetCat P-200 with modifications to allow for an increase in exhaust gas temperature to create thermal mechanical fatigue failure in thin-wall components. The P-200 turbine is currently capable of gas path temperatures of 1800° F. With incorporation of cooling methodologies and single crystal alloys the turbine is more than capable of producing a 2000° F. operating environment.

Characterization test data will be collected to obtain accurate information on the engine operation, both steady state and transient, in terms of temperature, pressure, and speeds. This data will be collected through instrumentation to characterize the thermo-mechanical state of stress on the rotor blade. The planned test sequence will be similar to the environmental characterization test sequence performed on conventional sized military turbine engines. It will consist of various idle dwell and maximum dwell hold times as well as various acceleration and deceleration rates. The engine response will be measured with installed instrumentation.

Figure 32:
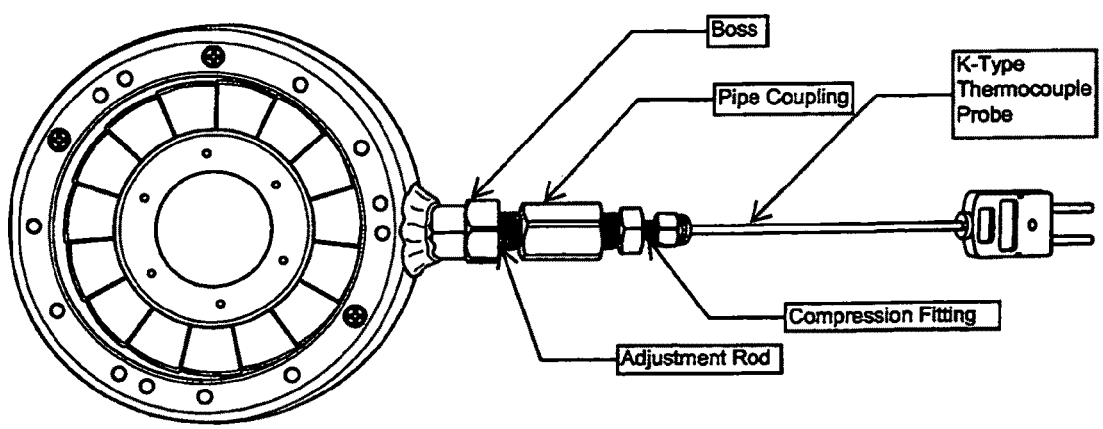
FIG. 32: Radial traversing thermal probe on a scaled turbine engine.

To obtain the thermal profile along the span of a blade as a function of the engine speed (i.e., to generate a combustor pattern factor for the engine) a radial-traversing thermocouple has been devised. A gas turbine engine is instrumented in order to accurately measure the radial temperature profile of the gas path between the fixed vanes and the turbine blade. This is accomplished by modifying the engine case to accommodate a thermocouple probe in a manner that will allow accurate spatial adjustment of the probe tip in the radial direction as shown in FIG. 32. The following modifications were required to accomplish this task. First, a hole was drilled in the aluminum outer case of the turbine engine at an axial location just aft of the fixed vanes. Once this was completed, a smaller 1/16" hole was drilled in the vane ring concentric to the hole in the outer case.

Next, a small aluminum boss was machined with a 15-degree angle in order to provide a surface that was perpendicular to the radial direction (because the end of the outer case has a 15-degree slope) and thick enough for taping a threaded hole. A pilot hole was drilled into the aluminum boss, which was then lined up concentric with the hole already drilled in the outer case before being carefully welded with tungsten inert gas (TIG) to the outer case. Once the boss was TIG welded to the case, it was drilled and tapped with a 3/8-24" thread. This thread was selected for two reasons: first, this threaded hole will be used for a linear radial adjustment of the probe, and the 24-thread-per-inch pitch yields a linear movement of 0.04167" per revolution. This will yield approximately ten measurements across the 0.42" span of the blade. This thread was also chosen because it will thread into a 1/8" pipe fitting, thereby allowing for a short piece of 3/8-24" threaded rod to act as the "adjustment rod" for the thermocouple probe radial position. This adjustment rod was made from a short piece of 3/8-24" threaded rod that was center-drilled with a 0.067" through-hole.

This piece is then threaded into the aluminum boss welded on the engine, and a lock nut is added. Then a standard 1/8" pipe coupling was threaded onto the end of the 3/8-24 adjustment rod. Next, a standard 1/16" thermocouple compression fitting (with 1/8" pipe thread) was threaded into the other end of the 1/8" pipe coupling. Finally, the 1/16" K-type thermocouple probe is inserted into the assembly and the compression nut is tightened, which seals off any gas from escaping to atmosphere. Once the thermocouple is fixed in place by the compression fitting (with the tip of the probe at the inner diameter of the vane ring), the ⅜-24" lock nut can be loosened, and the adjustment rod can be rotated one complete turn clockwise, which will advance the radial location of the thermocouple probe by 0.04167". Then the lock nut can be tightened and a measurement can be made at that location. This procedure can then be repeated at approximately ten radial locations.

The thermocouple chosen for this measurement is an Omega KMQXL-062G-6. This is a high temperature K-Type thermocouple probe with a 1/16" diameter nickel/chrome-based protective sheath. This particular type of thermocouple provides very low drift at high temperatures as compared to conventional Inconel and stainless steel sheathed probes, and it has a maximum temperature rating of 2440° F.

During the thermal demonstration test, the blade and vane temperatures and thermal gradients will be measured. Several methods will be employed to insure an accurate assessment is achieved. This first is the Indicator Maximum Temperature Krystal (IMTK) sensor. In addition, a conventional slip-ring and thermocouple approach will be employed as well as thermal imaging.

IMTK sensors will be used to measure metal temperatures. These sensors, made by Cleveland Electric Laboratory, are only 0.020" in diameter. It is, however, necessary to machine a 0.032" diameter and 0.030" deep pocket in the component to mount them. The sensor is capable of measuring the peak temperature experienced by the component. An X-ray refractometer is used to interpret the temperatures. The sensors are valid over a temperature range of 212° to 2550° Fahrenheit.

Figure 33:
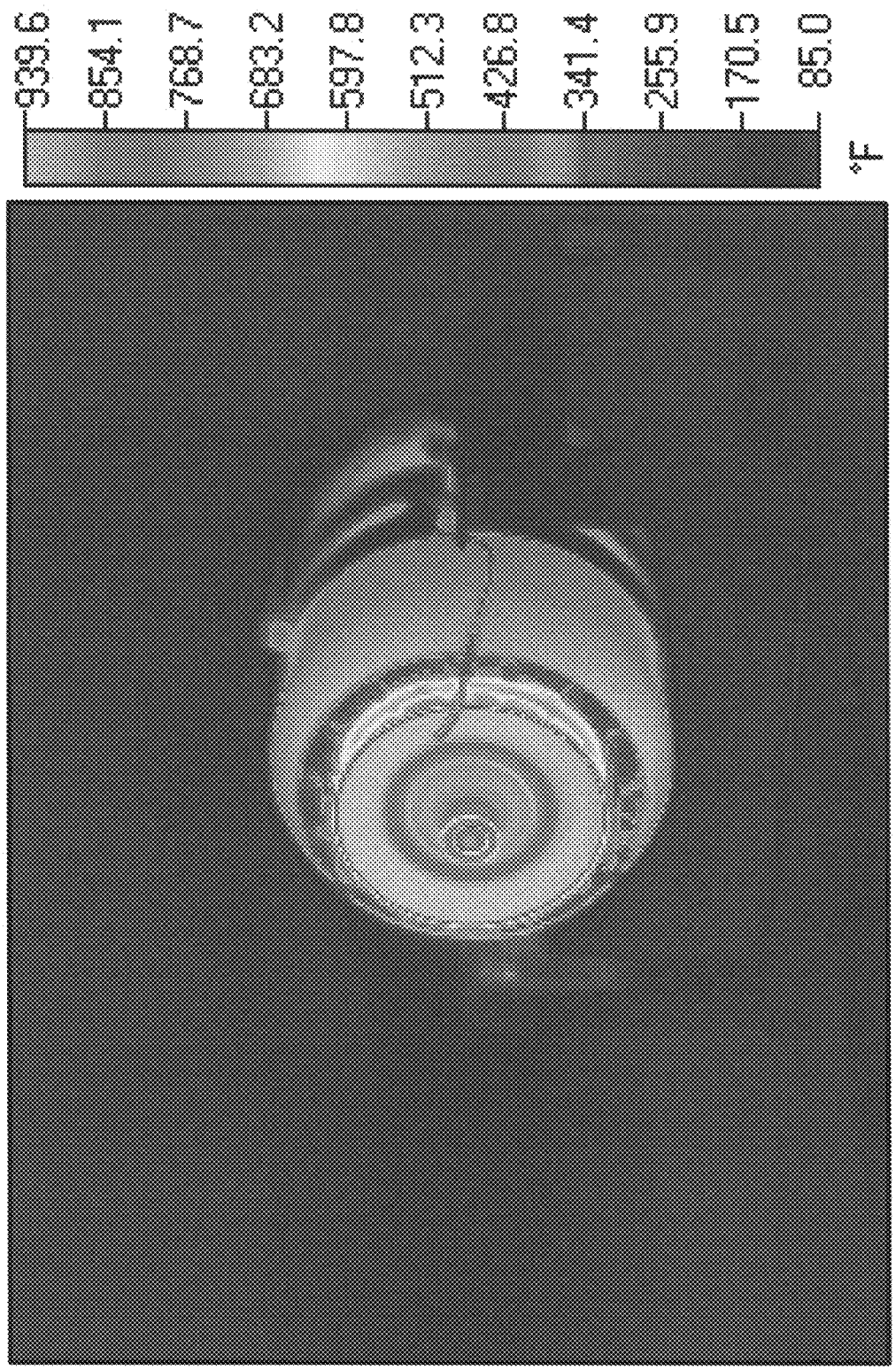
FIG. 33: Infrared Thermal Image of Scaled Engine at Intermediate Power.

During the test program an infrared thermal imaging will be employed. Although not as widely accepted as conventional thermocouples/slip-ring testing, thermal imaging offers unique full field capability as shown in FIG. 33.

Example 10

LCF and Fretting Testing

Fretting and low cycle fatigue often occur in combination with one another. The design shown in Example 7 hereinabove may also be used to study fretting, therefore.

Figure 34:
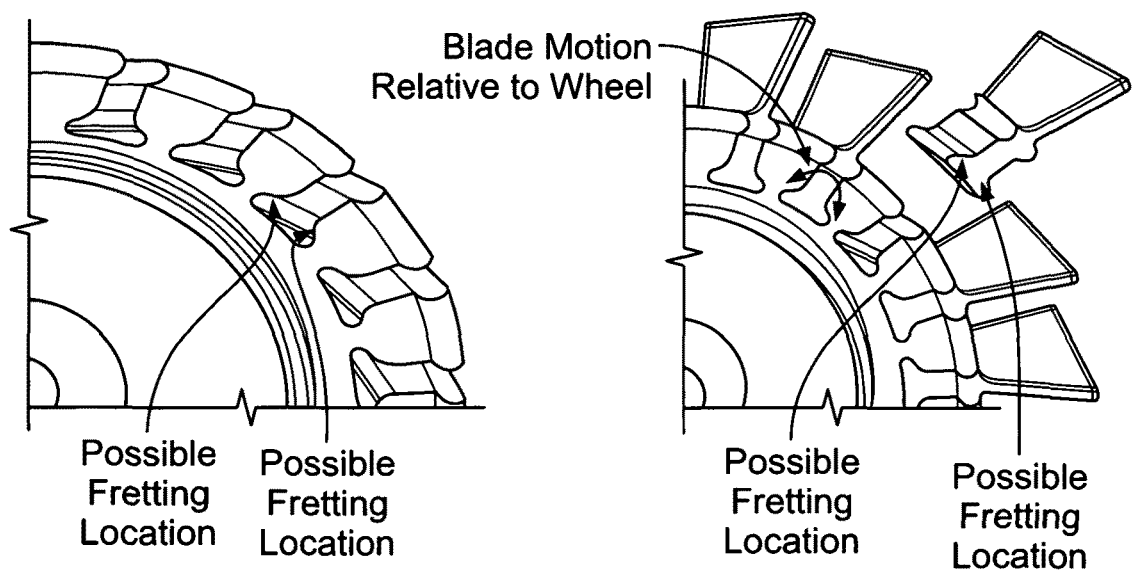
FIG. 34: Blade/disk fretting.

Fretting occurs in full size turbines when two surfaces rub back and forth against each other causing weakening of the interface surfaces. In the case of a blade/disk attachment, the interface surface on the blade and the disk can fret because there is relative motion between the blade and the disk. FIG. 34 shows the back and forth motion and the interface locations on the blades where fretting is likely to occur. This relative motion is caused by the turbulent air flow, vibrations and other naturally occurring gas path phenomena. A stress analysis of the design is used to determine if the interface surface stress are high enough to cause fretting or if LCF will occur. For test purposes, the rotor can be designed so that fretting and LCF will occur simultaneously.

The disk is assembled into the miniature turbine for cyclic testing. The cyclic testing can be controlled by a laptop computer configured to run proprietary software. An example of the graphical user interface can be seen in FIG. 17. The software functions are further described herein in connection with Example 5 (crack growth testing).

In the cyclic test, the minimum speed is set to 38,000 RPM (engine idle) and the maximum speed is set to 112,000 RPM (engine maximum steady state). There is also a user-defined RPM tolerance for the max and min conditions. FIG. 18 shows typical speeds and exhaust temperatures during cyclic testing. The mission in FIG. 18 has a 10 second cycle time with minimal time spent at the maximum or minimum speed. The mission can be adjusted so that the engine can dwell for any time at maximum, minimum, and in-between speed or any combination to simulate the mission of the full size engine.

The testing was interrupted to measure the damage in the rotor blades using an optical microscope. The testing involved running the scaled-turbine engine fifty hours in steps of five-hour intervals. The engine was disassembled every five hours to measure the damage. The number of hours can be changes depending on the expected fatigue life.

A test article as shown in FIGS. 26 and 27 (and described in connection with Example 7) can be used to monitor fretting according to methods described herein.

Example 11

Erosion Characterization for Blades Under Test

To perform an erosion test, a miniature engine can be operated at full speed for a long duration. Finely ground limestone, sand, or other nonflammable substance is introduced immediately in front of the inlet of the engine using a solid particle metering nozzle. The nozzle is similar to an hourglass. This nozzle allows the particles to simply fall in front of the engine. Most if not all of the particles are sucked into the engine, thereby permitting the total weight of particles sucked in to be calculated. The engine is operated for 5 hours. The engine is then dissembled and the erosion is measured. Erosion can be measured by loss of mass via weighing and with mechanical calipers to determine any resulting change in geometry. Coordinate measurement machines (CMM) can also be used to measure the change in geometry. Before the engine is reassembled, it is cleaned of any dust build up. The engine is operated for 5 hours and the disassembly and measurements are repeated. One must be careful not to introduce the particles at too high a rate. This will cause clogging of the engine and reduce the maximum speed. The clogging depends on the type of particles. To simulate carbon particles (a common combustion byproduct), wheat flour, corn meal or cream of tarter can be used. One must be careful not to introduce the organic particles at too high a rate because they are combustible and the engine will over speed.

Example 12

Manufacturing Defect Testing

The scaled turbine engine may also be used to collect data on the response of materials with manufacturing defects. Defects in the material microstructure can occur during the manufacturing process. Manufacturing defects are those created in the miniature engine rotor during the manufacturing stage. These defects are often in the form of a pore, inclusion or other microstructural defect. Pores and inclusions are formed during the melt stage such as casting when the material is formed. Typically, pores are induced by casting under high pressure. Inclusions are induced by adding small trace of oxides, carbides or sulfides into the material before it is cast. Subsequent material processing such as rolling or forging may cause cracks at these defects. These defects and cracks serve as weak locations in the material which can lead to failure. The defect size and population density is then determined by sectioning the specimen and observing under the microscope.

To test the response of materials with manufacturing defects, a rotor, for example, is placed in the miniature turbine mounted on the apparatus as described herein. The engine is then operated at cyclic conditions to induce subsequent fatigue damage at the defect sites, or the engine is operated extreme conditions of constant temperature and constant speed to induce fracture at the defect site.

The cyclic fatigue testing can be carried out and controlled by software, as described elsewhere herein, in connection with Example 5, herein. The engine speed is then cycled between these two speeds over a 10 second cycle time. The cycling is repeated for many hours, or days. Cyclic fatigue data is collected at the by interrupted testing of the scaled-turbine engine. The testing is interrupted to measure the impact of the manufacturing defect damage, and damage progression in the rotor blades. The number of cycles is recorded. The test can be performed until the fatigue crack emanating from the manufacturing defect reaches a certain length or the rotor blade is liberated.

The foregoing description is intended to illustrate various aspects of the present invention. It is not intended that the examples presented herein limit the scope of the present invention. The invention now being fully described, it will be apparent to one of ordinary skill in the art that many changes and modifications can be made thereto without departing from the spirit or scope of the appended claims.

What is claimed is:

1. A miniature jet engine, comprising:
   a component constructed from a material suitable for use in a corresponding component of a full-size jet engine substituted for an original component of the miniature jet engine; and
   one or more sensors for reporting operational data relating to a failure mode of the component.

2. The miniature jet engine of claim 1, wherein the component is a rotor.

3. The miniature jet engine of claim 1, wherein the one or more sensors record one or both of temperature of exhaust gases, and revolutions per minute, during operation of the engine.

4. A method of adapting a miniature jet engine to test a material, the method comprising:
   removing an original component from the miniature jet engine;
   substituting a new component in place of the original component, wherein the new component is constructed from the material and wherein the new component corresponds to a component of a full-size jet engine; and
   configuring the miniature jet engine with one or more sensors for reporting operational data relating to a failure mode of the new component.

5. A method of studying a failure mode of a jet engine, the method comprising:
   removing an original component from a miniature jet engine;
   substituting a new component in place of the original component, wherein the new component is constructed from a material used in corresponding component of a full-size jet engine;
   running one or more tests on the miniature jet engine; and
   in between the one or more tests, disassembling the jet engine and making a measurement relating to the failure mode on the new component.

6. The method of claim 5, wherein the test is a cyclic test or a constant speed test.

7. The method of claim 5, wherein the new component is a rotor.

8. The method of claim 5, wherein the miniature jet engine has one or more components selected from a group consisting of: air intake, rotor, fan blade, combustor, housing, and compressor.

9. The method of claim 5, wherein the full-size jet engine is a jet engine of a civil or military aircraft, and wherein the aircraft is selected from the group consisting of: helicopter, fixed-wing aircraft, and a vertical take-off and landing aircraft.

10. The method of claim 5, wherein the test material is nickel superalloy.

11. The method of claim 10, wherein the nickel superalloy is IN713.

12. The method of claim 5, wherein the miniature jet engine is a functioning jet engine from a model airplane.

13. The method of claim 5, wherein the miniature jet engine is a jet engine from an unmanned aerial vehicle.

14. The method of claim 5, wherein the miniature jet engine is a commercially available engine.

15. The method of claim 5, wherein the miniature jet engine has a size that is a fraction of that of a full-size jet engine, wherein the fraction is selected from the group consisting of: $\frac{1}{6}$th, $\frac{1}{10}$th, $\frac{1}{12}$th, $\frac{1}{16}$th, $\frac{1}{20}$th, $\frac{1}{24}$th, $\frac{1}{30}$th, $\frac{1}{36}$th, or $\frac{1}{48}^{th}$.

16. The method of claim 5, wherein the miniature jet engine has a rotor that is configured to rotate at between 20,000 and 165,000 revolutions per minute.

17. The method of claim 16, wherein the rotor comprises an airfoil, and wherein the airfoil attains a temperature between about 800° F. and 1350° F. during operation of the miniature jet engine.

18. The method of claim 17, wherein during the test on the miniature jet engine, a thermal gradient between the airfoil and the rotor shaft causes a loading that is equivalent to a loading due to a thermal gradient in the full-size jet engine.

19. The method of claim 5, wherein the miniature jet engine comprises a rotor shaft to which a rotor is attached.

20. The method of claim 19, wherein, during operation of the miniature jet engine, the rotor shaft attains a temperature no greater than 400° F.

21. The method of claim 5, wherein the failure mode is selected from the group consisting of: low cycle fatigue, foreign object damage, erosion, creep, crack growth, stress corrosion, thermal mechanical fatigue, fretting, and manufacturing defects.

22. The method of claim 21, wherein the failure mode is thermal mechanical fatigue, and wherein running one of the tests on the miniature jet engine comprises:
   operating the miniature jet engine under a combination of steady state and transient operating conditions; and
   obtaining a temperature profile within the miniature jet engine during each of the steady state and transient operating conditions.

23. The method of claim 21, wherein the failure mode is low cycle fatigue, and wherein one or more of the tests on the miniature jet engine is a cyclic test.

24. The method of claim 21, wherein the failure mode is erosion, and wherein one or more of the tests on the miniature jet engine is a constant speed test, and wherein the method further comprises:
   introducing solid particles in front of an inlet of the miniature engine during the one or more tests;
   interrupting the operation of the miniature engine at predetermined intervals;
   disassembling and cleaning the miniature engine during the interruptions at the predetermined intervals; and measuring during the interruptions a loss of mass or a change in geometry of the new component.

25. The method of claim 5, wherein the failure mode is creep, and wherein running one of the tests on the miniature jet engine comprises:

operating the miniature jet engine at a constant temperature and a constant speed during the test; and wherein the making a measurement on the new component comprises measuring a length of the new component.

26. The method of claim 25, wherein the constant temperature is 780° C. and the constant speed is 160,000 revolutions per minute.

27. The method of claim 21, wherein the failure mode is crack growth, and wherein one or more of the tests is a cyclic test.

28. The method of claim 27, further comprising, before the running one or more tests, seeding the new component with a fault configured to simulate damage selected from the group consisting of: impact, corrosion, erosion, nicks, defects, and cracks.

29. The method of claim 27, wherein the cyclic test includes a minimum speed of 38,000 revolutions per minute and a maximum speed of 123,000 revolutions per minute.

* * * * *